US012660381B2

(12) United States Patent
    Sheen et al.

(10) Patent No.: US 12,660,381 B2
(45) Date of Patent: Jun. 16, 2026

(54) LIGHT EMITTING ELEMENT, METHOD FOR FABRICATING THE SAME AND DISPLAY DEVICE

(71) Applicant: Samsung Display Co., LTD., Yongin-si (KR)

(72) Inventors: Mi Hyang Sheen, Yongin-si (KR); Yun Hyuk Ko, Yongin-si (KR); Dong Uk Kim, Yongin-si (KR); Na Ri Ahn, Yongin-si (KR); Chang Hee Lee, Yongin-si (KR); Do Hyung Kim, Yongin-si (KR); Ran Kim, Yongin-si (KR); In Pyo Kim, Yongin-si (KR); Ki Young Yeon, Yongin-si (KR); Je Won Yoo, Yongin-si (KR); Joo Hee Lee, Yongin-si (KR); Sang Ho Jeon, Yongin-si (KR); Jung Woon Jung, Yongin-si (KR); Chan Woo Joo, Yongin-si (KR); Jin Young Choi, Yongin-si (KR); Na Mi Hong, Yongin-si (KR); Jong Il Kim, Yongin-si (KR); Jin Ho Byun, Yongin-si (KR); Sang Ho Oh, Yongin-si (KR); Jae Kwang Lee, Yongin-si (KR); Yong Seok Choi, Yongin-si (KR); Jong Hoon Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 589 days.

(21) Appl. No.: 18/093,959

(22) Filed: Jan. 6, 2023

(65) Prior Publication Data
    US 2023/0215983 A1      Jul. 6, 2023

Related U.S. Application Data

(60) Provisional application No. 63/296,996, filed on Jan. 6, 2022.

(30) Foreign Application Priority Data

Oct. 27, 2022    (KR) ........................ 10-2022-0140050

(51) Int. Cl.
    *H10H 20/831*          (2025.01)
    *H10H 20/01*           (2025.01)
           (Continued)

(52) U.S. Cl.
    CPC ........ *H10H 20/8312* (2025.01); *H10H 20/01* (2025.01); *H10H 20/819* (2025.01);
           (Continued)

(58) Field of Classification Search
    CPC .. H10H 20/8312; H10H 20/01; H10H 20/819; H10H 20/857; H10H 20/84;
           (Continued)

(56) References Cited

U.S. PATENT DOCUMENTS

2009/0146142 A1    6/2009   Kim et al.
2011/0068359 A1*   3/2011   Yahata ............... H10H 20/8312
                                                  257/E33.001
           (Continued)

FOREIGN PATENT DOCUMENTS

JP        2019-212875        12/2019
KR     10-2009-0058952        6/2009
           (Continued)

OTHER PUBLICATIONS

Lee et al., "Highly efficient top-down processed blue InGaN nanoscale light-emitting diodes", Research Square, Oct. 28, 2021, pp. 1-18.
           (Continued)

*Primary Examiner* — Mouloucoulaye Inoussa
(74) *Attorney, Agent, or Firm* — Womble Bond Dickinson (US) LLP

(57)                ABSTRACT
A method for fabricating a light emitting element includes preparing a substrate, and forming a first semiconductor
           (Continued)

material layer, a light emitting material layer, a second semiconductor material layer and an electrode material layer on the substrate, forming semiconductor rods spaced apart from each other by etching the first semiconductor material layer, the light emitting material layer, the second semiconductor material layer and the electrode material layer in a direction perpendicular to an upper surface of the substrate, forming an insulating layer surrounding sides of the semiconductor rods through a sol-gel process by immersing the substrate, including the semiconductor rods, in a solution containing a precursor material, and forming light emitting elements by separating the semiconductor rods, including the insulating layer, from the substrate, and the light emitting elements have an external quantum efficiency of 20.2±0.6%.

20 Claims, 58 Drawing Sheets

(51) Int. Cl.
  *H10H 20/819*     (2025.01)
  *H10H 20/857*     (2025.01)
  *H10W 90/00*      (2026.01)

(52) U.S. Cl.
  CPC .......... *H10H 20/857* (2025.01); *H10W 90/00* (2026.01); *H10H 20/032* (2025.01)

(58) Field of Classification Search
  CPC .. H10H 20/018; H10H 20/032; H10H 20/821; H10H 20/0361; H10H 20/8162; H10H 20/825; H10H 20/816; H10H 20/8314; H10H 20/0137; H10H 20/841; H10H 20/824; H10H 20/813; H10H 20/811; H10H 20/833; H10H 20/835; H10H 20/0363; H10H 20/034; H01L 25/0753; H01L 24/80; H01L 24/92; H01L 24/29; H01L 24/95; H01L 24/83; H01L 24/08; H01L 24/32; H01L 2224/95102; H01L 2224/80951; H01L 2224/83815; H01L 2224/29099; H01L 2224/32227; H01L 2224/80948; H01L 2924/12041; H01L 2224/291; H01L 2224/08225; H01L 2224/95144; G03F 7/0275; G03F 7/105; G03F 7/0047; G03F 7/027; G03F 7/0043; G03F 7/0007; G03F 7/2004; H05B 33/14; G02F 1/133614; C09K 11/621; C09K 11/883; C09K 11/025; C09K 11/565; C09K 11/70; C09K 11/02

See application file for complete search history.

(56)     References Cited

U.S. PATENT DOCUMENTS

| | | | | |
|---|---|---|---|---|
| 2012/0132888 A1* | 5/2012 | Kwak | .................... | B82Y 20/00 |
| | | | | 977/932 |
| 2013/0221385 A1* | 8/2013 | Shibata | ................ | H10H 20/858 |
| | | | | 438/33 |
| 2014/0145237 A1* | 5/2014 | Do | ........................ | H10H 20/813 |
| | | | | 438/34 |
| 2015/0380461 A1* | 12/2015 | Robin | .................... | H10F 30/282 |
| | | | | 257/459 |
| 2018/0226461 A1* | 8/2018 | Adachi | .................. | H10K 50/85 |
| 2019/0131557 A1* | 5/2019 | Lee | ....................... | H10K 50/166 |
| 2019/0172819 A1* | 6/2019 | Bae | ....................... | H10H 20/853 |
| 2019/0378953 A1* | 12/2019 | Min | ..................... | H10H 20/831 |
| 2020/0403119 A1* | 12/2020 | Sakong | ................ | H10H 20/819 |
| 2021/0167050 A1* | 6/2021 | Cho | ..................... | H01L 25/0753 |
| 2021/0202450 A1* | 7/2021 | Min | ..................... | H10H 20/84 |
| 2021/0202803 A1* | 7/2021 | Park | ....................... | H10H 20/01 |
| 2021/0242369 A1* | 8/2021 | Choi | ................. | H10H 20/8316 |
| 2021/0242380 A1* | 8/2021 | Kim | ................... | H01L 25/0753 |
| 2021/0317365 A1* | 10/2021 | Yang | .................... | G03F 7/0275 |
| 2021/0376193 A1 | 12/2021 | Ko et al. | | |
| 2022/0013693 A1* | 1/2022 | Cho | ..................... | H10H 20/01 |
| 2022/0068892 A1* | 3/2022 | Cha | ........................ | H10H 20/84 |
| 2022/0069005 A1* | 3/2022 | Do | ....................... | H10H 20/831 |
| 2022/0140186 A1* | 5/2022 | Min | ..................... | H10H 29/142 |
| | | | | 257/79 |
| 2022/0140191 A1* | 5/2022 | Sim | .................... | H10H 20/8252 |
| | | | | 257/79 |
| 2022/0173276 A1* | 6/2022 | Teo | ....................... | H10H 20/819 |
| 2022/0310884 A1* | 9/2022 | Do | .......................... | H01L 24/80 |
| 2022/0384395 A1* | 12/2022 | Tan | .................... | H10H 20/0137 |

FOREIGN PATENT DOCUMENTS

| | | |
|---|---|---|
| KR | 10-2009-0066936 | 6/2009 |
| KR | 10-0904588 | 6/2009 |
| KR | 10-2020-0021014 | 2/2020 |
| KR | 10-2311519 | 10/2021 |
| KR | 10-2021-0147158 | 12/2021 |

OTHER PUBLICATIONS

Sheen et al., "Highly efficient blue InGaN nanoscale light-emitting diodes", Nature, Aug. 3, 2022, pp. 1-20.

* cited by examiner

WPD : WPD_SC, WPD_DT, WPD_VL1,
        WPD_VL2, WPD_Vint

SL : SL1, SL2, SL3
CNE : CNE1, CNE2

CNE: CNE1, CNE2
RME: RME1, RME2

1600: 1610, 1620, 1630

1600: 1610, 1620, 1630

1600: 1610, 1620, 1630

1600: 1610, 1620, 1630

(a)

(b)

(a)

(b)

(a)

(b)

(a)

(b)

(a)

(b)

(a)

(b)

(a)

(b)

(c)

(d)

(e)

(f)

(a)

(b)

(a)

(b)

(c)

RME: RME1, RME2, RME3, RME4
CNE: CNE1, CNE2, CNE3, CNE4, CNE5
ED: ED1, ED2, ED3, ED4

RME: RME1, RME2, RME3, RME4
CNE: CNE1, CNE2, CNE3, CNE4

RME: RME1, RME2
CNE: CNE1, CNE2, CNE3
ED: ED1, ED2

RME: RME1, RME2
CNE: CNE1, CNE2, CNE3
ED: ED1, ED2

LIGHT EMITTING ELEMENT, METHOD FOR FABRICATING THE SAME AND DISPLAY DEVICE

CROSS-REFERENCE TO RELATED APPLICATION(S)

This application claims priority to and benefits of U.S. Patent Application No. 63/296,996 filed on Jan. 6, 2022 in the United States Patent & Trademark Office and Korean Patent Application No. 10-2022-0140050 filed on Oct. 27, 2022 under 35 U.S.C. § 119 in the Korean Intellectual Property Office, the entire contents of which are incorporated herein by reference.

BACKGROUND

1. Technical Field

The disclosure relates to a light emitting element, a method for fabricating the same and a display device.

2. Description of the Related Art

With the advancement of multimedia, the importance of a display device has been increased. Therefore, various types of display devices such as an organic light emitting display (OLED) device and a liquid crystal display (LCD) device have been used.

There is a self-light emitting display device that may include a light emitting element as a device for displaying an image of a display device. The self-light emitting display device is a light emitting element, and may include an organic light emitting display device that uses an organic material as a light emitting material, or an inorganic light emitting display device that uses an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a light emitting element in which a defect formed on a surface is minimized to improve light emitting efficiency, and a method for fabricating the same.

Another object of the disclosure is to provide a display device that may include a light emitting element, in which light emitting efficiency is improved, to improve display efficiency.

The objects of the disclosure are not limited to those mentioned above and additional objects of the disclosure, which are not mentioned herein, will be clearly understood by those skilled in the art from the following description.

According to an embodiment, a method for fabricating a light emitting element may include preparing a substrate, and forming a first semiconductor material layer, a light emitting material layer, a second semiconductor material layer and an electrode material layer on the substrate; forming semiconductor rods spaced apart from each other by etching the first semiconductor material layer, the light emitting material layer, the second semiconductor material layer and the electrode material layer in a direction perpendicular to an upper surface of the substrate; forming an insulating layer surrounding sides of the semiconductor rods through a sol-gel process by immersing the substrate, including the semiconductor rods, in a solution containing a precursor material; and forming light emitting elements by separating the semiconductor rods, including the insulating layer, from the substrate, wherein the light emitting elements have an external quantum efficiency of 20.2±0.6%.

The sol-gel process may be performed at a temperature of about 25° C. for about 15 minutes to about 60 minutes.

The insulating layer may have a thickness in a range of about 23 nm to about 80 nm.

The sol-gel process may be performed one or more times, and the insulating layer may include a first layer surrounding the semiconductor rods and a second layer surrounding the first layer of the insulating layer.

A process time of the sol-gel process of forming the first layer may be substantially equal to a process time of the sol-gel process of forming the second layer, and the first layer and the second layer may have a same thickness.

A precursor material of the sol-gel process of forming the first layer may be different from a precursor material of the sol-gel process of forming the second layer, and the first layer and the second layer may include different materials.

The first layer may include silicon oxide ($SiO_2$), and the second layer may include aluminum oxide ($Al_2O_3$).

The method may further include heat-treating the semiconductor rods including the insulating layer, before the separating of the semiconductor rods.

The heat-treating of the semiconductor rods may be performed at a temperature of about 250° C. for about 60 minutes.

The forming of the semiconductor rods may include a first etching step of dry-etching the first semiconductor material layer, the light emitting material layer, the second semiconductor material layer and the electrode material layer, and a second etching step of wet etching after the first etching step.

According to an embodiment, a light emitting element may include a first semiconductor layer doped with an n-type dopant; a second semiconductor layer doped with a p-type dopant and disposed on the first semiconductor layer; a light emitting layer disposed between the first semiconductor layer and the second semiconductor layer; an electrode layer disposed on the second semiconductor layer; and an insulating layer surrounding at least an outer surface of the light emitting layer, wherein an external quantum efficiency is 20.2±0.6%.

The insulating layer may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$).

The insulating layer may have a thickness in a range of about 23 nm to about 80 nm.

The insulating layer may include a first layer, and a second layer surrounding the first layer.

The first layer and the second layer may include a same material, and have a substantially same thickness.

The first layer and the second layer may include different materials, and the first layer may have a thickness greater than a thickness of the second layer.

The first layer may include silicon oxide ($SiO_2$), and the second layer may include aluminum oxide ($Al_2O_3$).

According to an embodiment, a display device may include first electrodes and second electrodes spaced apart from each other on a substrate; a first insulating layer disposed on the first electrodes and the second electrodes; a light emitting element disposed on the first insulating layer, having a first end disposed on the first electrodes and a second end disposed on the second electrodes; a second insulating layer disposed on the light emitting element; a first connection electrode disposed on the first electrodes on the second insulating layer and electrically contacting the first end of the light emitting element; a second connection electrode disposed on the second electrodes on the second insulating layer and electrically contacting the second end of the light emitting element; and a third insulating layer disposed on the second insulating layer and the second connection electrode and disposed below the first connection electrode, wherein the light emitting element may include a first semiconductor layer doped with an n-type dopant; a second semiconductor layer doped with a p-type dopant and disposed on the first semiconductor layer; a light emitting layer disposed between the first semiconductor layer and the second semiconductor layer; an electrode layer disposed on the second semiconductor layer; and an insulating layer surrounding at least an outer surface of the light emitting layer, and an external quantum efficiency is 20.2±0.6%.

The insulating layer may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$), and has a thickness in a range of about 23 nm to about 80 nm.

The insulating layer may include a first layer, and a second layer surrounding the first layer.

In the light emitting element according to one embodiment, an insulating layer surrounding semiconductor layers is formed by a sol-gel process so that light emitting efficiency and electrical characteristics of the light emitting element may be excellent.

The display device according to one embodiment may include a light emitting element to enhance light emitting efficiency.

The effects according to embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which:

FIG. 6 is a schematic cross-sectional view taken along line E1-E1' of FIG. 5;

FIG. 7 is a schematic cross-sectional view taken along line E2-E2' of FIG. 5;

DETAILED DESCRIPTION OF THE EMBODIMENTS

Figure 1:
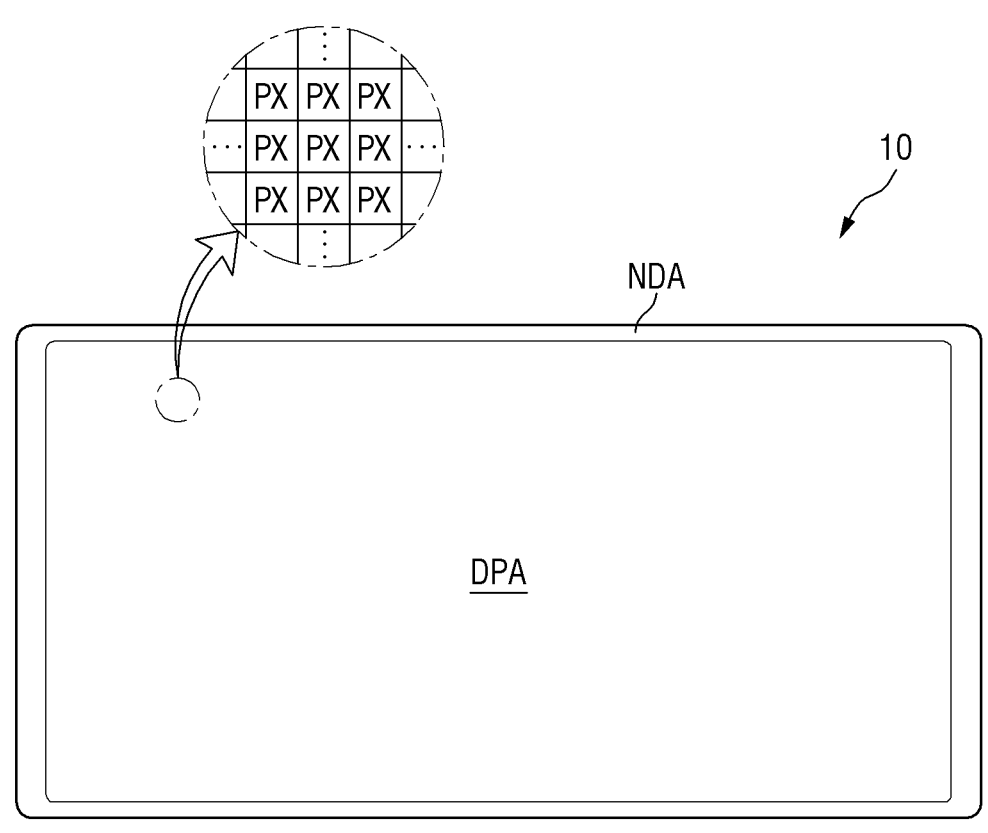
FIG. 1 is a schematic plan view illustrating a display device according to one embodiment.
Figure 1:
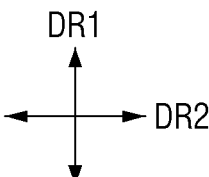

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/of" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," for example, may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value or as otherwise noted or implied herein.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view illustrating a display device according to one embodiment.

Referring to FIG. 1, a display device 10 displays a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like may be included in the display device 10.

The display device 10 may include a display panel for providing a display screen. Examples of the display panel include an inorganic light emitting diode display panel, an organic light emitting display panel, a quantum dot light emitting display panel, a plasma display panel, and a field emission display panel. Hereinafter, an inorganic light emitting diode display panel is applied as an example of the display panel, but the example of the display panel is not limited to the inorganic light emitting diode display panel, and another display panel may be applicable within the spirit and the scope of the disclosure.

Various modifications may be made in a shape of the display device 10. For example, the display device 10 may have a rectangular shape that is long in a horizontal direction, a rectangular shape that is long in a vertical direction, a square shape, a square shape with rounded corners (vertexes), other polygonal shape, a circular shape, for example. A shape of a display area DPA of the display device 10 may be also similar to the overall shape of the display device 10. A display device 10 of a rectangular shape that is longer in a second direction DR2 is illustrated in FIG. 1.

The display device 10 may include a display area DPA and a non-display area NDA. The display area DPA is an area in which a screen may be displayed, and the non-display area NDA is an area in which a screen is not displayed. The display area DPA may be referred to as an active area, and the non-display area NDA may be referred to as a non-active area. The display area DPA may generally occupy the center of the display device 10.

The display area DPA may include pixels PX. The pixels PX may be arranged (or disposed) in a matrix direction. A shape of each pixel PX may be a rectangular or square shape on a plane, but is not limited thereto. The shape of each pixel PX may be a rhombus shape in which each side is inclined with respect to one direction or a direction. Each pixel PX may be arranged in a stripe type or an island type. Also, each of the pixels PX may include one or more light emitting elements for emitting light of a specific wavelength band to display a specific color.

The non-display area NDA may be disposed in the vicinity of the display area DPA. The non-display area NDA may fully or partially surround the display area DPA. The display area DPA may be rectangular in shape, and the non-display area NDA may be disposed to be adjacent to four sides of the display area DPA. The non-display area NDA may constitute a bezel of the display device 10. Lines or circuit drivers included in the display device 10 may be disposed in each of the non-display areas NDA, or external devices may be packaged therein.

Figure 2:
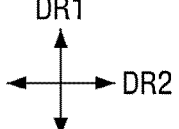
FIG. 2 is a schematic plan view illustrating arrangement of lines included in a display device according to one embodiment.

FIG. 2 is a schematic plan view illustrating arrangement of lines included in a display device according to one embodiment.

Referring to FIG. 2, the display device 10 may include lines. The display device 10 may include scan lines SL; SL1, SL2 and SL3, data lines DTL; DTL1, DTL2 and DTL3, an initialization voltage line VIL, and voltage lines VL; VL1, VL2, VL3 and VL4. Although not shown, other lines may be further disposed in the display device 10. The lines may include lines made of different conductive layers and extended in a first direction DR1 or a second direction DR2, but the extension direction of each line is not limited thereto.

The first scan line SL1 and the second scan line SL2 may be extended in the first direction DR1. The first scan line SL1 and the second scan line SL2 may be disposed to be adjacent to each other, and may be spaced apart from another first scan line SL1 and another second scan line SL2 in the second direction DR2. The first scan line SL1 and the second scan line SL2 may be connected to a scan line pad WPD_SC connected to a scan driver (not shown). The first scan line SL1 and the second scan line SL2 may be extended from a pad area PDA disposed in the non-display area NDA to the display area DPA.

The third scan line SL3 may be extended in the second direction DR2, and may be spaced apart from another third scan line SL3 in the first direction DR1. One third scan line SL3 may be connected to one or more first scan lines SL1 or one or more second scan lines SL2. The scan lines SL may have a mesh structure on a front surface of the display area DPA, but is not limited thereto.

The data lines DTL may be disposed to be extended in the first direction DR1. The data line DTL may include a first data line DTL1, a second data line DTL2 and a third data line DTL3, and the first to third data lines DTL1, DTL2 and DTL3 are disposed to be adjacent to one another while constituting one pair. Each of the data lines DTL1, DTL2 and DTL3 may be extended from the pad area PDA disposed in the non-display area NDA to the display area DPA, but is not limited thereto. The data lines DTL may be spaced apart from each other at constant intervals between a first voltage line VL1 and a second voltage line VL2, which will be described later.

The initialization voltage line VIL may be disposed to be extended in the first direction DR1. The initialization voltage line VIL may be disposed between the data lines DTL and the first voltage line VL1. The initialization voltage line VIL may be extended from the pad area PDA disposed in the non-display area NDA to the display area DPA.

The first voltage line VL1 and the second voltage line VL2 are disposed to be extended in the first direction DR1, and the third voltage line VL3 and the fourth voltage line VL4 are disposed to be extended in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 are extended in the first direction DR1 and disposed across the display area DPA, some lines or a number of lines of the third voltage line VL3 and the fourth voltage line VL4 may be disposed in the display area DPA and the other lines thereof may be disposed in the non-display area NDA positioned at both sides of the display area DPA in the first direction DR1. The first voltage line VL1 and the second voltage line VL2 may be formed of a first conductive layer and the third voltage line VL3 and the fourth voltage line VL4 may be formed of a third conductive layer disposed on a layer different from the first conductive layer. The first voltage line VL1 may be connected to at least one third voltage line VL3, and the second voltage line VL2 may be connected to at least one fourth voltage line VL4. The voltage lines VL may have a mesh structure on the front surface of the display area DPA, but are not limited thereto.

The first scan line SL1, the second scan line SL2, the data line DTL, the initialization voltage line VIL, the first voltage line VL1 and the second voltage line VL2 may be electrically connected to at least one line pad WPD. Each of the line pads WPD may be disposed in the non-display area NDA. In one embodiment, each of the line pads WPD may be disposed in the pad area PDA positioned at a lower side that is the other side of the display area DPA in the first direction DR1. The first scan line SL1 and the second scan line SL2 are connected to the scan line pad WPD_SC disposed in the pad area PDA, and the data lines DTL are connected to different data line pads WPD_DT, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. An external device may be packaged on the line pad WPD. The external device may be packaged on the line pad WPD through an anisotropic conductive film, an ultrasonic bonding or the like within the spirit and the scope of the disclosure. Each line pad WPD is illustrated as being disposed in the pad area PDA disposed below the display area DPA, but is not limited thereto. A portion of the line pads WPD may be disposed on an upper side or any one of left and right sides of the display area DPA.

Each pixel PX or subpixel SPXn (n is an integer of 1 to 3) of the display device 10 may include a pixel driving circuit. The above-described lines may apply a driving signal to each pixel driving circuit while passing each pixel PX or the periphery of each pixel PX. The pixel driving circuit may include transistors and capacitors. Various modifications may be made in the number of transistors and capacitors of each pixel driving circuit. According to one embodiment, each subpixel SPXn of the display device 10 may have a 3T1C structure in which the pixel driving circuit may include three transistors and one capacitor. Hereinafter, the pixel driving circuit will be described as an example of a 3T1C structure, but is not limited thereto, and other various modified structures such as a 2T1C structure, a 7T1C structure and a 6T1C structure may be applied to the pixel driving circuit.

Figure 3:
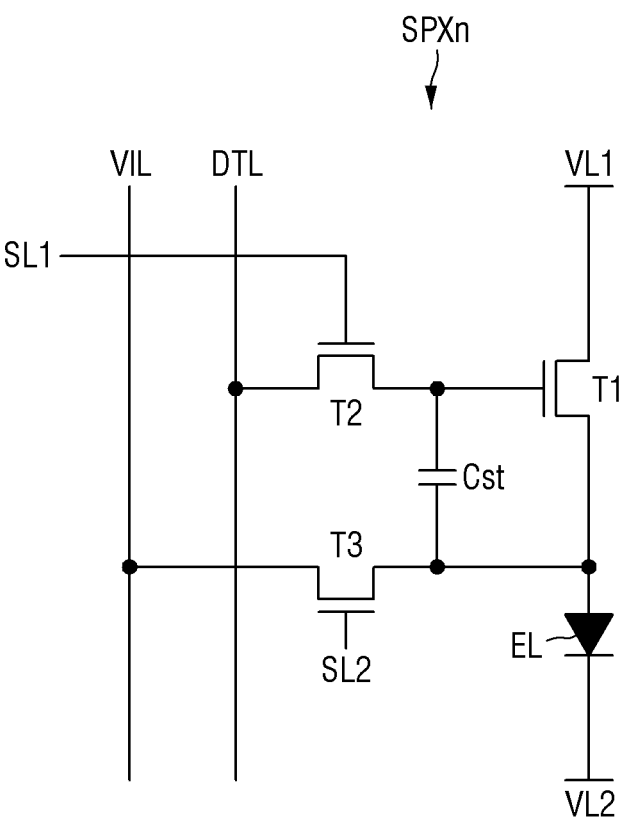
FIGS. 3 and 4 are schematic diagrams of equivalent circuit views illustrating one subpixel of a display device according to one embodiment.
Figure 4:
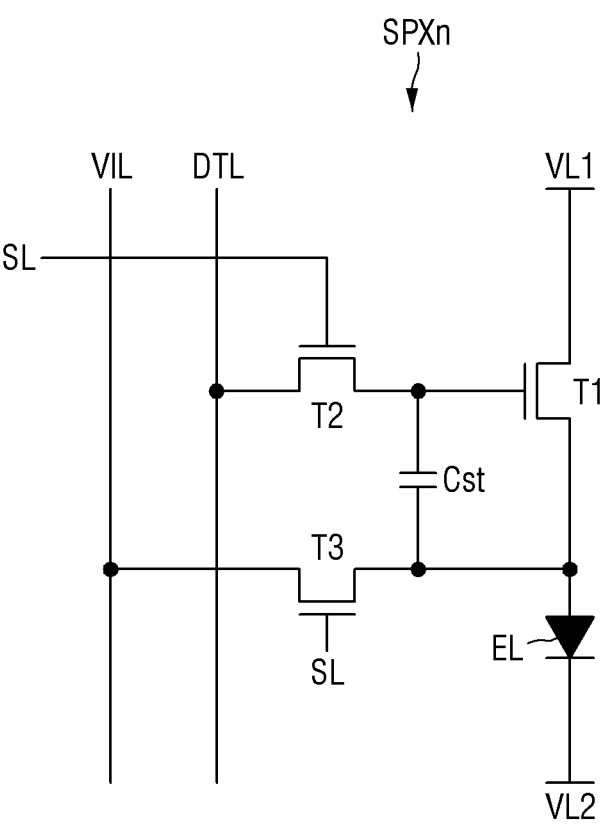

FIGS. 3 and 4 are schematic diagrams of equivalent circuit views illustrating one subpixel of a display device according to one embodiment.

Referring to FIG. 3, each subpixel SPXn of the display device 10 according to one embodiment may include three transistors T1, T2 and T3 and one storage capacitor Cst in addition to a light emitting diode EL.

The light emitting diode EL emits light in accordance with a current supplied through the first transistor T1. The light emitting diode EL may include a first electrode, a second electrode, and at least one light emitting element disposed between the first electrode and the second electrode. The light emitting element may emit light of a specific wavelength band by an electrical signal transferred from the first electrode and the second electrode.

One end of the light emitting diode EL may be connected to a source electrode of the first transistor T1, and the other end thereof may be connected to the second voltage line VL2 supplied with a low potential voltage (hereinafter, second power voltage) lower than a high potential voltage (hereinafter, first power voltage) of the first voltage line VL1.

The first transistor T1 adjusts the current flowing from the first voltage line VL1, to which the first power voltage is supplied, to the light emitting diode EL in accordance with a voltage difference between a gate electrode and a source electrode. For example, the first transistor T1 may be a driving transistor for driving the light emitting diode EL. The gate electrode of the first transistor T1 may be connected to a source electrode of the first transistor T2, its source electrode may be connected to the first electrode of the light emitting diode EL, and its drain electrode may be connected to the first voltage line VL1 to which the first power voltage is applied.

The second transistor T2 is turned on by a scan signal of the first scan line SL1 to connect the data line DTL to the gate electrode of the first transistor T1. A gate electrode of the second transistor T2 may be connected to the first scan line SL1, its source electrode may be connected to the gate electrode of the first transistor T1, and its drain electrode may be connected to the data line DTL.

The third transistor T3 is turned on by a scan signal of the second scan line SL2 to connect the initialization voltage line VIL to one end of the light emitting diode EL. A gate electrode of the third transistor T3 may be connected to the second scan line SL2, its drain electrode may be connected to the initialization voltage line VIL, and its source electrode may be connected to one end of the light emitting diode EL or the source electrode of the first transistor T1.

In one embodiment, the source electrode and the drain electrode of each of the transistors T1, T2 and T3 are not limited to those described above, and may be vice versa. Each of the transistors T1, T2 and T3 may be formed of a thin film transistor. In FIG. 3, each of the transistors T1, T2 and T3 is formed of an N-type metal oxide semiconductor field effect transistor (MOSFET), but is not limited thereto. For example, each of the transistors T1, T2 and T3 may be formed of a P-type MOSFET, or a portion of the transistors T1, T2 and T3 may be formed of an N-type MOSFET and another portion thereof may be formed of a P-type MOSFET.

The storage capacitor Cst is formed between the gate electrode and the source electrode of the first transistor T1. The storage capacitor Cst stores a differential voltage between a gate voltage and a source voltage of the first transistor T1.

In the embodiment of FIG. 3, the gate electrode of the second transistor T2 may be connected to the first scan line SL1, and the gate electrode of the third transistor T3 may be connected to the second scan line SL2. The first scan line SL1 and the second scan line SL2 are the scan lines different from each other, and the second transistor T2 and the third transistor T3 may be turned on by the scan signals applied from the different scan lines, but the disclosure is not limited thereto.

Referring to FIG. 4, the gate electrodes of the second transistor T2 and the third transistor T3 may be connected to a same scan line SL, and may be simultaneously turned on by the scan signal applied from the same scan line.

Hereinafter, a structure of one pixel PX of the display device 10 according to one embodiment will be described in detail with reference to other drawings.

Figure 5:
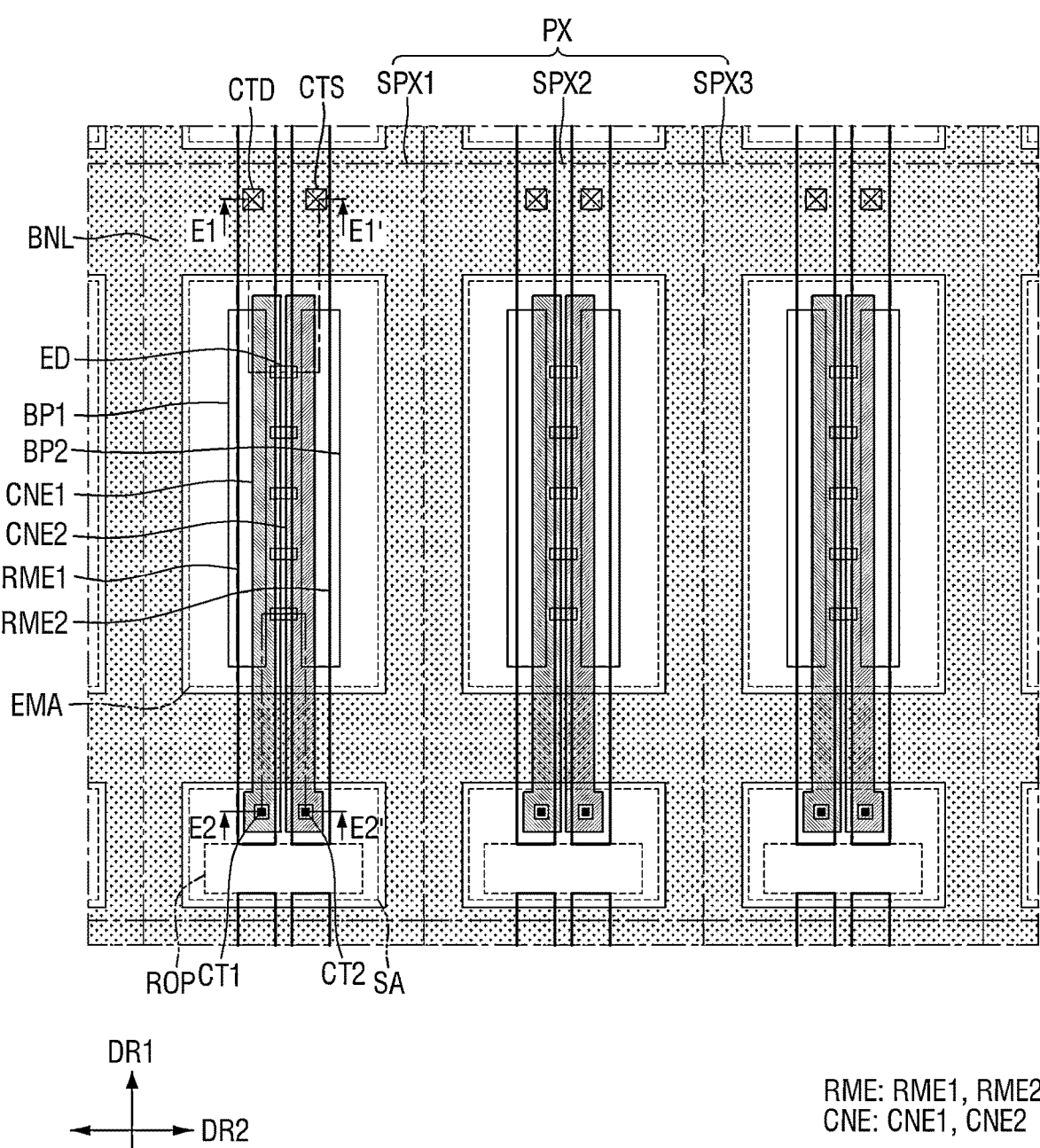
FIG. 5 is a schematic plan view illustrating one pixel of a display device according to one embodiment.

FIG. 5 is a schematic plan view illustrating one pixel of a display device according to one embodiment.

FIG. 5 shows a planar arrangement of electrodes RME: RME1 and RME2, walls BP1 and BP2, and a bank layer BNL, light emitting elements ED and connection electrodes CNE: CNE1 and CNE2, which are disposed in one pixel PX of the display device 10.

Referring to FIG. 5, each of the pixels PX of the display device 10 may include subpixels SPXn. For example, one pixel PX may include a first subpixel SPX1, a second subpixel SPX2 and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red, but the disclosure is not limited thereto. The respective subpixels SPXn may emit light of a same color. In one embodiment, each subpixel SPXn may emit blue light. One pixel PX is illustrated as including three subpixels SPXn but is not limited thereto, and the pixel PX may include a larger number of subpixels SPXn.

Each subpixel SPXn of the display device 10 may include a light emission area EMA and a non-light emission area. The light emission area EMA may be an area in which a light emitting element ED is disposed to emit light of a specific wavelength band. The non-light emission area may be an area in which the light emitting element ED is not disposed and light emitted from the light emitting element ED does not reach there and thus is not emitted.

The light emission area EMA may include an area in which the light emitting element ED is disposed, and an area, to which the light emitted from the light emitting element ED is output, as an area adjacent to the light emitting element ED. For example, the light emission area EMA may also include an area to which the light emitted from the light emitting element ED is output by being reflected or refracted by another member. The light emitting elements ED may be disposed in the respective subpixels SPXn, and may include an area in which they are disposed and an area adjacent thereto, thereby forming a light emission area.

Although the light emission areas EMA of the respective subpixels SPXn are illustrated as having a uniform area, the disclosure is not limited thereto. In an embodiment, the respective light emission areas EMA of the respective subpixels SPXn may have different areas depending on a color or wavelength band of light emitted from the light emitting element ED disposed in the corresponding subpixel.

Each subpixel SPXn may further include a sub-area SA disposed in the non-light emission area. The sub-area SA of the corresponding subpixel SPXn may be disposed at a lower side that is the other side of the light emission area EMA in the first direction DR1. The light emission area EMA and the sub-area SA may be alternately disposed along the first direction DR1, and the sub-area SA may be disposed between the light emission areas of the different subpixels SPXn spaced apart from each other in the first direction DR1. For example, the light emission area EMA and the sub-area SA may be alternately arranged in the first direction DR1, and the light emission area EMA and the sub-area SA may be repeatedly arranged in the second direction DR2, but are not limited thereto. The light emission areas EMA and the sub-areas SA in the pixels PX may have an arrangement different from that of FIG. 4.

As the light emitting element ED is not disposed in the sub-area SA, light is not emitted from the sub-area SA, but a portion of the electrodes RME disposed in the respective subpixels SPXn may be disposed in the sub-area SA. The electrodes RME disposed in the different subpixels SPXn may be spaced apart from each other by a partition portion ROP of the sub-area SA.

The display device 10 may include electrodes RME; RME1 and RME2, walls BP1 and BP2, a bank layer BNL, light emitting elements ED, and connection electrodes CNE; CNE1 and CNE2.

The walls BP1 and BP2 may be disposed in the light emission area EMA of each subpixel SPXn. The walls BP1 and BP2 may be generally extended in the first direction DR1, and may be disposed to be spaced apart from each other in the second direction DR2.

For example, the walls BP1 and BP2 may include a first wall BP1 and a second wall BP2, which are spaced apart from each other in the second direction DR2 in the light emission area EMA of each subpixel SPXn. The first wall BP1 may be disposed at a left side that is one side or a side in the second direction DR2 at the center of the light emission area EMA, and the second walls BP2 may be spaced apart from the first wall BP1 and disposed at a right side that is the other side or another side in the second direction DR2 at the center of the light emission area EMA. The first wall BP1 and the second wall BP2 may be alternately disposed along the second direction DR2, and may be disposed in the display area DPA in an island pattern. The light emitting elements ED may be disposed between the first wall BP1 and the second wall BP2.

The first wall BP1 and the second wall BP2 have a same length in the first direction DR1 but may be shorter than a length in the first direction DR1 of the light emission area EMA surrounded by the bank layer BNL. The first wall BP1 and the second wall BP2 may be spaced apart from a portion of the bank layer BNL, which is extended in the second direction DR2, but are not limited thereto. The walls BP1 and BP2 may be integrated with the bank layer BNL, or may partially overlap the portion of the bank layer BNL, which is extended in the second direction DR2. The length of the walls BP1 and BP2 in the first direction DR1 may be equal to or greater than the length in the first direction DR1 of the light emission area EMA surrounded by the bank layer BNL.

Two walls BP1 and BP2 are illustrated as being disposed for each subpixel SPXn, but are not limited thereto. The number and shape of the walls BP1 and BP2 may vary depending on the number or arrangement structure of the electrodes RME.

The electrodes RME; RME1 and RME2 may be disposed in each subpixel SPXn in a shape extended in one direction or a direction. The electrodes RME1 and RME2 may be extended in the first direction DR1 and thus disposed in the light emission area EMA and the sub-areas SA of the subpixel SPXn. The electrodes RME1 and RME2 may be spaced apart from each other in the second direction DR2. The electrodes RME may be electrically connected to the light emitting element ED that will be described later, but is not limited thereto. The electrodes RME may not be electrically connected to the light emitting element ED.

The display device 10 may include a first electrode RME1 and a second electrode RME2, which are disposed in each subpixel SPXn. The first electrode RME1 is disposed at the left side of the center of the light emission area EMA, and the second electrode RME2 is spaced apart from the first electrode RME1 in the second direction DR2 and disposed at the right side of the center of the light emission area EMA. The first electrode RME1 may be disposed on the first wall BP1, and the second electrode RME2 may be disposed on the second wall BP2. The first electrode RME1 and the second electrode RME2 may be partially disposed in the corresponding subpixel SPXn and sub-area SA beyond the bank layer BNL. The first electrode RME1 and the second electrode RME2 of different subpixels SPXn may be spaced apart from or separated from each other in the partition portion ROP positioned in the sub-area SA of one subpixel SPXn.

Although two electrodes RME are illustrated as having a shape extended in the first direction DR1 for each subpixel SPXn, the disclosure is not limited thereto. For example, the display device 10 may have a larger number of electrodes RME disposed in one subpixel SPXn, or the electrodes RME may be partially bent and have a different width depending on positions.

The bank layer BNL may be disposed to surround the subpixels SPXn and the light emission area EMA and the sub-area SA. The bank layer BNL may be disposed at a boundary between subpixels adjacent to each other in the first direction DR1 and the second direction DR2, and may be disposed at a boundary between the light emission area EMA and the sub-area SA. The subpixels SPXn, the light emission area EMA and the sub-area SA of the display device 10 may be areas partitioned by the arrangement of the bank layer BNL. An interval among the subpixels SPXn, the light emission areas EMA and the sub-areas SA may vary depending on a width of the bank layer BNL.

The bank layer BNL may include a portion extended in the first direction DR1 and the second direction DR2 on a plane, and may be disposed on the front surface of the display area DPA in a lattice pattern. The bank layer BNL may be disposed over the boundary of the respective subpixels SPXn to distinguish adjacent subpixels. The bank layer BNL may be disposed to surround the light emission area EMA and the sub-area SA, which are disposed for each subpixel SPXn, thereby partitioning the areas. As will be described later, the bank layer BNL may form an area in which color control structures of the display device 10 are disposed.

The light emitting elements ED may be disposed in the light emission area EMA. The light emitting elements ED may be disposed between the walls BP1 and BP2, and may be arranged to be spaced apart from each other in the first direction DR1. In one embodiment, the light emitting elements ED may have a shape extended in one direction or in a direction, and both ends thereof may be disposed on different electrodes RME. A length of the light emitting element ED may be longer than an interval between the electrodes RME spaced apart from each other in the second direction DR2. The light emitting elements ED may be generally extended in a direction perpendicular to the first direction DR1 in which the electrodes RME are extended, but are not limited thereto. The light emitting elements ED may be disposed to be extended toward the second direction DR2 or a direction obliquely inclined with respect to the second direction DR2.

The connection electrodes CNE; CNE1 and CNE2 may be disposed on the electrodes RME and the walls BP1 and BP2. The connection electrodes CNE may respectively have a shape extended in one direction or in a direction, and may be disposed to be spaced apart from each other. Each of the connection electrodes CNE may be in contact with the light emitting element ED, and may be electrically connected to the electrode RME or a conductive layer below the electrode RME.

The connection electrodes CNE may include a first connection electrode CNE1 and a second connection electrode CNE2, which are disposed in each subpixel SPXn. The first connection electrode CNE1 may have a shape extended in the first direction DR1, and may be disposed on the first electrode RME1 or the first wall BP1. The first connection electrode CNE1 may partially overlap the first electrode RME1, and may be disposed from the light emission area EMA to the sub-area SA beyond the bank layer BNL. The second connection electrode CNE2 may have a shape extended in the first direction DR1, and may be disposed on the second electrode RME2 or the second wall BP2. The second connection electrode CNE2 may partially overlap the second electrode RME2, and may be disposed from the light emission area EMA to the sub-area SA beyond the bank layer BNL.

Figure 6:
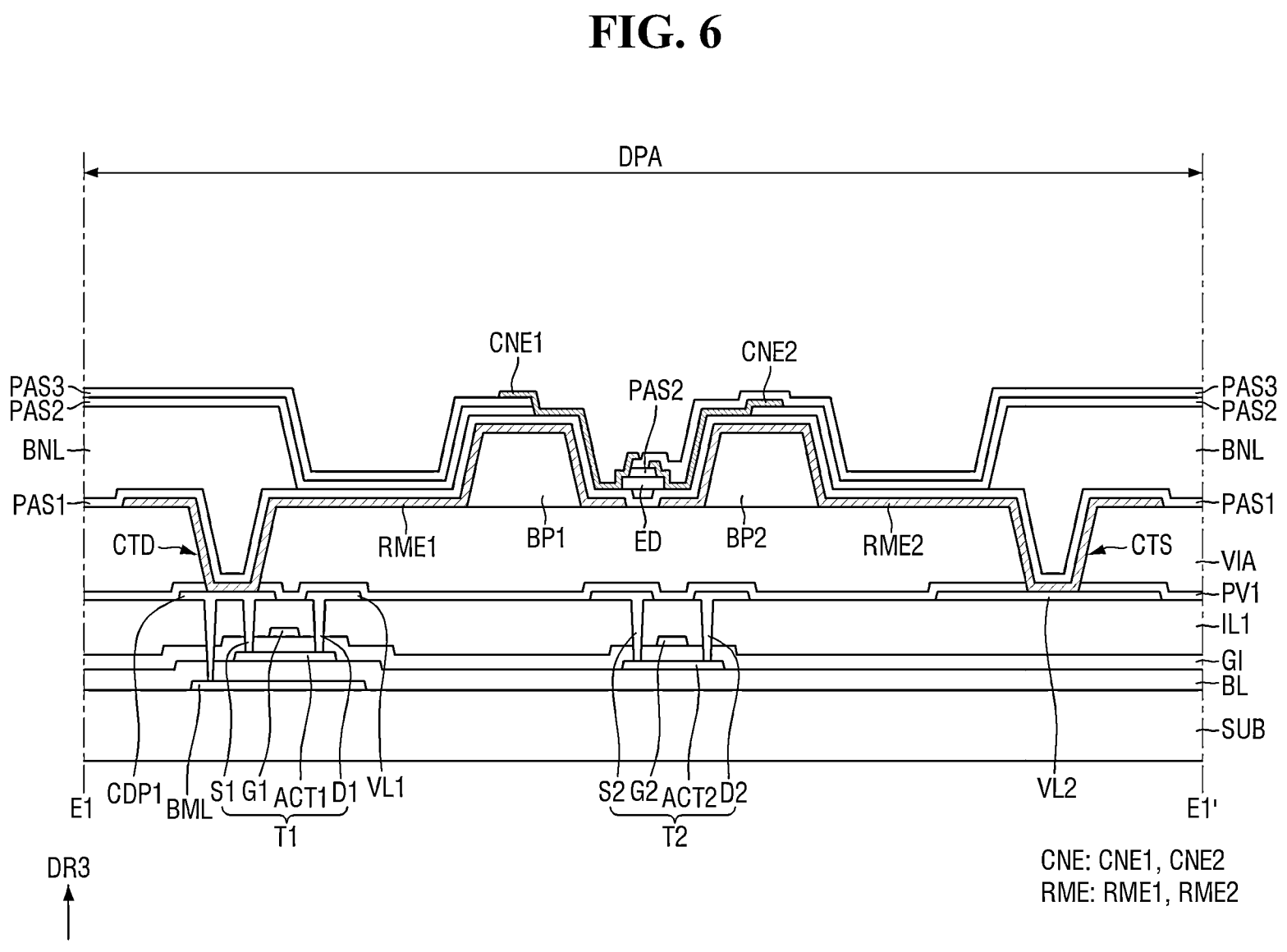
Figure 7:
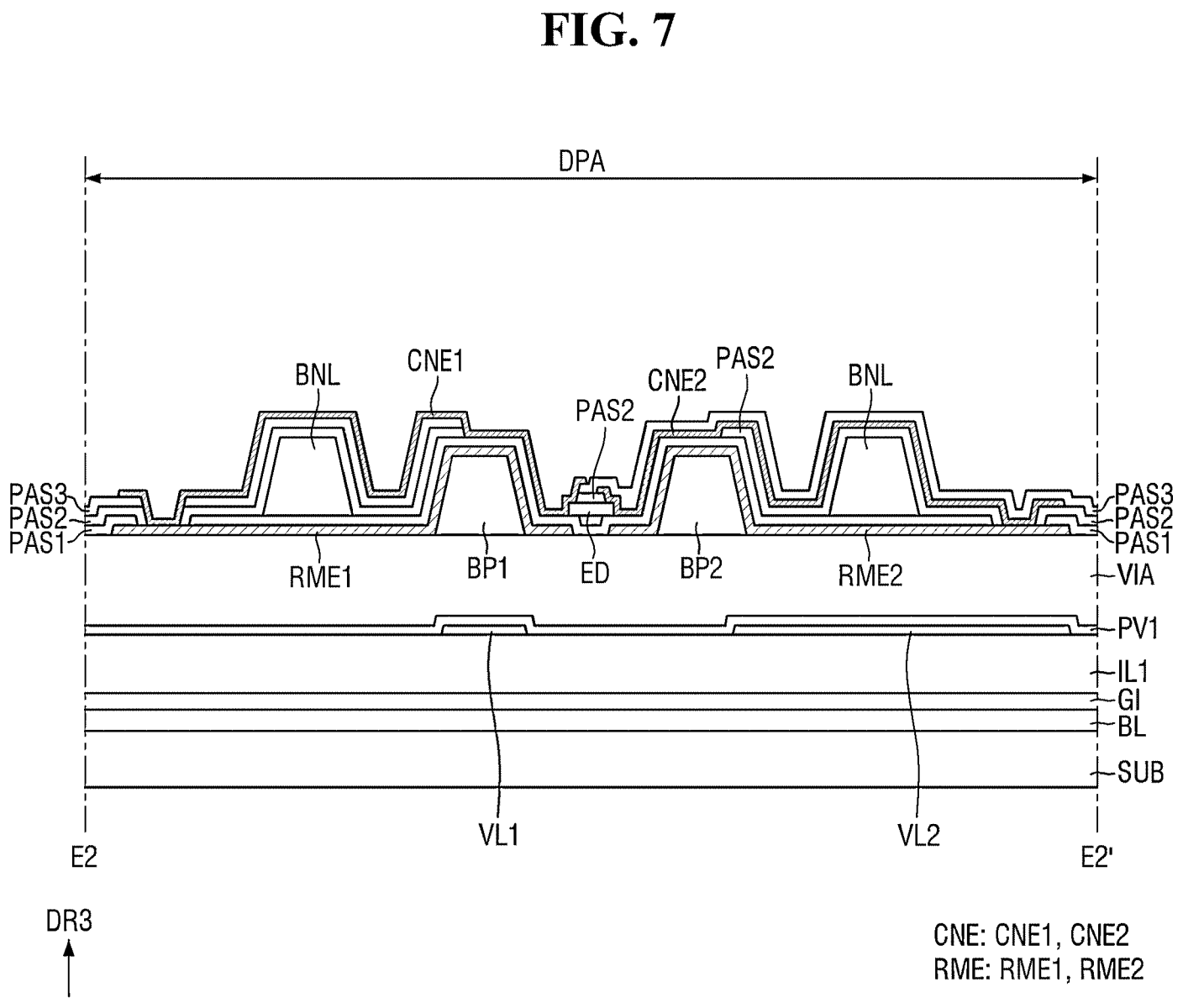

FIG. 6 is a schematic cross-sectional view taken along line E1-E1' of FIG. 5. FIG. 7 is a schematic cross-sectional view taken along line E2-E2' of FIG. 5.

FIG. 6 shows a cross-section across both ends of the light emitting element ED disposed in the first subpixel SPX1 and electrode contact holes CTD and CTS, and FIG. 7 shows a cross-section across both ends of the light emitting element ED disposed in the first subpixel SPXn and contact portions CT1 and CT2.

A cross-sectional structure of the display device 10 will be described with reference to FIGS. 6 and 7 in addition to FIG. 5. The display device 10 may include a first substrate SUB, and a line substrate including a semiconductor layer, conductive layers and insulating layers, which are disposed on the first substrate SUB. The display device 10 may include electrodes RME; RME1 and RME2, a light emitting element ED and connection electrodes CNE; CNE1 and CNE2, which are disposed on the line substrate. The semiconductor layer, the conductive layer and the insulating layers of the line substrate may constitute a circuit layer of the display device 10, respectively.

The first substrate SUB may be an insulating substrate SUB. The first substrate SUB may be made of an insulating material such as glass, quartz or a polymer resin. The first substrate SUB may be a rigid substrate, but may be a flexible substrate capable of being subjected to bending, folding, rolling or the like within the spirit and the scope of the disclosure. The first substrate SUB may include a display area DPA and a non-display area NDA surrounding the display area DPA, and the display area DPA may include a light emission area EMA and a sub-area SA that is a portion of a non-light emission area.

The first conductive layer may be disposed on the first substrate SUB. The first conductive layer may include a lower metal layer BML, and the lower metal layer BML is disposed to overlap an active layer ACT1 of the first transistor T1. The lower metal layer BML may prevent light from being incident on the first active layer ACT1 of the first transistor, or may be electrically connected to the first active layer ACT1 to stabilize electrical characteristics of the first transistor T1. However, the lower metal layer BML may be omitted.

A buffer layer BL may be disposed on the first conductive layer and the first substrate SUB. The buffer layer BL may be formed on the first substrate SUB to protect the transistors of the pixel PX from water permeated through the first substrate SUB vulnerable to moisture permeation, and may perform a surface planarization function.

The semiconductor layer is disposed on the buffer layer BL. The semiconductor layer may include the first active layer ACT1 of the first transistor T1 and a second active layer ACT2 of the second transistor T2. The first and second active layers ACT1 and ACT2 may be disposed to partially overlap a first gate electrode G1 and a second gate electrode G2 of the second conductive layer, which will be described later.

The semiconductor layer may include polycrystalline silicon, monocrystalline silicon, an oxide semiconductor, and the like within the spirit and the scope of the disclosure. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

One first transistor T1 is illustrated as being disposed in the subpixel SPXn of the display device 10, but the disclosure is not limited thereto, and the display device 10 may include a larger number of transistors.

A first gate insulating layer GI is disposed on the semiconductor layer and the buffer layer BL in the display area DPA. The first gate insulating layer GI may serve as a gate insulating layer of each of the transistors T1 and T2. The first gate insulating layer GI is illustrated as being entirely disposed on the buffer layer BL, but is not limited thereto. In an embodiment, the first gate insulating layer GI may be patterned together with the gate electrodes G1 and G2 of the second conductive layer, which will be described later, and may partially disposed between the second conductive layer and the active layers ACT1 and ACT2 of the semiconductor layer.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap a channel area of the first active layer ACT1 in a third direction DR3 that is a thickness direction, and the second gate electrode G2 may be disposed to overlap a channel area of the second active layer ACT2 in the third direction DR3 that is a thickness direction. Although not shown, the second conductive layer may further include one electrode of the storage capacitor.

A first interlayer insulating layer IL1 is disposed on the second conductive layer. The first interlayer insulating layer IL1 may serve as an insulating layer between the second conductive layer and other layers disposed on the second conductive layer, and may protect the second conductive layer.

The third conductive layer is disposed on the first interlayer insulating layer ILL. The third conductive layer may include first and second voltage lines VL1 and VL2 disposed in the display area DPA, and a first conductive pattern CDP1, and source electrodes S1 and S2 and drain electrodes D1 and D2 of the transistors T1 and T2. Although not shown, the third conductive layer may further include the other electrode of the storage capacitor.

A high potential voltage (or first power voltage) transferred to the first electrode RME1 may be applied to the first voltage line VL1, and a low potential voltage (or second power voltage) transferred to the second electrode RME2 may be applied to the second voltage line VL2. A portion of the first voltage line VL1 may be in contact with the first active layer ACT1 of the first transistor T1 through a contact hole that passes through the first interlayer insulating layer IL1 and the first gate insulating layer GI. The first voltage line VL1 may serve as the first drain electrode D1 of the first transistor T1. The second voltage line VL2 may be directly connected with the second electrode RME2 that will be described later.

The first conductive pattern CDP1 may be in contact with the first active layer ACT1 of the first transistor T1 through the contact hole that passes through the first interlayer insulating layer IL1. The first conductive pattern CDP1 may be in contact with the lower metal layer BML through another contact hole. The first conductive pattern CDP1 may serve as the first source electrode S1 of the first transistor T1. The first conductive pattern CDP1 may be connected to the first electrode RME1 or the first connection electrode CNE1.

The first transistor T1 may transfer the first power voltage applied from the first voltage line VL1 to the first electrode RME1 or the first connection electrode CNE1.

Each of the second source electrode S2 and the second drain electrode D2 may be in contact with the second active layer ACT2 of the second transistor T2 through the contact hole that passes through the first interlayer insulating layer IL1 and the first gate insulating layer GI. The second transistor T2 may be any one of the switching transistors described with reference to FIG. 3. The second transistor T2 may transfer the signal applied from the data line DTL of FIG. 3 to the first transistor T1, or may transfer the signal applied from the initialization voltage line VIL to the other electrode of the storage capacitor.

A first passivation layer PV1 is disposed on the third conductive layer. The first passivation layer PV1 may serve as an insulating layer between the third conductive layer and the other layers, and may protect the third conductive layer.

The buffer layer BL, the first gate insulating layer GI, the first interlayer insulating layer IL1 and the first passivation layer PV1 may be formed of inorganic layers that may be alternately stacked each other. For example, the buffer layer BL, the first gate insulating layer GI, the first interlayer insulating layer IL1 and the first passivation layer PV1 may be formed of a double layer, in which inorganic layers including at least one of silicon oxide ($SiO_x$), silicon nitride ($SiN_x$), or silicon oxynitride ($SiO_xN_y$) may be stacked each other, or multiple layers in which the inorganic layers may be alternately stacked each other, but are not limited thereto. The buffer layer BL, the first gate insulating layer GI, the first interlayer insulating layer IL1 and the first passivation layer PV1 may be made of one inorganic layer including the insulating material described above. Also, in an embodiment, the first interlayer insulating layer IL1 may be made of an organic insulating material such as polyimide (PI).

A via layer VIA is disposed on the third conductive layer in the display area DPA. The via layer VIA may include an organic insulating material such as, for example, polyimide (PI), to compensate for a step difference caused by the lower conductive layers and to form a flat upper surface. However, in an embodiment, the via layer VIA may be omitted.

The display device 10 may include walls BP1 and BP2, electrodes RME; RME1 and RME2, a bank layer BNL, light emitting elements ED and connection electrodes CNE; CNE1 and CNE2 as display element layers disposed on the via layer VIA of the line substrate. The display device 10 may include insulating layers PAS1, PAS2 and PAS3 disposed on the line substrate.

The walls BP1 and BP2 may be disposed on the via layer VIA. For example, the walls BP1 and BP2 may be directly disposed on the via layer VIA, and at least a portion of the walls BP1 and BP2 may have a protruded structure based on an upper surface of the via layer VIA. The protruded portions of the walls BP1 and BP2 may have sides inclined or bent with a curvature, and light emitted from the light emitting element ED may be reflected by the electrode RME disposed on the walls BP1 and BP2 and emitted in an upper direction of the via layer VIA. Unlike the shown example, an outer surface of the walls BP1 and BP2 on a cross-sectional view may have a shape curved with a curvature, for example, a semi-circular or semi-elliptical shape. The walls BP1 and BP2 may include, but are not limited to, an organic insulating material such as polyimide (PI).

The electrodes RME; RME1 and RME2 may be disposed on the walls BP1 and BP2 and the via layer VIA. For example, the first electrode RME1 and the second electrode RME2 may be disposed on the inclined sides of the walls BP1 and BP2. A width of the electrodes RME, which is measured in the second direction DR2, may be smaller than a width of the walls BP1 and BP2, which is measured in the second direction DR2, and an interval between the first electrode RME1 and the second electrode RME2 in the second direction DR2 may be narrower than an interval between the walls BP1 and BP2. At least a portion of the first electrode RME1 or the second electrode RME2 may be disposed directly on the via layer such that the first electrode RME1 and the second electrode RME2 may be disposed on a same plane.

The light emitting elements ED disposed between the walls BP1 and BP2 emit light in both end directions, and the emitted light may be directed toward the electrode RME disposed on the walls BP1 and BP2. Each electrode RME may have a structure in which a portion disposed on the walls BP1 and BP2 may reflect the light emitted from the light emitting element ED. The first electrode RME1 and the second electrode RME2 may be disposed to cover at least one side or a side of the walls BP1 and BP2 to reflect the light emitted from the light emitting element ED.

The electrodes RME may be directly in direct contact with the third conductive layer through the electrode contact holes CTD and CTS in a portion overlapped with the bank layer BNL between the light emission area EMA and the sub-area SA. The first electrode contact hole CTD may be formed in an area where the bank layer BNL and the first electrode RME1 overlap each other, and the second electrode contact hole CTS may be formed in an area where the bank layer BNL and the second electrode RME2 overlap each other. The first electrode RME1 may be in contact with the first conductive pattern CDP1 through the first electrode contact hole CTD that passes through the via layer VIA and the first passivation layer PV1. The second electrode RME2 may be in contact with the second electrode contact hole CTS that passes through the via layer VIA and the first passivation layer PV1. The first electrode RME1 may be electrically connected to the first transistor T1 through the first conductive pattern CDP1 so that the first power voltage may be applied thereto, and the second electrode RME2 may be electrically connected to the second voltage line VL2 so that the second power voltage may be applied thereto, but the disclosure is not limited thereto. In an embodiment, the respective electrodes RME1 and RME2 may not be electrically connected to the voltage lines VL1 and VL2 of the third conductive layer, and the connection electrode CNE, which will be described later, may be directly connected to the third conductive layer.

Each of the electrodes RME may include a conductive material having high reflectance. For example, the electrodes RME may include a metal such as silver (Ag), copper (Cu) and aluminum (Al) or an alloy containing aluminum (Al), nickel (Ni), lanthanum (La), for example, or may have a structure in which a metal layer such as titanium (Ti), molybdenum (Mo) and niobium (Nb) and the alloy may be stacked each other. In an embodiment, the electrodes RME may be a double layer or multiple layers in which an alloy containing aluminum (Al) and at least one metal layer of titanium (Ti), molybdenum (Mo) or niobium (Nb) may be stacked each other.

Without limitation to the above example, each of the electrodes RME may further include a transparent conductive material. For example, each electrode RME may include a material such as ITO, IZO and ITZO. In an embodiment, each of the electrodes RME may have a structure in which one or more layers of a transparent conductive material and a metal layer having high reflectance may be stacked each other, or may be formed as a single layer including the transparent conductive material and the metal layer. For example, each electrode RME may have a stacked structure such as ITO/Ag/ITO/, ITO/Ag/IZO or ITO/Ag/ITZO/IZO. The electrodes RME may be electrically connected to the light emitting elements ED, and may reflect some of the light emitted from the light emitting elements ED in an upper direction of the first substrate SUB.

The first insulating layer PAS1 may be disposed on the front surface of the display area DPA, and may be disposed on the via layer VIA and the electrodes RME. The first insulating layer PAS1 may protect the electrodes RME and at the same time mutually insulate the different electrodes RME. The first insulating layer PAS1 may be disposed to cover the electrodes RME before the bank layer BNL is formed, thereby preventing the electrodes RME from being damaged in the process of forming the bank layer BNL. The first insulating layer PAS1 may prevent the light emitting element ED disposed thereon from being damaged due to direct contact with other members.

In an embodiment, the first insulating layer PAS1 may be stepped such that its upper surface is partially recessed between the electrodes RME spaced apart from each other in the second direction DR2. The light emitting elements ED may be disposed on the upper surface of the first insulating layer PAS1 that is stepped, and a space may be formed between the light emitting elements ED and the first insulating layer PAS1.

The first insulating layer PAS1 may include contact portions CT1 and CT2 disposed in the sub-area SA. The contact portions CT1 and CT2 may be disposed to overlap their respective electrodes RME different from each other. For example, the first insulating layer PAS1 may include first contact portions CT1 disposed to overlap the first electrode RME1, and second contact portions CT2 disposed to overlap the second electrode RME2. The first contact portions CT1 and the second contact portions CT2 may expose a portion of the upper surface of the first electrode RME1 or the second electrode RME2 below the first insulating layer PAS1 by passing through the first insulating layer PAS1. Each of the first contact portion CT1 and the second contact portion CT2 may further pass through a portion other insulating layers disposed on the first insulating layer PAS1. The electrode RME exposed by the respective contact portions CT1 and CT2 may be in contact with the connection electrode CNE.

The bank layer BNL may be disposed on the first insulating layer PAS1. The bank layer BNL may include a portion extended in the first direction DR1 and the second direction DR2, and may surround each of the subpixels SPXn. The bank layer BNL may surround the light emission area EMA and the sub-area SA of each subpixel SPXn to distinguish them from each other and surround the outermost portion of the display area DPA to distinguish the display area DPA from the non-display area NDA.

The bank layer BNL may have a height similar to the walls BP1 and BP2. In an embodiment, an upper surface of the bank layer BNL may be higher than the walls BP1 and BP2, and its thickness may be equal to or greater than that of the walls BP1 and BP2. The bank layer BNL may prevent ink from overflowing to the subpixel SPXn adjacent thereto in an inkjet printing process of a fabricating process of the display device 10. The bank layer BNL may include an organic insulating material such as polyimide in the same manner as the walls BP1 and BP2.

The light emitting elements ED may be disposed in the light emission area. The light emitting elements ED may be disposed on the first insulating layer PAS1 between the walls BP1 and BP2. The light emitting element ED may be disposed such that a portion extended in one direction or a direction is to be parallel with the upper surface of the first substrate SUB. As described below, the light emitting elements ED may include semiconductor layers disposed along the extended direction, and the semiconductor layers may be sequentially disposed along a direction parallel with the upper surface of the first substrate SUB, but the disclosure is not limited thereto. In case that the light emitting element ED has another structure, the semiconductor layers may be disposed in a direction perpendicular to the first substrate SUB.

The light emitting elements ED disposed in the respective subpixels SPXn may emit light having different wavelength bands depending on the material of the semiconductor layer, but are not limited thereto. The light emitting elements ED disposed in the respective subpixels SPXn may include semiconductor layers of a same material or a similar material to emit light of a same color.

The light emitting elements ED may be in contact with the connection electrodes CNE; CNE1 and CNE2, and thus may be electrically connected to the conductive layers below the electrode RME and the via layer VIA, and may emit light of a specific wavelength band as an electrical signal is applied thereto.

The second insulating layer PAS2 may be disposed on the light emitting elements ED, the first insulating layer PAS1 and the bank layer BNL. The second insulating layer PAS2 may include pattern portions extended in the first direction DR1 between the walls BP1 and BP2 and disposed on the light emitting elements ED. The pattern portions may be disposed to partially surround an outer surface of the light emitting element ED, and may not cover both sides or both ends of the light emitting element ED. The pattern portions may form a linear or island shaped pattern within each subpixel SPXn on a plan view. The pattern portions of the second insulating layer PAS2 may protect the light emitting elements ED and at the same time fix the light emitting elements ED in the fabricating process of the display device 10. The second insulating layer PAS2 may be disposed to fill a space between the light emitting element ED and the second insulating layer PAS2 below the light emitting element ED. A portion of the second insulating layer PAS2 may be disposed on the upper portion of the bank layer BNL and in the sub-areas SA.

The connection electrodes CNE; CNE1 and CNE2 may be disposed on the electrodes RME and the walls BP1 and BP2. The first connection electrode CNE1 may be disposed on the first electrode RME1 and the first wall BP1. The first connection electrode CNE1 may be disposed from the light emission area EMA to the sub-area SA beyond the bank layer BNL while partially overlapping the first electrode RME1. The second connection electrode CNE2 may be disposed on the second electrode RME2 and the second wall BP2. The second connection electrode CNE2 may be disposed from the light emission area EMA to the sub-area SA beyond the bank layer BNL while partially overlapping the second electrode RME2.

The first connection electrode CNE1 and the second connection electrode CNE2 may be in contact with the light emitting elements ED, respectively. The first connection electrode CNE1 may be in contact with one end or an end of the light emitting elements ED while partially overlapping the first electrode RME1. The second connection electrode CNE2 may be in contact with the other end of the light emitting elements ED while partially overlapping the second electrode RME2. The connection electrodes CNE are disposed over the light emission area EMA and the sub-area SA. The connection electrodes CNE may be in contact with the light emitting elements ED in a portion disposed in the light emission area EMA, and may be electrically connected to the third conductive layer in a portion disposed in the sub-area SA. The first connection electrode CNE1 may be in contact with a first end of the light emitting elements ED, and the second connection electrode CNE2 may be in contact with a second end of the light emitting elements ED.

In the display device 10, the respective connection electrodes CNE may be in contact with the electrodes RME through the contact portions CT1 and CT2 disposed in the sub-area SA. The first connection electrode CNE1 may be in contact with the first electrode RME1 through the first contact portion CT1, which passes through the first insulating layer PAS1, the second insulating layer PAS2 and the third insulating layer PAS3, in the sub-area SA. The second connection electrode CNE2 may be in contact with the second electrode RME2 through the second contact portion CT2, which passes through the first insulating layer PAS1 and the second insulating layer PAS2, in the sub-area SA. Each of the connection electrodes CNE may be electrically connected to the third conductive layer through each electrode RME. The first connection electrode CNE1 may be electrically connected to the first transistor T1 so that the first power voltage may be applied thereto, and the second connection electrode CNE2 may be electrically connected to the second voltage line VL2 so that the second power voltage may be applied thereto. Each of the connection electrodes CNE may be in contact with the light emitting element ED in the light emission area EMA to transfer the power voltage to the light emitting element ED, but is not limited thereto.

In an embodiment, the connection electrodes CNE may be directly in contact with the third conductive layer, and may be electrically connected to the third conductive layer through other patterns not the electrode RME.

The connection electrode CNE may include a conductive material. For example, the connection electrode CNE may include ITO, IZO, ITZO, aluminum (Al), for example. For example, the connection electrode CNE may include a transparent conductive material, and the light emitted from the light emitting element ED may be output by transmitting the connection electrode CNE. o The third insulating layer PAS3 is disposed on the second connection electrode CNE2 and the second insulating layer PAS2. The third insulating layer PAS3 may be entirely disposed on the second insulating layer PAS2 to cover the second connection electrode CNE2, and the first connection electrode CNE1 may be disposed on the third insulating layer PAS3. The third insulating layer PAS3 may be entirely disposed on the via layer VIA except the area in which the second connection electrode CNE2 is disposed. The third insulating layer PAS3 may mutually insulate the first connection electrode CNE1 and the second connection electrode CNE2 from each other so that the first and second connection electrodes CNE1 and CNE2 may not be directly in contact with each other.

Although not shown, another insulating layer may be further disposed on the third insulating layer PAS3 and the first connection electrode CNE1. The insulating layer may serve to protect the members disposed on the first substrate SUB against an external environment.

Each of the first insulating layer PAS1, the second insulating layer PAS2 and the third insulating layer PAS3 may include an inorganic insulating material or an organic insulating material. For example, each of the first insulating layer PAS1, the second insulating layer PAS2 and the third insulating layer PAS3 may include an inorganic insulating material, or the first insulating layer PAS1 and the third insulating layer PAS3 may include an inorganic insulating material but the second insulating layer PAS2 may include an organic insulating material. Each or at least one of the first insulating layer PAS1, the second insulating layer PAS2 or the third insulating layer PAS3 may be formed in a structure in which insulating layers are alternately or repeatedly stacked each other. In an embodiment, each of the first insulating layer PAS1, the second insulating layer PAS2 and the third insulating layer PAS3 may be any one of silicon oxide ($SiO_x$), silicon nitride ($SiN_x$) and silicon oxynitride ($SiO_xN_y$). The first insulating layer PAS1, the second insulating layer PAS2 and the third insulating layer PAS3 may be made of a same material or a similar material, or a portion of the first insulating layer PAS1, the second insulating layer PAS2 and the third insulating layer PAS3 may be made of a same material or a similar material and the other portion thereof may be made of different materials, or all of the first insulating layer PAS1, the second insulating layer PAS2 and the third insulating layer PAS3 may be made of their respective materials different from one another.

Figure 8:
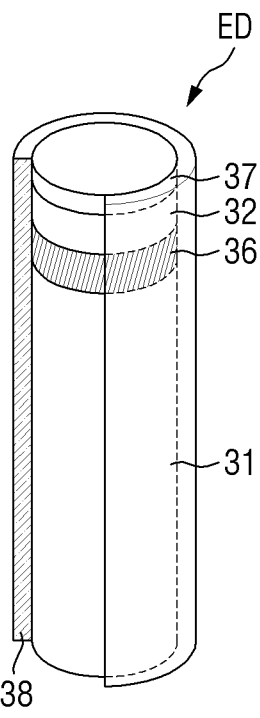
FIG. 8 is a schematic view illustrating a light emitting element according to one embodiment.
Figure 9:
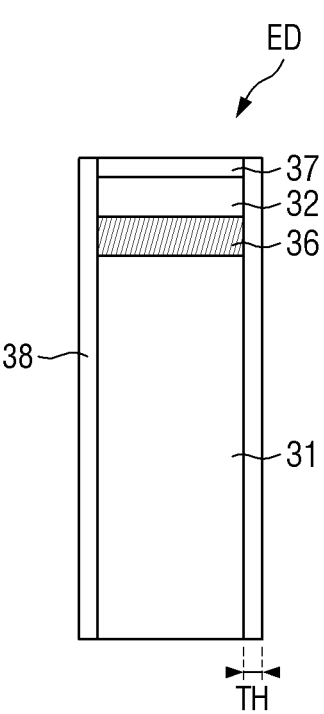
FIG. 9 is a schematic cross-sectional view illustrating a light emitting element of FIG. 8.

FIG. 8 is a schematic view illustrating a light emitting element according to one embodiment.

Referring to FIG. 8, the light emitting element ED may be a light emitting diode, and for example, the light emitting element ED may be an inorganic light emitting diode made of an inorganic material with a size of a nano-meter to a micro-meter. The light emitting element ED may be aligned between two electrodes having polarities that are formed in case that an electric field is formed in a given direction between the two electrodes facing each other.

The light emitting element ED according to one embodiment may have a shape extended in one direction or in a direction. The light emitting element ED may have a cylindrical shape, a rod shape, a wire shape or a tube shape, but is not limited thereto. The light emitting element ED may have a polygonal pillar shape such as a cube, a cuboid and a hexagonal pillar, or may have various shapes such as a shape extended in one direction or in a direction, having an outer surface that is partially inclined.

The light emitting element ED may include a semiconductor layer doped with any conductivity type (for example, p-type or n-type) dopant. The semiconductor layer may emit light of a specific wavelength band as an electrical signal applied from an external power source is transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN, which are doped with n-type dopants. The n-type dopants doped in the first semiconductor layer 31 may be Si, Ge, Sn, Se, for example.

The second semiconductor layer 32 is disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN, which are doped with p-type dopants. The p-type dopants doped in the second semiconductor layer 32 may be Mg, Zn, Ca, Ba, for example.

The first semiconductor layer 31 and the second semiconductor layer 32 are shown as being formed of a single layer, but are not limited thereto. The first semiconductor layer 31 and the second semiconductor layer 32 may further include a larger number of layers, such as a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN and InN, which are doped with n-type dopants. The semiconductor layer disposed between the second semiconductor layer 32 and the light emitting layer 36 may be any one or more of AlGaInN, GaN, AlGaN, InGaN, AlN and InN, which are doped with p-type dopants.

The light emitting layer 36 is disposed between the first semiconductor layer 31 and the second semiconductor layer 32. The light emitting layer 36 may include a material of a single or multiple quantum well structure. In case that the light emitting layer 36 may include a material of a multiple quantum well structure, quantum layers and well layers may be alternately stacked each other. The light emitting layer 36 may emit light by combination of electron-hole pairs in accordance with electrical signals applied through the first semiconductor layer 31 and the second semiconductor layer 32. The light emitting layer 36 may include a material such as AlGaN, AlGaInN and InGaN. In case that the light emitting layer 36 has a stacked structure of quantum layers and well layers, which may be alternately stacked each other in a multiple quantum well structure, the quantum layer may include a material such as AlGaN or AlGaInN, and the well layer may include a material such as GaN or AlInN.

The light emitting layer 36 may have a structure in which a semiconductor material having a big band gap energy and semiconductor materials having a small band gap energy may be alternately stacked each other, and may include group-III or group-V semiconductor materials depending on a wavelength band of light that is emitted. The light emitting layer 36 may emit light of a red or green wavelength band, as the case may be, without limitation to light of a blue wavelength band.

The electrode layer 37 may be an ohmic connection electrode, but is not limited thereto. The electrode layer 37 may be a Schottky connection electrode. The light emitting element ED may include at least one electrode layer 37. The light emitting element ED may include one or more electrode layers 37, but is not limited thereto. The electrode layer 37 may be omitted.

The electrode layer 37 may reduce resistance between the light emitting element ED and an electrode or a connection electrode in case that the light emitting element ED is electrically connected with the electrode or the connection electrode in the display device 10. The electrode layer 37 may include a metal having conductivity. For example, the electrode layer 37 may include at least one of Al, Ti, In, Au, Ag, ITO, IZO or ITZO.

The insulating layer 38 is disposed to surround outer surfaces of the semiconductor layers and electrode layers.

For example, the insulating layer 38 may be disposed to surround at least an outer surface of the light emitting layer 36, and may be formed to expose both ends in a longitudinal direction of the light emitting element ED. Also, the insulating layer 38 may be formed with a rounded upper surface on a section in an area adjacent to at least one end of the light emitting element ED.

The insulating layer 38 may include materials having insulation property, for example, at least one of silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$) or titanium oxide (TiO$_x$). The insulating layer 38 is illustrated as being formed of a single layer, but is not limited thereto. In an embodiment, the insulating layer 38 may be formed of a multi-layered structure in which multiple layers may be stacked each other.

The insulating layer 38 may serve to protect the semiconductor layers and the electrode layer of the light emitting element ED. The insulating layer 38 may prevent an electrical short from occurring, which may occur in the light emitting layer 36 in case that the light emitting element ED is directly in contact with the electrode to which the electrical signal is transferred. The insulating layer 38 may prevent light emitting efficiency of the light emitting element ED from being deteriorated.

Also, an outer surface of the insulating layer 38 may be surface-treated. The light emitting element ED may be aligned by being sprayed onto the electrode in a state that it is dispersed in an ink. The surface of the insulating layer 38 may be hydrophobic-treated or hydrophilic-treated, so that the light emitting element ED may be maintained to be dispersed in the ink without being condensed with another light emitting element ED adjacent thereto.

The light emitting element ED may have a relatively small diameter and a relatively small size, and as the size of the light emitting element ED is small, its external quantum efficiency EQE may be smaller than that of another inorganic light emitting diode. A surface defect that may be formed in the semiconductor layers 31 and 32 and the light emitting layer 36 during the fabricating process of the light emitting element ED may be also a factor that lowers external quantum efficiency.

As described below, the light emitting element ED may be grown on a growth substrate through Epitaxial growth. In an embodiment, the semiconductor layers 31 and 32, the light emitting layer 36 and the electrode layer 37 of the light emitting element ED may be formed as the semiconductor material layers made of a same material or a similar material as that of each of the above layers of the light emitting element ED and sequentially stacked each other are etched in a direction in which the semiconductor material layers are stacked each other along the mask pattern, for example, in a vertical direction of the growth substrate. In the etching process of the semiconductor material layers, defects may occur on surfaces exposed by etching of the semiconductor layers 31 and 32 and the light emitting layer 36. In the light emitting element ED having a small size, the defects occurring in the semiconductor layers 31 and 32 and the light emitting layer 36 may greatly affect external quantum efficiency of the light emitting element ED.

The defects in the semiconductor layers 31 and 32 and the light emitting layer 36 of the light emitting element ED may affect electrical characteristics and optical characteristics of the light emitting element ED, and consequently may affect light emitting efficiency of the display device 10. In case that the defects formed on the surfaces of the semiconductor layers 31 and 32 and the light emitting layer 36 may be reduced or controlled, the electrical and optical characteristics of the light emitting element ED may be improved, and light emitting efficiency of the display device 10 may be also improved.

In the light emitting element ED according to one embodiment, the insulating layer 38 surrounding the surfaces of the semiconductor layers 31 and 32 and the light emitting layer 36 may be formed through a sol-gel process, and the defects that may be formed on the surfaces of the semiconductor layers 31 and 32 and the light emitting layer 36 may be reduced or minimized.

Many defects, such as defects due to dangling bonds and strain relief or damage caused by an etching process, may occur on the surfaces exposed by the etching process of the semiconductor material layers. Defects generated in the semiconductor layers of the light emitting element ED may be factors that reduce external quantum efficiency of the light emitting element ED, and the insulating layer 38 surrounding the semiconductor layers may reduce or cure damage due to defects to minimize reduction of external quantum efficiency. The process of forming the insulating layer 38 is a chemical process that involves a thermal process and a plasma process, and may be performed by a process such as chemical vapor deposition (CVD) or atomic layer deposition (ALD). However, as the above-described processes are performed in the process of forming the insulating layer 38, the surface of the semiconductor layer is exposed to an environment vulnerable to defects, and a defect mitigation effect caused by the formation of the insulating layer 38 may be reduced.

The insulating layer 38 of the light emitting element ED according to one embodiment may be formed through a sol-gel process that does not include a thermal process and a plasma process unlike a chemical vapor deposition (CVD) method or an atomic layer deposition (ALD) method. Since the insulating layer 38 of the light emitting element ED is formed through the sol-gel process, the insulating layer 38 may be formed while being adsorbed on the surfaces of the semiconductor layers 31 and 32 and the light emitting layer 36 without an inter-atom bonding reaction unlike other chemical deposition processes. Therefore, defects and dangling bond, which may be generated on the surfaces of the semiconductor layers 31 and 32 and the light emitting layer 36 of the light emitting element ED may be minimized. The light emitting element ED may have improved optical characteristics, high external quantum efficiency, and low leakage current less than a threshold voltage. In one embodiment, the light emitting element ED may have external quantum efficiency having a value of 20.2±0.6%.

In an embodiment, the insulating layer 38 of the light emitting element ED may have a thickness TH ranging from about 23 nm to about 80 nm. The thickness TH of the insulating layer 38 may vary depending on process conditions of the sol-gel process, and may be at least about 23 nm. In case that the insulating layer 38 of the light emitting element ED has a thickness of about 23 nm or less, the effect of protecting the light emitting element ED and improving optical characteristics may be reduced. In case that the insulating layer 38 of the light emitting element ED has a thickness of about 80 nm or more, a diameter of the light emitting element ED is too increased, whereby the light emitting element ED may not be readily applied to the display device 10. As the thickness of the insulating layer 38 is increased, external quantum efficiency and electrical characteristics of the light emitting element ED may be further improved. For example, one or more insulating layers 38 may be stacked each other in the light emitting element ED.

Figure 10:
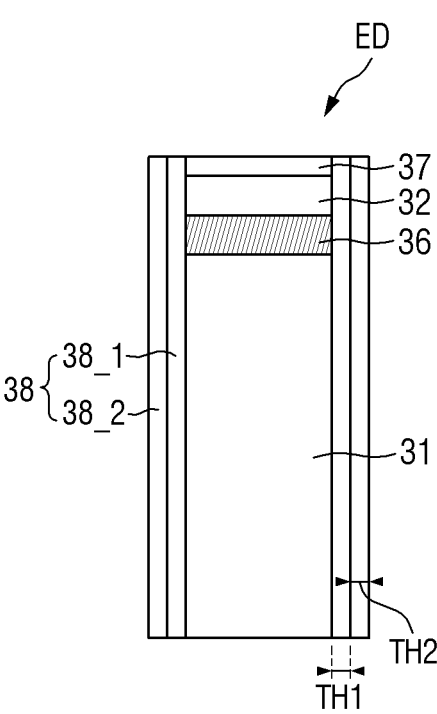
FIG. 10 is a schematic cross-sectional view illustrating a light emitting element according to an embodiment.

FIG. 10 is a schematic cross-sectional view illustrating a light emitting element according to an embodiment.

Referring to FIG. 10, the insulating layer 38 of the light emitting element ED may include a first layer 38_1 and a second layer 382. The first layer 381 may be a layer that is directly in contact with the semiconductor layers 31 and 32 and the light emitting layer 36 of the light emitting element ED, and the second layer 38_2 may be a layer surrounding the first layer 381.

The first layer 38_1 and the second layer 382 may be respectively formed by the sol-gel process, and may be made of a same material or a similar material or different materials. For example, each of the first layer 381 and the second layer 38_2 may include any one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$) and titanium oxide ($TiO_x$). By way of example, in case that the first layer 381 may include any one of the above materials, the second layer 38_2 may include a material different from that of the first layer 381.

In an embodiment in which the first layer 38_1 and the second layer 38_2 include a same material or a similar material, the first layer 38_1 and the second layer 382 may be formed by repetition of the sol-gel process with a solution containing the same precursor material. Thicknesses TH1 and TH2 of the first layer 38_1 and the second layer 382 may be the same as or different from each other. For example, in case that the first layer 38_1 and the second layer 38_2 have the same process time of the sol-gel process and the same content of the precursor material, the first thickness TH1 of the first layer 38_1 and the second thickness TH2 of the second layer 38_2 may be the same as each other. On the other hand, in case that the process time of the sol-gel process and the content of the precursor material of the first layer 38_1 are different from those of the second layer 38_2, the first thickness TH1 of the first layer 38_1 and the second thickness TH2 of the second layer 382 may be different from each other.

In an embodiment in which the first layer 38_1 and the second layer 382 include their respective materials different from each other, the first layer 38_1 and the second layer 38_2 may be formed by repeatedly performing a sol-gel process with a solution containing different precursor materials. In case that the first layer 381 and the second layer 38_2 have the same process time of the sol-gel process and the same content of the precursor material, the first thickness TH1 of the first layer 38_1 and the second thickness TH2 of the second layer 38_2 may be the same as each other. On the other hand, in case that the process time of the sol-gel process and the content of the precursor material of the first layer 381 are different from those of the second layer 38_2, the first thickness TH1 of the first layer 38_1 and the second thickness TH2 of the second layer 38_2 may be different from each other.

In an embodiment, the first layer 38_1 and the second layer 382 of the insulating layer 38 of the light emitting element ED may include a same material or a similar material, and the first thickness TH1 and the second thickness TH2 may be the same as each other. By way of example, in an embodiment, the first layer 38_1 and the second layer 38_2 of the insulating layer of the light emitting element ED may include their respective materials different from each other, and the first thickness TH1 may be greater than the second thickness TH2, but the disclosure is not limited thereto.

Hereinafter, a method for fabricating a light emitting element according to one embodiment will be described.

FIGS. 11 to 20 are schematic cross-sectional views sequentially illustrating a fabricating process of a light emitting element according to one embodiment. In FIGS. 11 to 20, fabricating processes of the light emitting elements ED are sequentially illustrated.

Figure 11:
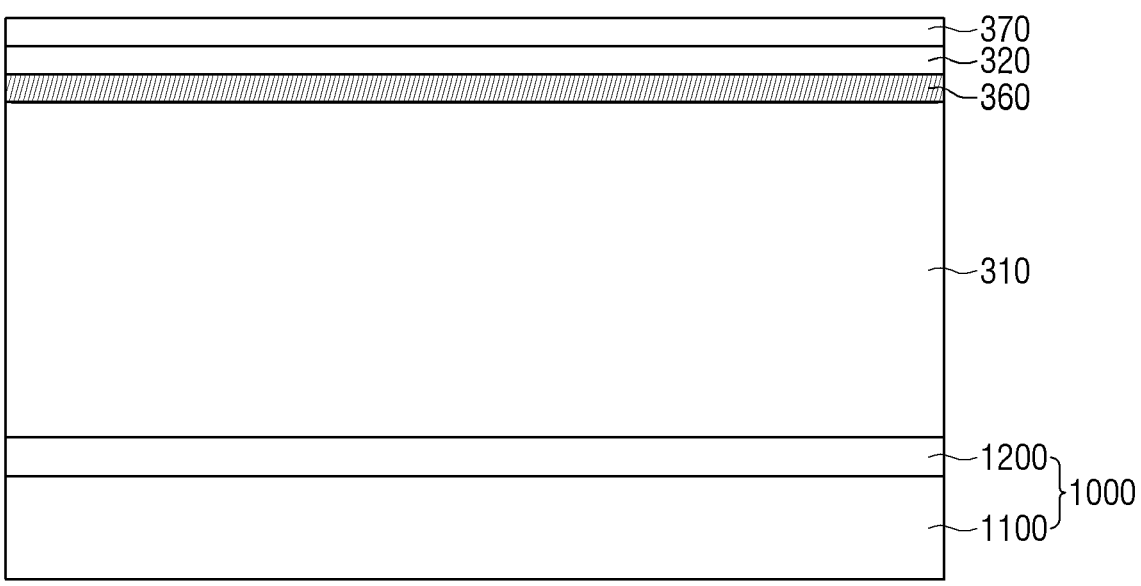
FIGS. 11 to 20 are schematic cross-sectional views sequentially illustrating a fabricating process of a light emitting element according to one embodiment.

Referring to FIG. 11, a base substrate 1000 is prepared, and a first semiconductor material layer 310, a light emitting material layer 360, a second semiconductor material layer 320 and an electrode material layer 370 are sequentially formed on the base substrate 1000.

The base substrate 1000 may include a lower substrate 1100 and a buffer material layer 1200 disposed on the lower substrate 1100. The lower substrate 1100 may include a sapphire substrate ($Al_2O_3$) and a transparent substrate such as glass, but is not limited thereto. The lower substrate 1100 may be made of a conductive substrate such as GaN, SiC, ZnO, Si, GaP and GaAs. A thickness of the lower substrate 1100 is not particularly limited, but the lower substrate 1100 may have a thickness ranging from about 400 μm to about 1500 μm, for example.

The buffer material layer 1200 may be disposed to reduce a difference in lattice constants between the first semiconductor material layer 310 formed thereon and the lower substrate 1100.

The buffer material layer 1200 may include an undoped semiconductor. The buffer material layer 1200 may include substantially a same material or a similar material as that of the first semiconductor material layer 310, but may include a material that is not doped with n-type or p-type or its doping concentration may be smaller than that of the first semiconductor material layer 310. In an embodiment, the buffer material layer 1200 may be at least one of, InAlGaN, GaN, AlGaN, InGaN, AlN or InN but is not limited thereto.

Semiconductor material layers may be formed on the base substrate 1000. The semiconductor material layers grown by an Epitaxial method may be formed by growing a seed crystal. The method of forming the semiconductor material layer may be an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition (MOCVD) method, for example, may be formed by a metal-organic chemical vapor deposition (MOCVD) method, but is not limited thereto.

The precursor material for forming the semiconductor material layer is not particularly limited within the range that may be typically selected to form a target material. For example, the precursor material may include a metal precursor that may include an alkyl group such as a methyl group or an ethyl group. For example, like the light emitting element ED according to one embodiment, in an embodiment in which the first semiconductor layer 31, the second semiconductor layer 32 and the light emitting layer 36 include any one of AlGaInN, GaN, AlGaN, InGaN, AlN and InN, the metal precursor may be trimethyl gallium ($Ga(CH_3)_3$), or may be a compound such as trimethyl aluminum ($Al(CH_3)_3$) and triethyl phosphate ($(C_2H_5)_3PO_4$), but is not limited thereto. The semiconductor material layers may be formed through a deposition process using the metal precursor and a non-metal precursor. Hereinafter, a method or process conditions for forming semiconductor material layers will be omitted, and a flowchart or a stacked structure of a method for fabricating a light emitting element ED will be described in detail.

The first semiconductor material layer 310, the light emitting material layer 360, the second semiconductor material layer 320 and the electrode material layer 370 may be formed on the base substrate 1000. The material layers disposed on the base substrate 1000 may respectively correspond to the semiconductor layers 31 and 32, the light emitting layer 36 and the electrode layer 37 of the light emitting element ED. For example, the first semiconductor material layer 310 may correspond to the first semiconductor layer 31, and the light emitting material layer 360 and the second semiconductor material layer 320 may correspond to the light emitting layer 36 and the second semiconductor layer 32, respectively. For example, the above material layers may include a same material or a similar material as that of each of the semiconductor layers 31 and 32 and the light emitting layer 36 of the light emitting element ED.

Referring to FIGS. 12 to 16, the semiconductor material layers 310 and 320, the light emitting material layer 360 and the electrode material layer 370 are etched to form semiconductor rods spaced apart from each other. According to one embodiment, the step of etching the semiconductor material layers 310 and 320, the light emitting material layer 360 and the electrode material layer 370 may include a step (first etching) of forming a mask layer on the electrode material layer 370 and etching processes (second etching and third etching) for etching the semiconductor material layers 310 and 320 along the mask layer.

Figure 12:
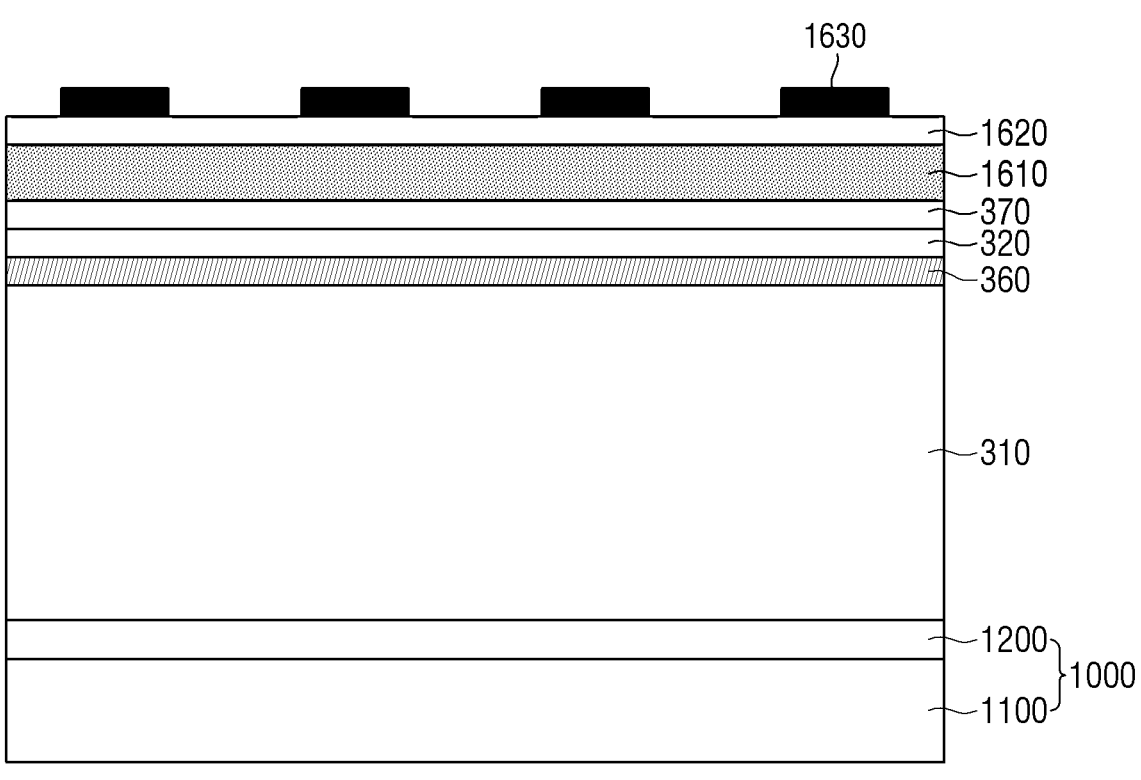

As shown in FIG. 12, mask layers, collectively, 1600 including 1610, 1620 and 1630 are formed on the electrode material layer 370. The mask layers 1610, 1620 and 1630 may include a first insulating mask layer 1610 and a second insulating mask layer 1620, which are disposed on the electrode material layer 370, and mask patterns 1630 disposed on the second insulating mask layer 1620. The first insulating mask layer 1610 and the second insulating mask layer 1620 may have a shape etched along a space in which the mask patterns 1630 are spaced apart from each other in a subsequent process. The semiconductor material layers 310, 320, 360 and 370 may be etched along the insulating mask layers 1610 and 1620 and the space in which the mask patterns 1630 are spaced apart from each other. In an embodiment, the mask patterns 1630 may have a same diameter or width. A portion of the semiconductor material layers 310 and 320, which is not etched by overlap with a portion where the mask patterns 1630 are disposed may form a semiconductor rod constituting the light emitting element ED. The diameter of the mask pattern 1630 may be substantially the same as that of the light emitting element ED. As the mask patterns 1630 have a same diameter or width, the light emitting elements ED may also have substantially the same diameter.

The first insulating mask layer 1610 and the second insulating mask layer 1620 include an insulating material, and the mask pattern 1630 may include a metal material. For example, the insulating mask layers 1610 and 1620 may be silicon oxide ($SiO_x$), silicon nitride ($SiN_x$), silicon oxynitride ($SiO_xN_y$) and the like, respectively. The mask pattern 1630 may include a metal such as chromium (Cr), but is not limited thereto.

Figure 13:
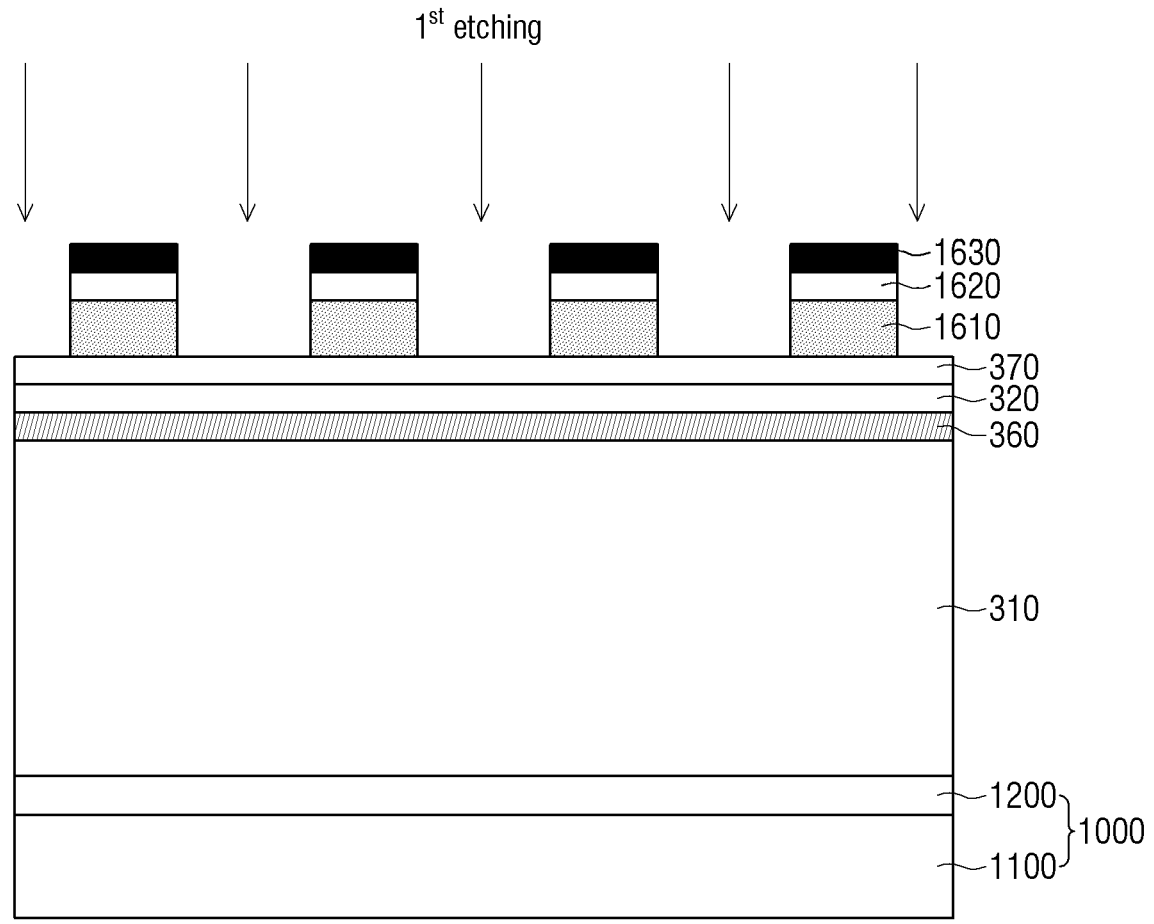
Figure 14:
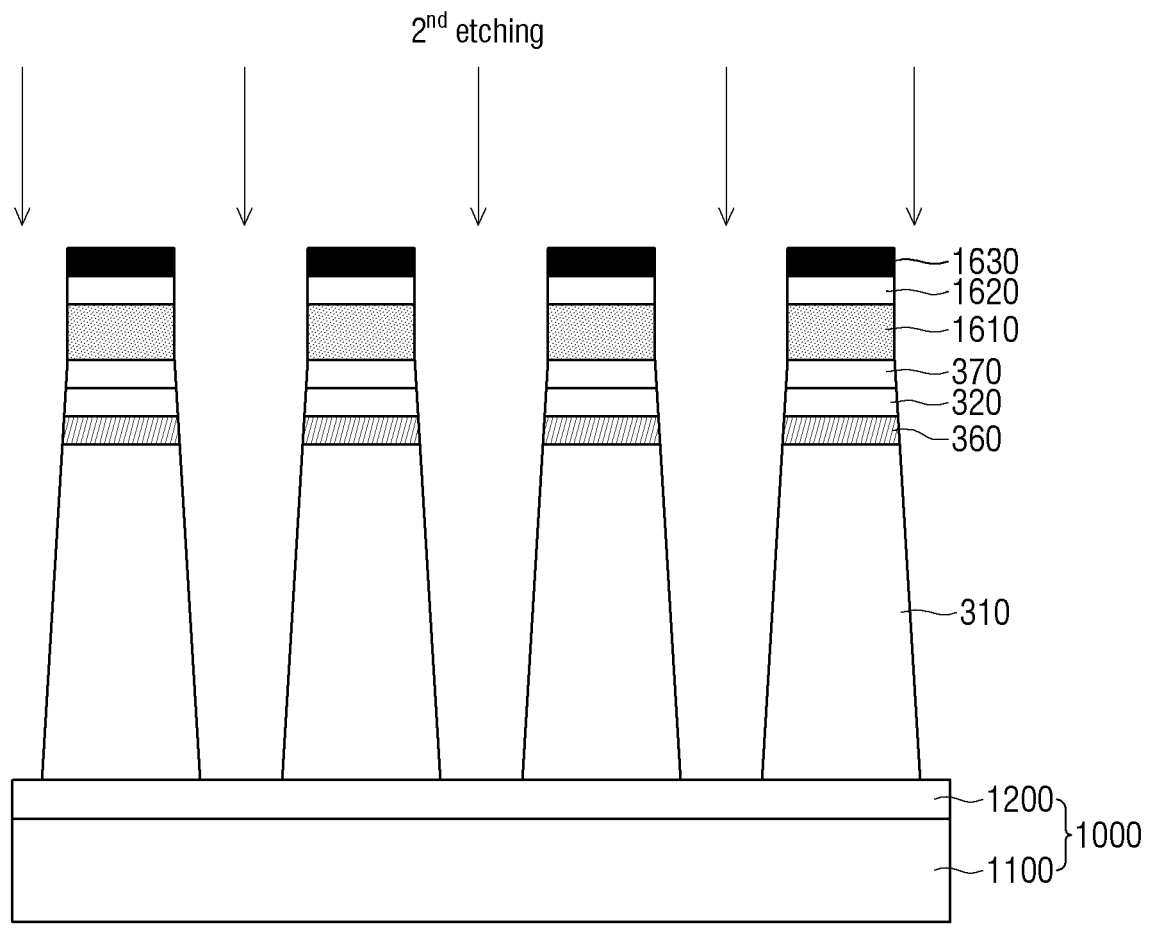
Figure 15:
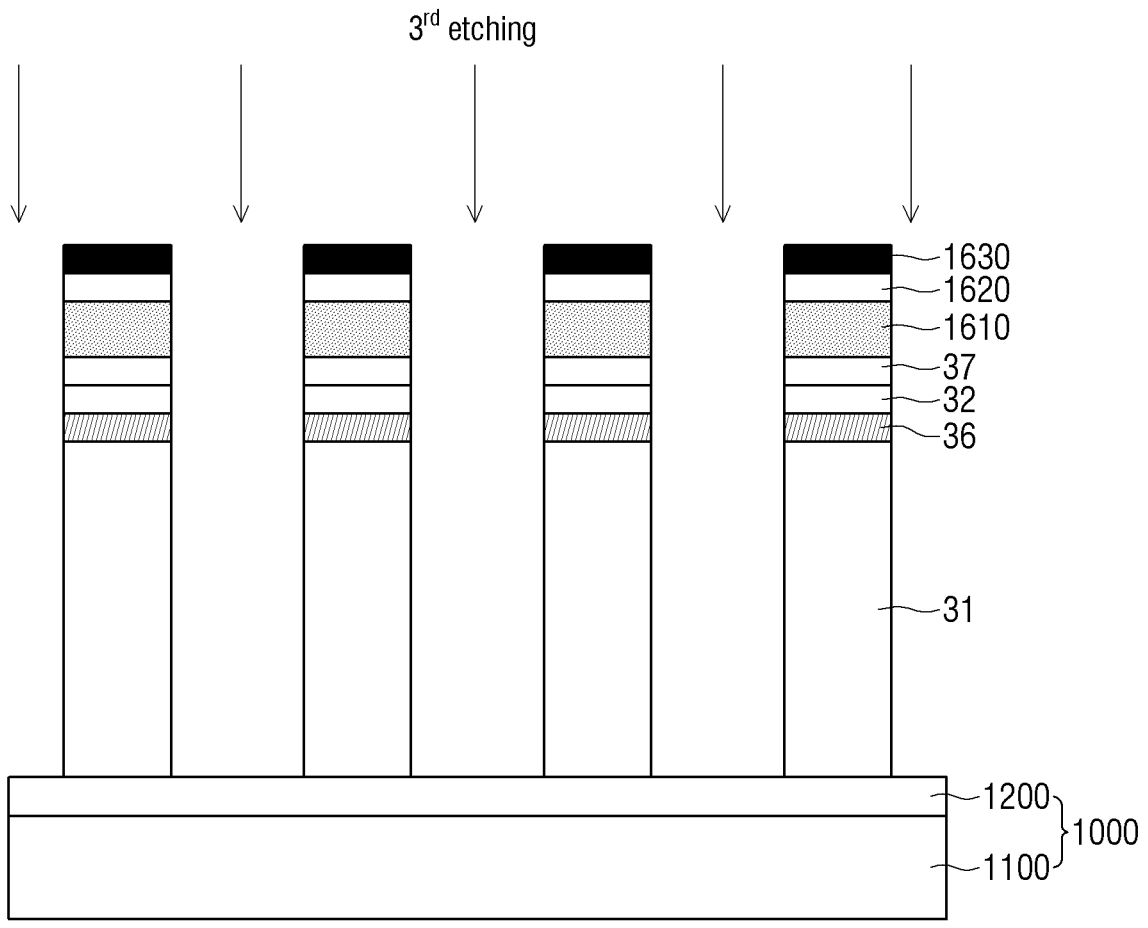
Figure 16:
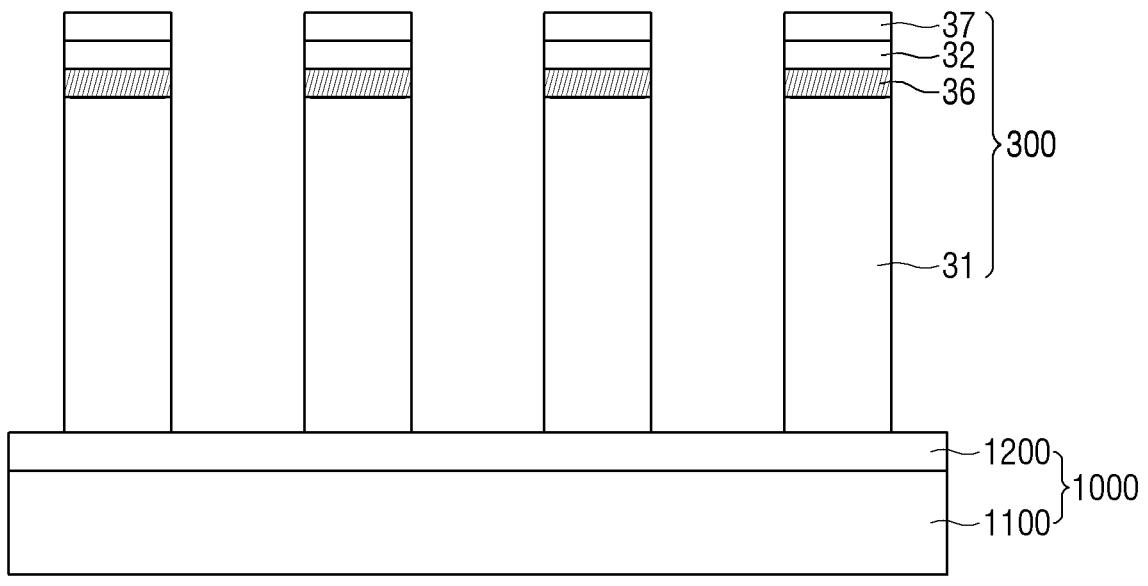

As shown in FIGS. 13 to 15, the first etching process etching for etching the insulating mask layers 1610 and 1620 along the mask pattern 1630 and the second and third etching processes for etching the semiconductor material layers 310 and 320 along the etched insulating mask layers 1610 and 1620 are performed. Each of the etching processes may be performed in a direction perpendicular to an upper surface of the base substrate 1000.

The etching process may be a dry etching method, a wet etching method, a reactive ion etching (RIE) method, an inductively coupled plasma reactive ion etching (ICP-RIE) method or the like within the spirit and the scope of the disclosure. In case of the dry etching method, anisotropic etching may be performed to be suitable for vertical etching. In case that the etching method of the above-described methods is used, an etchant may be $CL_2$ or $O_2$, but is not limited thereto.

The first etching process may be performed by a process of etching the insulating mask layers 1610 and 1620 exposed to the area in which the mask patterns 1630 are spaced apart from each other. The insulating mask layers 1610 and 1620 may be formed in a shape etched along the mask pattern 1630, and may serve as masks for etching the semiconductor material layers therebelow.

The semiconductor material layers are etched using the mask pattern 1630 and the etched insulating mask layers 1610 and 1620 as masks. The process of etching the semiconductor material layers may include a second etching process performed by a dry etching process and a third etching process which is a wet etching process performed after the second etching process.

In the second etching process, the semiconductor material layers may be etched in a direction perpendicular to the upper surface of the base substrate 1000 to form semiconductor rods spaced apart from each other. However, in this etching process, sides of the semiconductor rods may have an inclined shape without being perpendicular to the upper surface of the base substrate 1000. The third etching process may be performed such that the sides of the semiconductor rods are formed to be perpendicular to the base substrate 1000. The second etching process and the third etching process may be performed by a dry etching process and a wet etching process, respectively, and the semiconductor rods spaced apart from each other may be formed on the base substrate 1000 by these etching processes. Each of the semiconductor rods may include a first semiconductor material layer 310, a light emitting material layer 360, a second semiconductor material layer 320 and an electrode material layer 370.

However, as described above, the sides or surfaces of the semiconductor rods formed by the etching process may be damaged. Due to the surface damage, abnormal recombination of the light emitting elements ED may occur in the semiconductor layer, and light efficiency and electrical characteristics of the light emitting element ED may be deteriorated. To minimize such performance degradation, the light emitting element ED may include an insulating layer 38 surrounding at least sides of the semiconductor layers 31, 32, 36 and 37. For example, the light emitting element ED according to one embodiment may include an insulating layer 38 formed by a sol-gel process.

Figure 17:
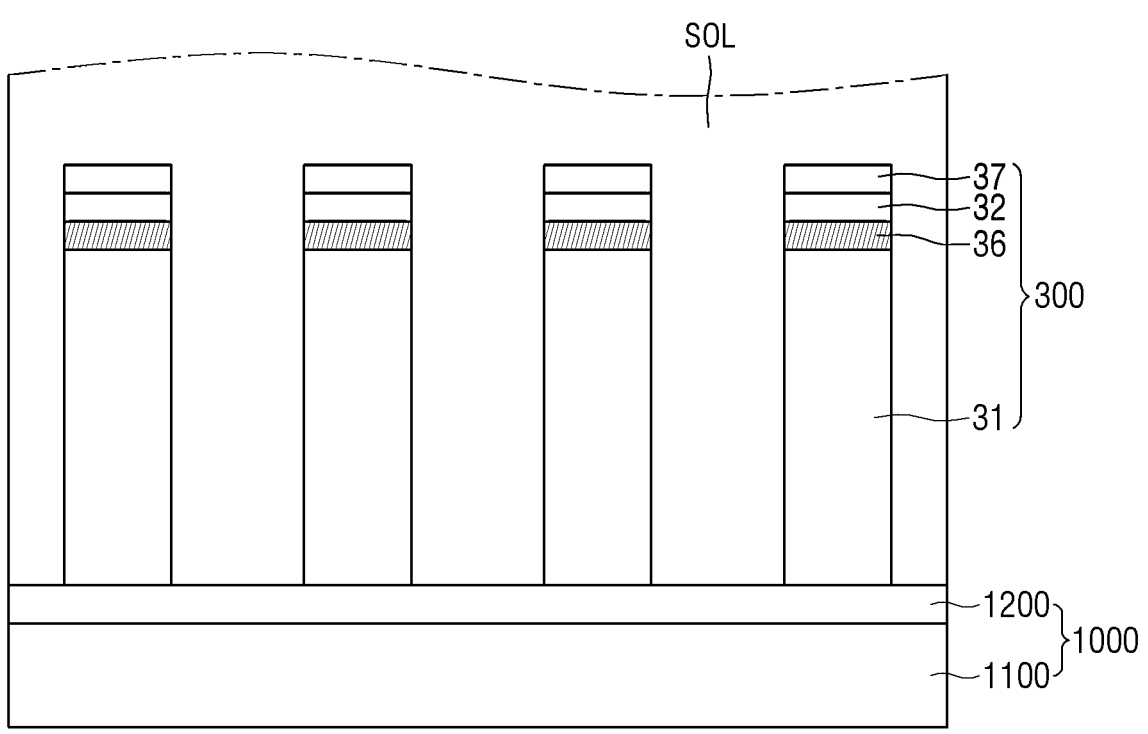
Figure 18:
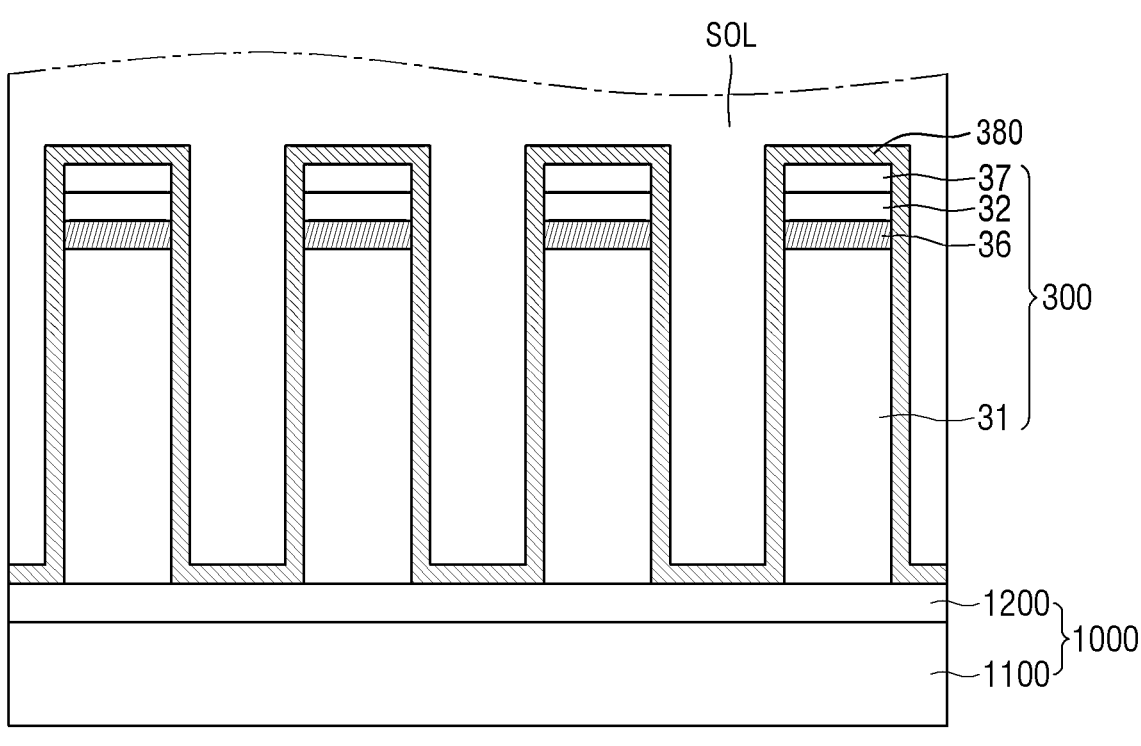
Figure 19:
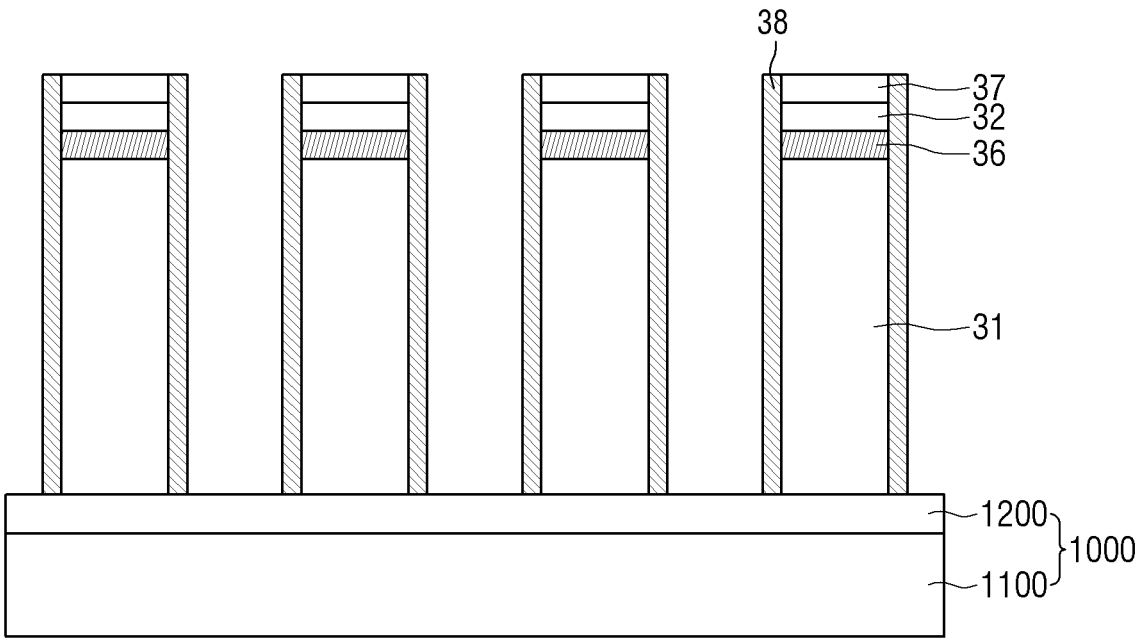

Referring to FIGS. 17 and 18, an insulating layer 38 partially surrounding sides of a semiconductor rod 300 is formed. The process of forming the insulating layer 38 may be formed by forming an insulating material layer 380 to surround an outer surface of the semiconductor rod and partially removing the insulating material layer 380 to expose the upper surface of the semiconductor rod.

The insulating layer 38 is an insulating layer formed on the outer surface of the semiconductor rod, and may be formed by using a method for coating or immersing an insulating material on the outer surface of the semiconductor rod that is vertically etched. According to one embodiment, the insulating layer 38 and/or the insulating material layer 380 may be formed through the sol-gel process.

The sol-gel process may be performed by immersing the semiconductor rods 300 or the semiconductor rod 300 and the base substrate 1000 in a solution SOL containing the precursor material of the material constituting the insulating layer 38 and/or the insulating material layer 380 and further adding other reactants to stir the semiconductor rods 300 and the base substrate 1000. The sol-gel process may not have a relatively severe process condition as compared with other chemical processes such as chemical vapor deposition (CVD) or atomic layer deposition (ALD). For example, the sol-gel process may be performed by immersing the semiconductor rods in the solution SOL containing the precursor material and adding the reactant to the solution SOL to react at a low temperature.

In an embodiment, the sol-gel process may be performed by immersing the semiconductor rods in the solution SOL and stirring the SOL at a temperature range of about 25° C. for 15 minutes to 80 minutes or about 60 minutes. Since the reaction temperature of the sol-gel process is performed at a lower temperature than other deposition processes, damage applied to the semiconductor rod may be small. For example, another deposition process may require a high temperature process or a process of irradiating plasma to completely form the insulating material layer 380, whereas the sol-gel process does not require the above-described process so that the formation of defects in the semiconductor rod may be minimized.

The reaction time of the sol-gel process may vary depending on the content of the precursor material and the reactant, which are contained in the solution SOL, and a thickness of the insulating material layer 380 and/or the insulating layer 38, which are/is formed in the semiconductor rods, may also vary depending on the content of the precursor material and the reactant, which are contained in the solution SOL. The reaction time of the sol-gel process may be the time at which both the precursor material and the reactant in the solution SOL may react. In case that the precursor material fully reacts, the thickness of the insulating material layer 380 and/or the insulating layer 38 may not be increased any longer even though the process time of the sol-gel process is increased. In an embodiment, the sol-gel process may be performed for a time of 60 minutes or less, and the thickness of the insulating material layer 380 and/or the insulating layer 38, which are/is formed by the sol-gel process of one time, may be about 23 nm, but is not limited thereto. In case that the content of the precursor material in the solution SOL is increased, the thickness of the insulating material layer 380 and/or the insulating layer 38 may be about 23 nm or more even though the sol-gel process is performed for 60 minutes. As an example, the sol-gel process may be performed one or more times, and even in this case, the thickness of the insulating material layer 380 and/or the insulating layer 38 may be about 23 nm or more. The characteristics of the light emitting element ED including the insulating material layer 380 and/or the insulating layer 38 formed by the sol-gel process will be described later in conjunction with Fabrication Examples and Experimental Examples.

The insulating material layer 380 formed through the sol-gel process may be also formed on the base substrate 1000 exposed from the sides and upper surface of the semiconductor rod and the area in which the semiconductor rods are spaced apart from each other. In order to partially remove the insulating material layer 380 disposed on the upper surface of the semiconductor rods and in the area in which the semiconductor rods are spaced apart from each other, a process such as a dry etching process or an etch-back process, which is an anisotropic etching process, may be performed. In an embodiment, the upper surface of the insulating material layer 380 may be removed to expose the electrode material layer 370, and in this process, the electrode material layer 370 may be also partially etched. The thickness of the electrode layer 37 of the light emitting element ED, which is finally fabricated, may be smaller than that of the electrode material layer 370 formed during the fabricating process. In case that a portion of the insulating material layer 380 is removed, the insulating layer 38 surrounding the sides of the semiconductor layers may be formed in the light emitting element ED.

The upper surface of the electrode layer 37 is illustrated as being exposed and the upper surface of the insulating layer 38 is illustrated as being flat, but the disclosure is not limited thereto. In an embodiment, the upper surface of the insulating layer 38 may be formed to be partially curved at a portion surrounding the electrode layer 37. In the process of partially removing the insulating material layer 380, the sides of the insulating layer 38 as well as the upper surface of the insulating material layer 380 are partially removed, whereby the insulating layer 38 surrounding the semiconductor layers may be formed in a state that an end surface thereof is partially etched. As the upper surface of the insulating material layer 380 is removed, the outer surface of the insulating layer 38 adjacent to the electrode layer 37 in the light emitting element ED may be partially removed.

Although not shown, in case that the light emitting element ED is formed after the sol-gel process is performed on the base substrate 1000, a process of heat-treating the light emitting elements ED may be further performed. The insulating layers 38 of the light emitting element ED may be in a more stable state through the heat-treatment process. The sol-gel process is performed at a relatively low temperature. In case that the insulating layers 38 thus formed are heat-treated, the insulating layer 38 of the light emitting element ED may be more robust, and optical characteristics of the light emitting element ED may be more excellent as will be described later. In an embodiment, the heat-treatment process may be performed at a temperature of 200° C. to 300° C. or at a temperature of about 250° C. for 30 minutes to 2 hours or for about 1 hour, but is not limited thereto.

Figure 20:
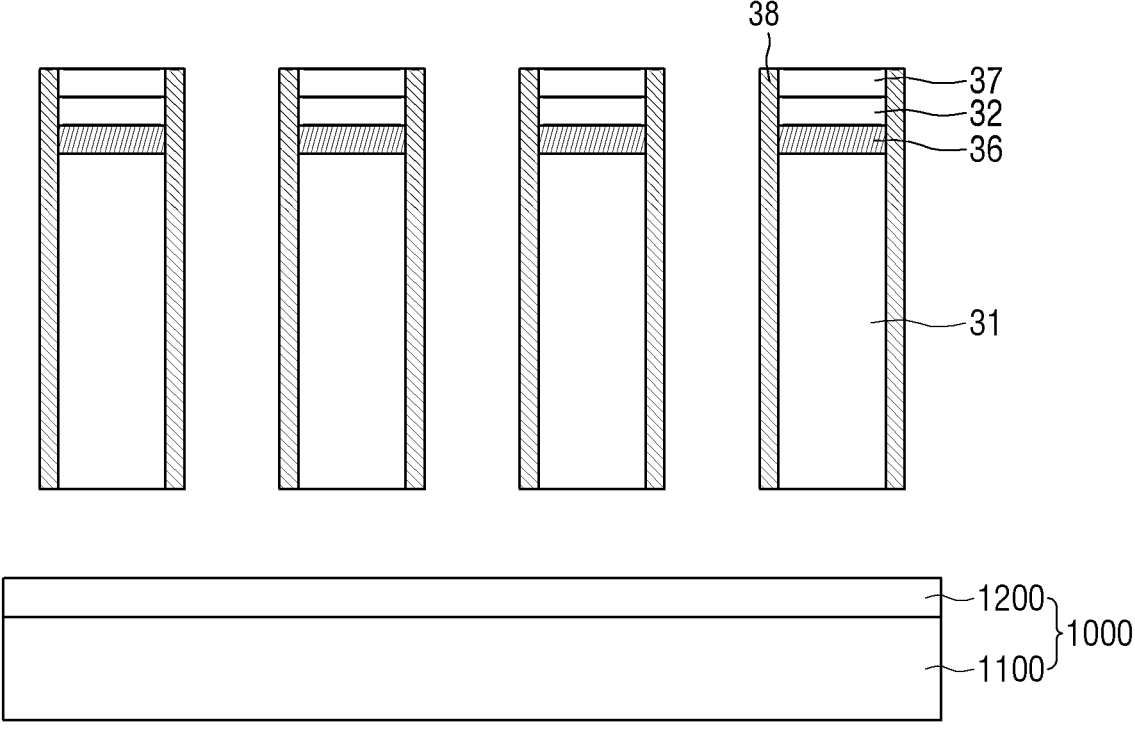

Finally, as shown in FIG. 20, the light emitting element ED in which the insulating layer 38 is formed is separated from the base substrate 1000.

The light emitting element ED, which may include an insulating layer 38 formed by the sol-gel process, may be fabricated through the above processes. Defects may be generated on the surface of the light emitting element ED due to the etching processes (second etching and third etching) of etching the semiconductor material layers. The defects may be reduced by the insulating layer 38 formed through the sol-gel process. Therefore, light efficiency and electrical characteristics may be more excellent than those of the light emitting element ED that may include an insulating layer 38 fabricated through another process method. This will be described later with reference to the following Fabrication Examples and Experimental Examples.

Hereinafter, Experimental examples of light emitting efficiency of the light emitting element ED fabricating in accordance with a fabricating method according to one embodiment will be described.

Experimental Example

Fabrication Example 1. Fabrication of LED
Element Including Insulating Layer Formed by
Sol-Gel Process A light emitting diode (LED) element including an insulating layer made of silicon oxide ($SiO_2$), which was formed by a sol-gel process, was fabricated.

A c-plane sapphire substrate having a size of 4 inches was prepared, and a semiconductor structure was formed by sequentially stacking n-GaN/MQW/p-GaN/ITO layers on the sapphire substrate. As described in the fabricating method of the light emitting element ED, each layer of the semiconductor structure was fabricated through an epitaxial growth method. The MQW layer was formed of multiple layers including InGaN.

A mask pattern having a diameter of about 600 nm was formed on the formed semiconductor structure through a nanoimprint lithography process, and the semiconductor structure was etched in a direction perpendicular to an upper surface of the sapphire substrate along the mask pattern. The semiconductor structure was dry-etched using an inductively coupled plasma reactive ion etching (ICP-RIE) method to form an LED element. Subsequently, a wet etching process using KOH was performed to partially remove damage formed on sides of the exposed LED element.

$SiO_2$ insulating layer and $Al_2O_3$ insulating layer, which surround the sides of the LED element formed on the sapphire substrate, were formed through the sol-gel process. The $SiO_2$ insulating layer was formed on a sidewall of the LED element, and the $Al_2O_3$ insulating layer was formed outside the $SiO_2$ insulating layer.

Ethanol of 210 ml and deionized water of 290 ml were mixed into a flask, and the sapphire substrate in which LED element was formed was immersed in the mixed solution. Cetyltrimethylammonium bromide (CTAB) of 0.8 g was added to the solution to dissolve the solution, whereby Micelle was formed. The mixture in which Micelle was formed was stirred at a temperature of 25° C. with 500 rpm for 5 minutes and an ammonia aqueous solution of 2.5 ml and tetraethyl orthosilicate (TEOS) of 1.25 ml as a precursor were sequentially added to the mixture. The mixture was stirred at 25° C. with 500 rpm for 2 hours, and the sapphire substrate was taken out from the mixture and washed with deionized water and ethanol.

In case that the above-described process was performed once, the $SiO_2$ insulating layer of about 23 nm was formed, and the above-mentioned process was repeated to form $SiO_2$ insulating layer of 60 nm on the side of the LED element. Subsequently, the precursor material was changed in the above process so that $Al_2O_3$ insulating layer of about 20 nm was formed on an outer surface of the $SiO_2$ insulating layer to fabricate the LED element. A diameter of the fabricated LED element was about 580 nm, and its length was measured to be about 4 μm. The LED element fabricated on a wafer substrate was separated from the wafer substrate using a diamond cutter.

Fabrication Example 2. Fabrication of LED
Element Including Insulating Layer Formed by
Plasma ALD Process The LED element was fabricated in a same manner as in the Fabrication Example 1 except that $SiO_2$ insulating layer and $Al_2O_3$ insulating layer were fabricated by a plasma ALD process. The plasma ALD process was performed by a process method as would be appreciated by one of ordinary skill in the art. However, in the same manner as the Fabrication Example 1, the LED element was fabricated to have $SiO_2$ insulating layer of about 60 nm and $Al_2O_3$ insulating layer of about 20 nm.

Evaluation 1. Measurement Experiment of CL
Intensity

Figure 21:
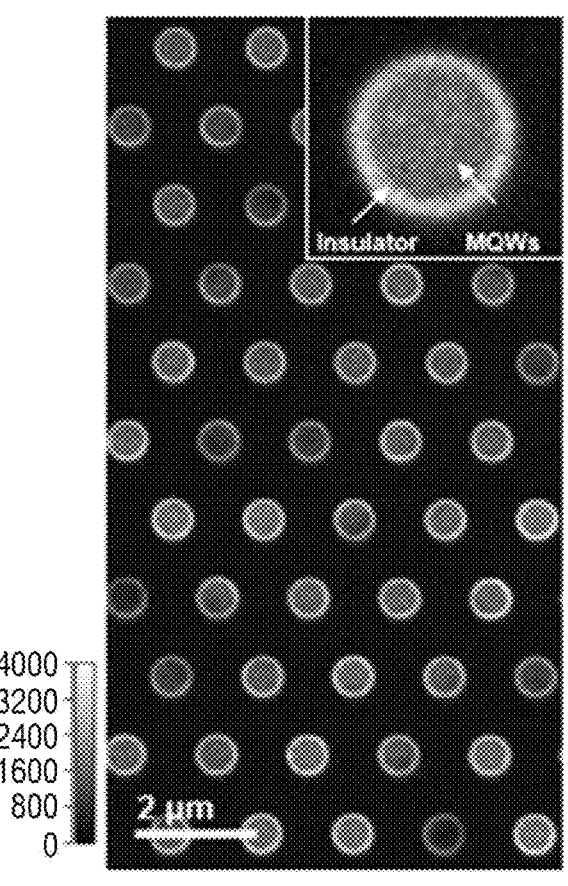
FIGS. 21 and 22 are micrographs showing panchromatic CL evaluation of LED elements of Fabrication Examples 1 and 2.
Figure 22:
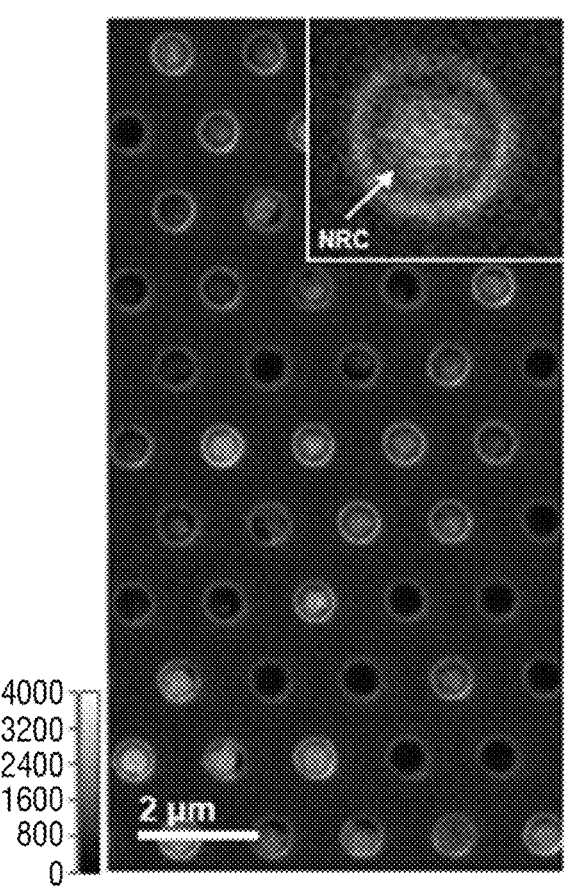

Panchromatic CL evaluation was performed using the LED elements fabricated in the Fabrication Examples 1 and 2, and its results were shown in FIGS. 21 and 22. A non-radiative recombination (NRC) area of the LED element was shown by being visualized through the panchromatic CL evaluation.

FIGS. 21 and 22 are micrographs showing panchromatic CL evaluation of LED elements of Fabrication Examples 1 and 2. FIG. 21 is a panchromatic CL evaluation image of an LED element including an insulating layer formed through the sol-gel process of the Fabrication Example 1, and FIG. 22 is a panchromatic CL evaluation image of an LED element including an insulating layer formed through the plasma ALD process of the Fabrication Example 2.

Referring to FIG. 21 and FIG. 22, a circular outer rim of the LED element represents emission of yellow light in the insulating layer of the LED element, and an inner circle thereof represents emission of blue light in the MQW area. In case of the LED element (FIG. 22) of the Fabrication Example 2, it is noted that a non-radiative recombination (NRC) area is formed at an outer edge portion of the inner circle and thus the LED element appears to be dark. On the other hand, in case of the LED element (FIG. 21) of the Fabrication Example 1, it is noted that the inner circle has uniform brightness and a non-radiative recombination (NRC) area is not formed unlike the Fabrication Example 2.

It is noted that the LED element of the Fabrication Example 1 has CL intensity measured in the panchromatic CL evaluation is brighter than that of the LED element of the Fabrication Example 2 and deviation of the CL intensity is also smaller. For example, through this evaluation, the LED element including the insulating layer fabricated through the sol-gel process of the Fabrication Example 1 has a smaller non-radiative recombination area than that of the LED element of the Fabrication Example 2, whereby it is noted that a surface defect of a GaN semiconductor layer was reduced.

Evaluation 2. Measurement Experiment of PL
Intensity

Figure 23:
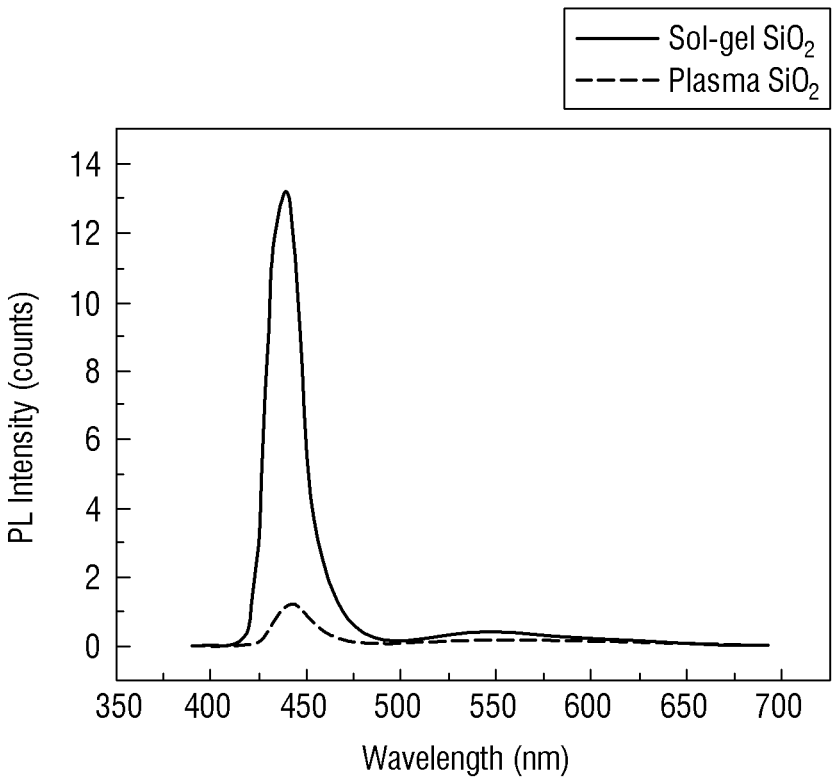
FIG. 23 is a graph showing results of PL intensity evaluation of LED elements of Fabrication Examples 1 and 2.
Figure 24:
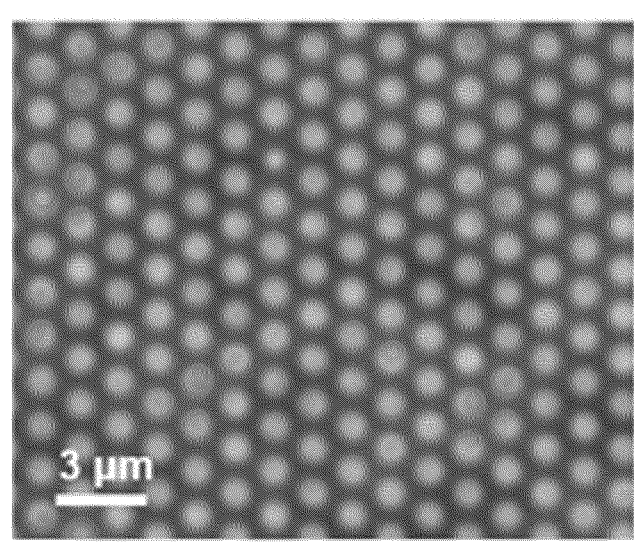
FIGS. 24 and 25 are images illustrating results of PL intensity evaluation and fluorescence excitation-emission spectrum evaluation of LED elements of Fabrication Examples 1 and 2.
Figure 24:
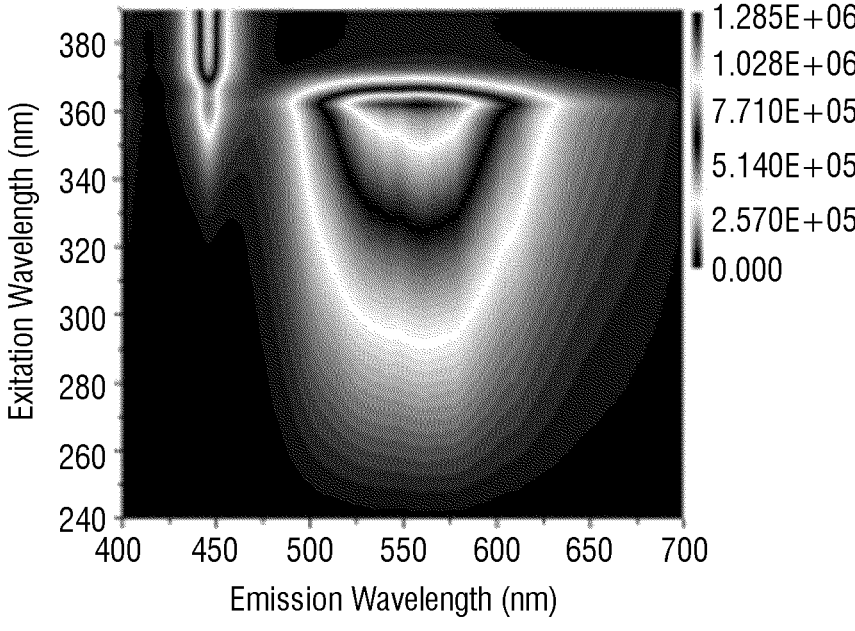
Figure 25:
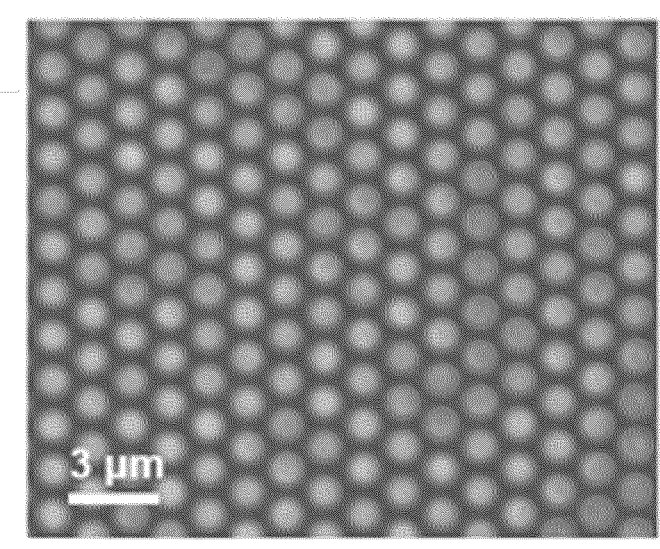
Figure 25:
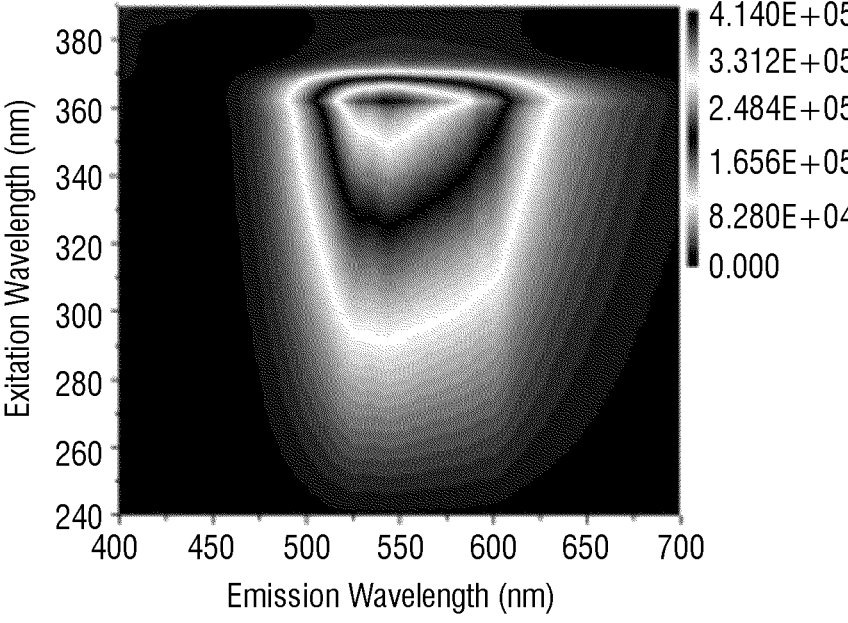

PL intensity evaluation and fluorescence excitation-emission spectrum evaluation were performed using the LED elements fabricated in the Fabrication Examples 1 and 2, and their results were shown in FIGS. 23 to 25. A reinforced mercury arc lamp having a band-pass filter ($\lambda$=340-380 nm) was used as an excitation wavelength in PL intensity evaluation, and a Ti:sapphire laser (Chameleon Vision) was used as an excitation wavelength to generate a 140 fs pulse at a repetition rate of 80 MHz for a two-photon excitation spectrum. An excitation wavelength of about 740 nm was used for two-photon excitation in the MQW of the LED element.

The mercury lamp and the laser were focused through a dry object lens (NA 0.8), and a long wavelength transmission filter ($\lambda$>425 nm) was applied to obtain an image, in which blue and yellow colors are overlapped, in the PL intensity evaluation. In order to avoid saturation of PL in the LED element of the Fabrication Example 1, an attenuator was applied to perform evaluation in a state that intensity of light was reduced to ¼.

FIG. 23 is a graph showing results of PL intensity evaluation of LED elements of Fabrication Examples 1 and 2.

Referring to FIG. 23, it is noted that each of the LED element of the Fabrication Example 1 and the LED element of the Fabrication Example 2 emits light of a wavelength band ranging from about 400 nm to about 500 nm, which is a blue light wavelength band, and a peak wavelength is in the range of about 420 nm to about 470 nm. It is noted that the LED element of the Fabrication Example 1 has PL intensity at the peak wavelength of the above range, which is about 13 times greater than that of the LED element of Fabrication Example 2. As the insulating layer of the LED element in the Fabrication Example 1 is formed by the sol-gel process, it is noted that the LED element of the Fabrication Example 1 has PL intensity characteristics more excellent than that of the LED element including an insulating layer formed by plasma ALD.

FIGS. 24 and 25 are images illustrating results of PL intensity evaluation and fluorescence excitation-emission spectrum evaluation of LED elements of Fabrication Examples 1 and 2. FIG. 24 is an image showing PL intensity evaluation and fluorescence excitation-emission spectrum of the LED element of the Fabrication Example 1, and FIG. 25 is an image showing PL intensity evaluation and fluorescence excitation-emission spectrum of the LED element of the Fabrication Example 2. Among the images of FIGS. 24 and 25, the images positioned at upper sides are images showing a result of PL intensity evaluation and the image positioned at lower sides are images showing a fluorescence excitation-emission spectrum.

Referring to FIGS. 24 and 25, it is noted that an emission wavelength having a wavelength band of about 450 nm, which is a wavelength band of blue light, is observed in the LED element (FIG. 24) of the Fabrication Example 1, whereas an emission wavelength having a wavelength band of about 450 nm is not observed in the LED element (FIG. 25) of the Fabrication Example 2. This indicates that the LED element including an insulating layer formed by a sol-gel process has more improved emission of light (about 450 nm) at a wavelength band of blue light than emission of light (about 550 nm) at a wavelength band of yellow light.

Figure 26:
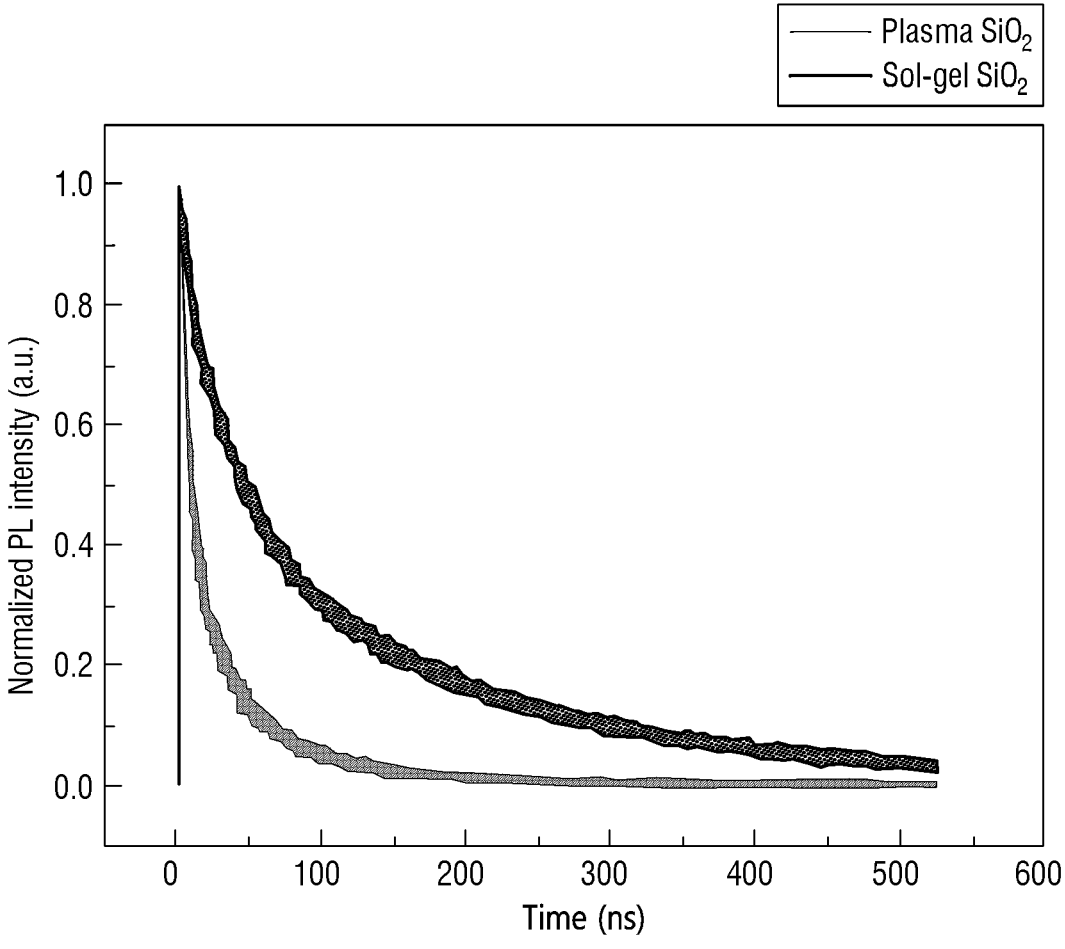
FIG. 26 is a graph showing normalized PL intensity curves of LED elements of Fabrication Examples 1 and 2.

FIG. 26 is a graph showing normalized PL intensity curves of LED elements of Fabrication Examples 1 and 2. FIG. 26 is a graph showing carrier lifetime of the LED elements of the Fabrication Examples 1 and 2.

The carrier lifetime graph of FIG. 26 was obtained through a confocal microscope (Leica TCS SP8) with a PiccoHarp 300 (Picoquant) using a time-correlated single-photon counting technique. The graph was obtained by one-photon excitation of a 405 nm diode laser at a repetition rate of about 625 kHz. The object lens was the same as that used in normal state PL measurement, and all PL and EL measurements were performed at a room temperature between about 20° C. and about 25° C. in a dark room.

Referring to FIG. 26, it is noted that the LED element of the Fabrication Example 1 has a carrier lifetime longer than that of the LED element of the Fabrication Example 2, and this indicates that the surface defect of the LED element is reduced.

Evaluation 3. Fluorescence Evaluation of Wafer-Glass Element

Fluorescence evaluation in states of a wafer substrate Wafer and a glass substrate Glass was performed using the LED elements fabricated in the Fabrication Examples 1 and 2. This evaluation was performed to identify that the LED element including the insulating layer fabricated by the sol-gel process has intensity of yellow fluorescence (YL) caused by surface defects, which is weaker than that of the LED element including the insulating layer manufactured by plasma ALD.

In the Fabrication Examples 1 and 2, the LED elements were grown on a 4-inch sapphire substrate, and the wafer substrate Wafer in this evaluation may be understood as a 4-inch sapphire substrate. In case that semiconductor layers are grown on the wafer substrate Wafer, gallium vacancy VGa and substituted carbon CN may be formed on u-GaN and n-GaN by a MOCVD process, and they are known to strongly emit yellow light. In the Fabrication Examples 1 and 2, yellow light emission intensity of the LED elements grown on the wafer substrate Wafer is compared with yellow light emission intensity in case that the LED elements are separated from the wafer substrate Wafer and dispersed on the glass substrate Glass, so that a difference in yellow light emission intensity in the LED elements between the insulating layer by the sol-gel process and the insulating layer by the plasma ALD process may be identified.

In the Fabrication Examples 1 and 2, yellow light emission intensity was evaluated in a state that the LED elements are grown on the wafer substrate Wafer and the LED elements are separated from the wafer substrate Wafer and dispersed on the glass substrate Glass, and its results are shown in FIGS. 27 to 31.

Figure 27:
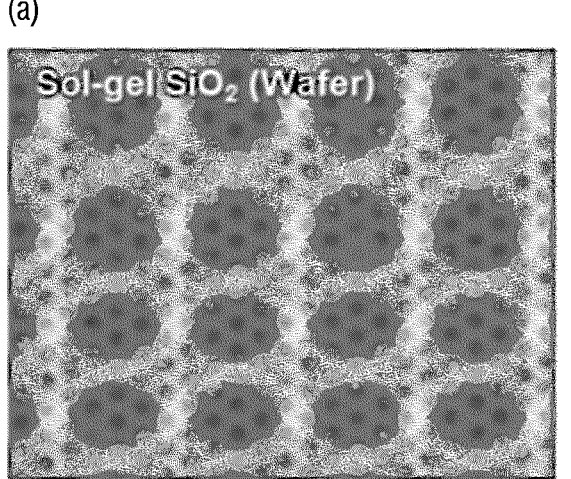
FIGS. 27 and 28 are images illustrating results of yellow light emission evaluation of LED elements of Fabrication Examples 1 and 2.
Figure 27:
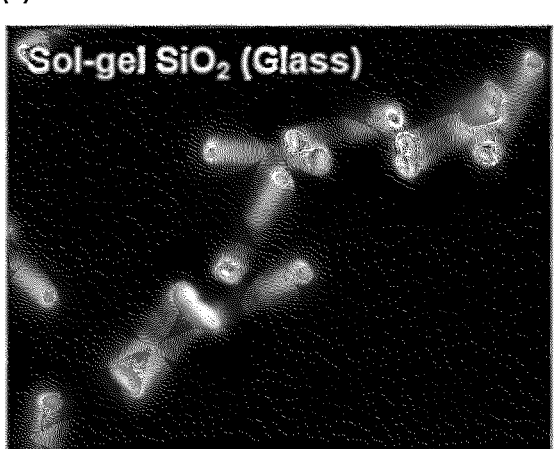
Figure 28:
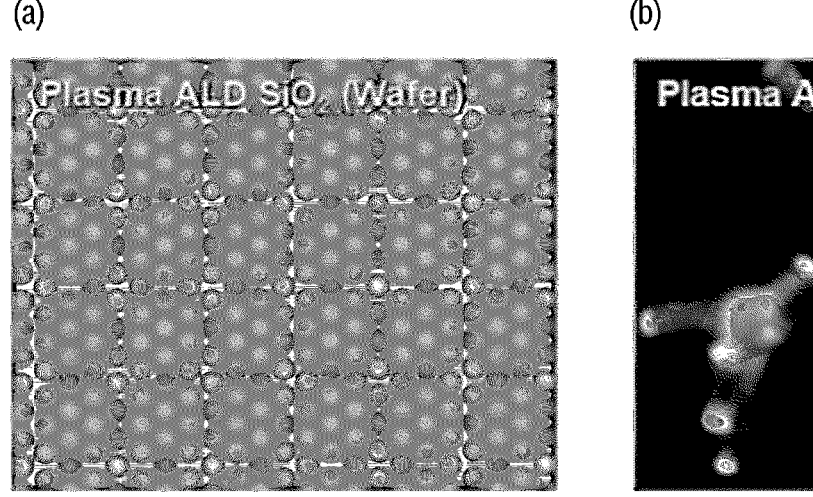
Figure 28:
Figure 29:
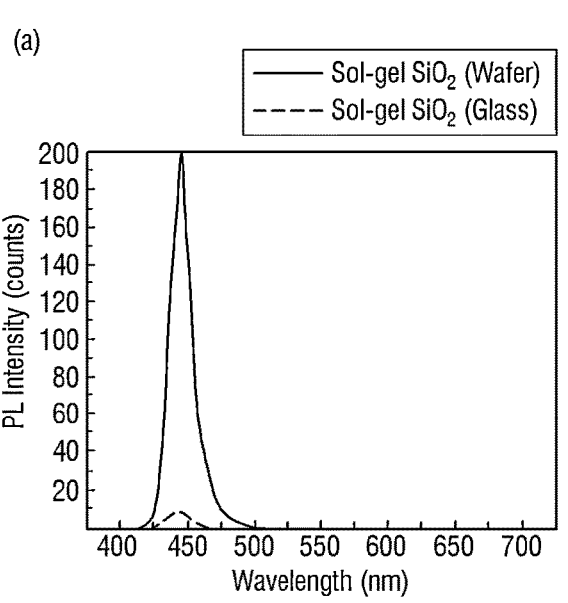
FIGS. 29 to 31 are graphs showing PL intensity of LED elements of Fabrication Examples 1 and 2.
Figure 29:
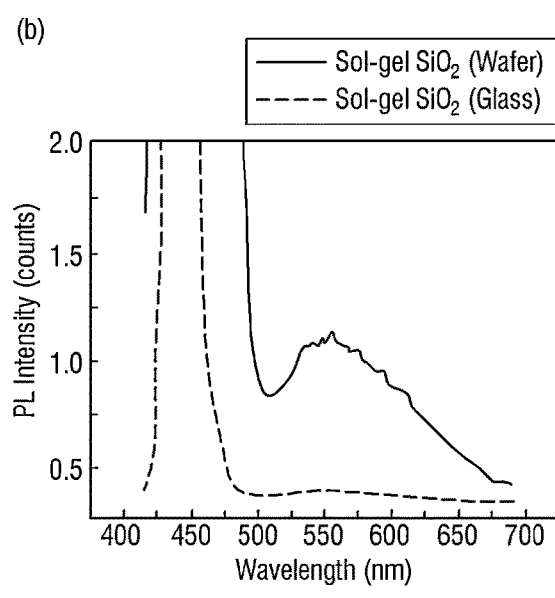
Figure 30:
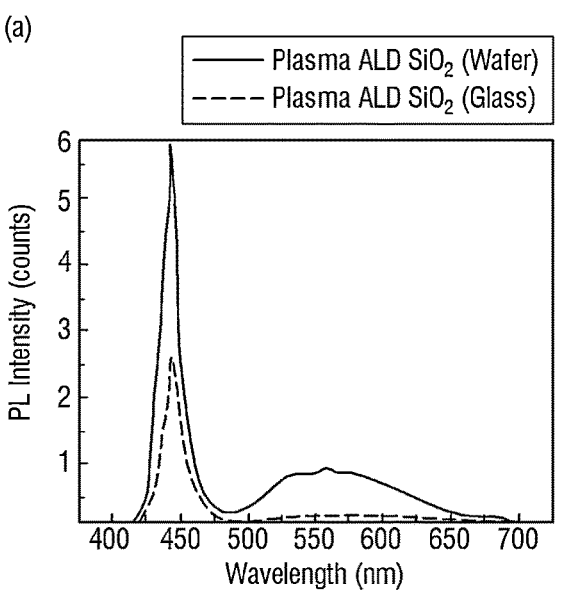
Figure 30:
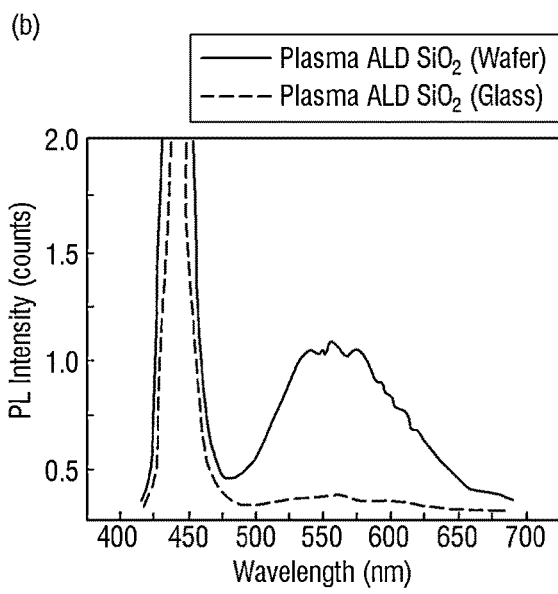
Figure 31:
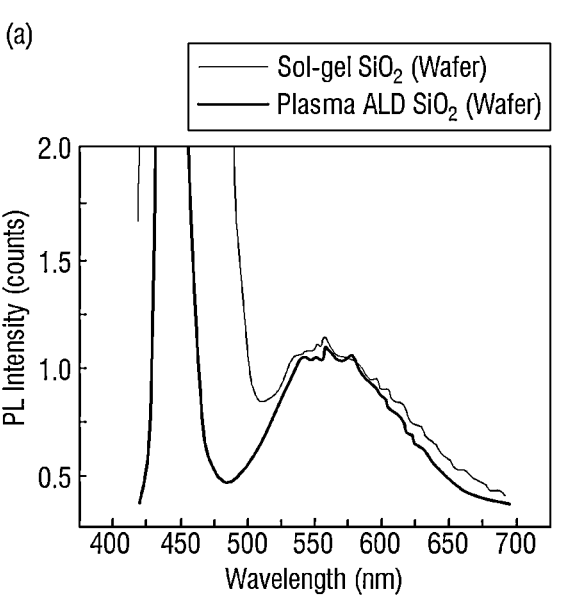
Figure 31:
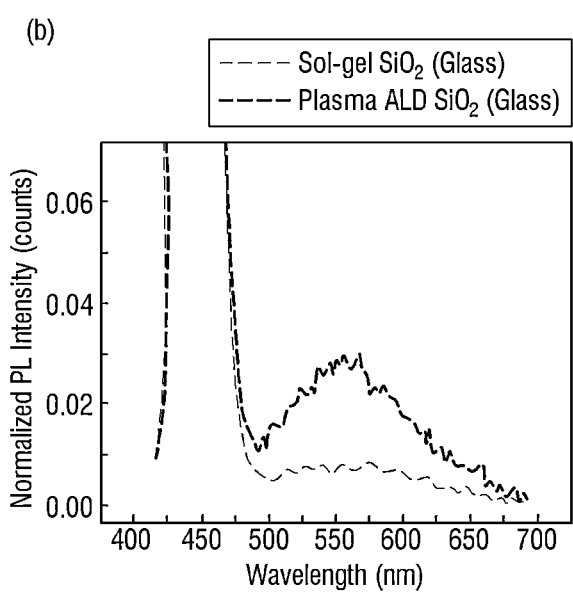

FIGS. 27 and 28 are images illustrating results of yellow light emission evaluation of LED elements of Fabrication Examples 1 and 2. FIGS. 29 to 31 are graphs showing PL intensity of LED elements of Fabrication Examples 1 and 2.

(a) of FIG. 27 and (a) of FIG. 28 show results of yellow light emission evaluation in a state that the LED elements of the Fabrication Examples 1 and 2 are grown on the wafer substrate Wafer, and (b) of FIG. 27 and (b) of FIG. 28 show yellow light emission evaluation in a state that the LED elements of the Fabrication Examples 1 and 2 are sprayed on the glass substrate Glass. (a) and (b) of FIG. 29 are graphs respectively showing results of PL intensity evaluation of the LED element of the Fabrication Example 1, and (a) and (b) of FIG. 30 are graphs respectively showing results of PL intensity evaluation of the LED element of the Fabrication Example 2. (a) and (b) of FIG. 31 are graphs relatively showing results of intensity evaluation of the LED elements of the Fabrication Examples 1 and 2.

In FIGS. 29 and 30, graphs represented by 'solid lines' are those showing PL intensity in a state that the LED elements of the Fabrication Examples 1 and 2 are grown on the wafer substrate Wafer, and graphs represented by 'dotted lines' are those showing PL intensity in a state that the LED elements of the Fabrication Examples 1 and 2 are sprayed on the glass substrate Glass. (a) of FIG. 31 is a graph showing PL intensity in a state that the LED elements of the Fabrication Examples 1 and 2 are grown on the wafer substrate Wafer and (b) of FIG. 31 is a graph showing PL intensity in a state that the LED elements of the Fabrication Examples 1 and 2 are sprayed on the glass substrate Glass.

Referring to FIGS. 27 to 31, it is noted that in the Fabrication 1 and the Fabrication Example 2, intensity of yellow light emission in the evaluation performed on the wafer substrate Wafer is higher than that of yellow light emission performed on the glass substrate Glass (peak near a wavelength band in a range of about 550 nm to about 570 nm). This means that, as described above, in case that the LED element is grown on the wafer substrate Wafer, yellow light emission occurs due to gallium vacancy VGa and substituted carbon CN, which are generated in u-GaN layer and/or n-GaN layer during a process such as MOCVD.

However, it is noted that intensity of yellow light emission in the evaluation performed on the glass substrate Glass is very low in the LED element of the Fabrication Example 1 as compared with the LED element of the Fabrication Example 2. It is noted that the LED element of the Fabrication Example 1 has intensity of blue light emission (wavelength band of about 450 nm), which is higher than that of the LED element of the Fabrication Example 2. As shown in the graph of (b) of FIG. 31, in a normalized graph of fluorescence intensity in PL intensity evaluation performed on the glass substrate Glass, it is noted from the LED element of the Fabrication Example 1 that intensity of blue light emission is greatly increased whereas intensity of yellow light emission is greatly reduced.

Based on that yellow light emission on the wafer substrate Wafer is clearly caused by defects such as gallium vacancy VGa and substituted carbon CN, it is noted that the LED element of the Fabrication Example 1 in which intensity of yellow light emission is reduced has a surface defect more reduced than that of the LED element of the Fabrication Example 2.

Evaluation 4. Evaluation of Surface Defect Measurement

An evaluation of measuring and comparing surface defects of the LED elements fabricated in the Fabrication Examples 1 and 2 was performed. In this evaluation, it is noted that the LED element including the insulating layer formed by the sol-gel process has a reduced surface defect as compared with the LED element including the insulating layer formed the plasma ALD process.

Figure 32:
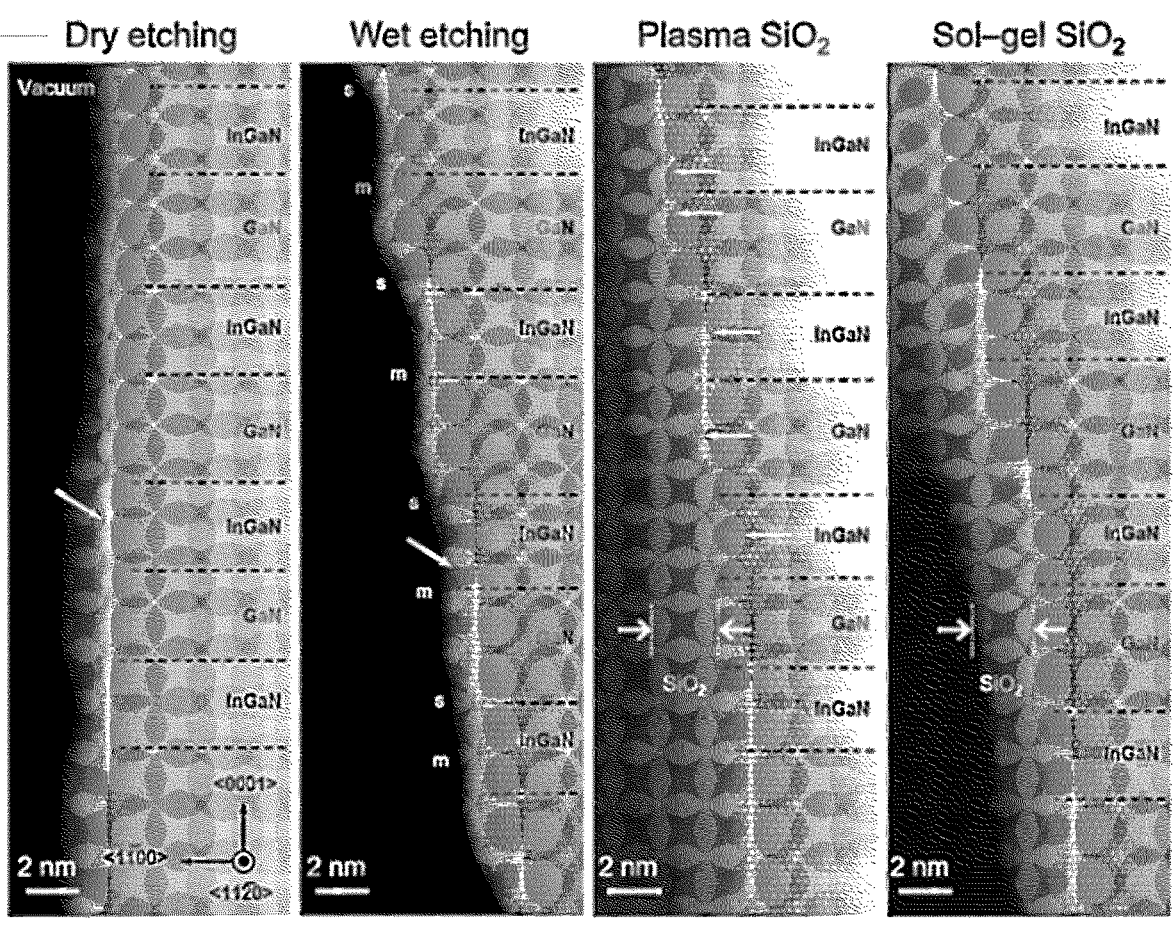
FIG. 32 illustrates high-angle annular dark-field scanning transmission electron microscopy (HAADF-STEM) photographs showing surfaces of LED elements of Fabrication Examples 1 and 2.

FIG. 32 illustrates high-angle annular dark-field scanning transmission electron microscopy (HAADF-STEM) photographs showing surfaces of LED elements of Fabrication Examples 1 and 2. FIG. 32 shows surfaces of the LED elements according to the etching processes and the process of forming an insulating layer in the fabricating process of the LED elements of the Fabrication Examples 1 and 2. 'Dry etching' of FIG. 32 shows a surface in a state that the semiconductor material layer stacked on the sapphire substrate is dry-etched, and 'wet etching' of FIG. 32 shows a surface in a state that a KOH wet etching process is performed after dry etching. 'Plasma $SiO_2$' of FIG. 32 show the surface of the LED element of the Fabrication Example 2, in which the insulating layer is formed by the plasma ALD, and 'Sol-gel $SiO_2$' of FIG. 32 shows the surface of the LED element of the Fabrication Example 1, in which the insulating layer is formed by the sol-gel process. In FIG. 32, portions indicated by white arrows are amorphized areas of the surface of the LED element, and portions indicated by yellow arrows indicate plasma damage concentrated on sidewalls of an InGaN MQW layer.

Referring to FIG. 32, it is noted that amorphous areas are formed on sides of a GaN/InGaN semiconductor layer after each fabricating step during the fabricating process of each LED element of the Fabrication Examples 1 and 2. For example, as shown in 'Wet etching' of FIG. 32, since an etch rate of p-GaN is slower than that of n-GaN during the wet etching process of the surface, the surface may have a tapered shape.

In case that $SiO_2$ insulating layer is formed on the surface of the LED element having a surface defect through the plasma ALD process like 'Plasma $SiO_2$' in FIG. 32, plasma is irradiated to the surface of the element, whereby defects such as nitrogen vacancy VN, nitrogen gap Ni, nitrogen division gap (N—N)$N_o$, gallium vacancy VGa and gallium vacancy complex may be further generated. Such defects may be formed over the entire surface of the LED element, and more defects may be generated in an area having a high density of dangling bond like areas indicated by yellow arrows in 'Plasma $SiO_2$' of FIG. 32. As a thickness of the $SiO_2$ insulating layer formed by plasma ALD is increased, a permeation depth of the amorphized area formed by being induced by plasma in the InGaN MQW layer may be increased up to about 4 nm. On the other hand, in case that $SiO_2$ insulating layer is formed on the surface of the LED element through the sol-gel process like 'Sol-gel $SiO_2$' in FIG. 32, it is noted that the amorphous area is not formed on the surface of the LED element except the deposited $SiO_2$.

Figure 33:
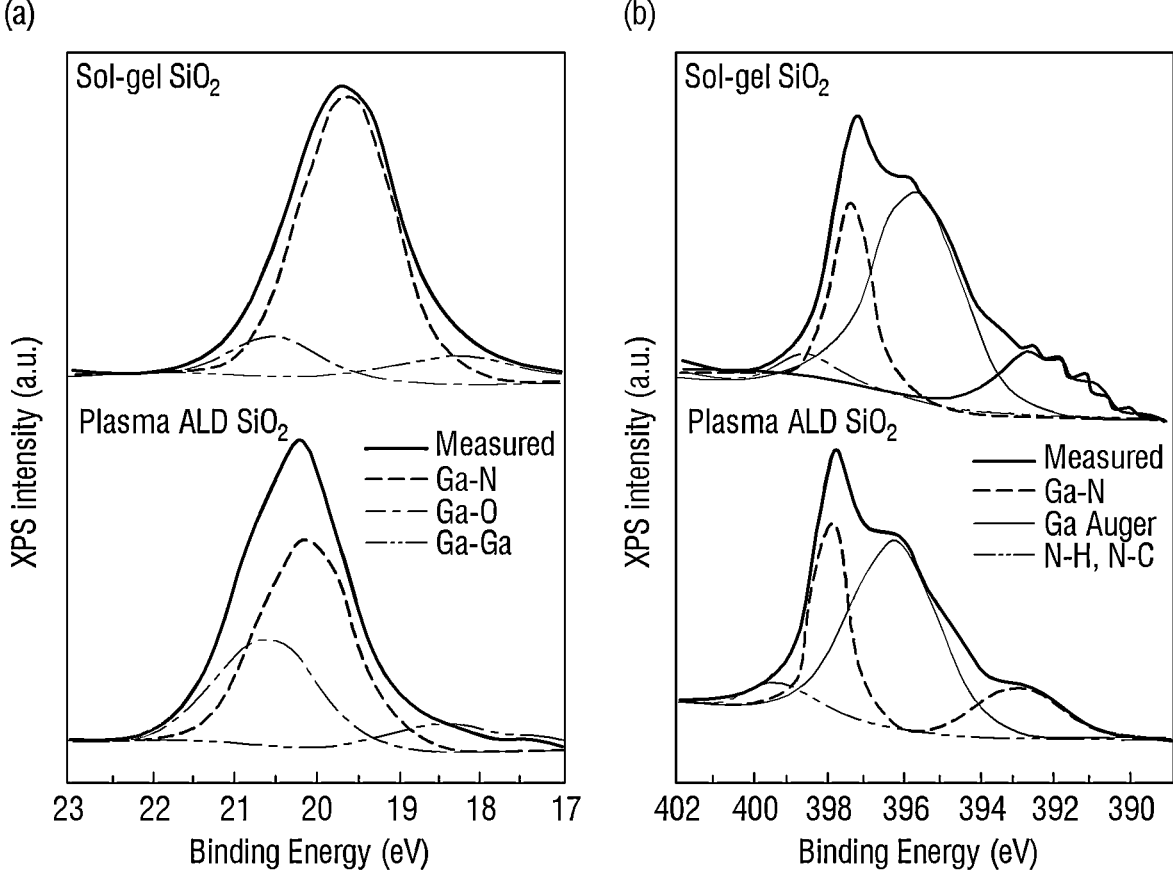
FIG. 33 illustrates graphs showing XPS core level spectra measured on surfaces of LED elements of Fabrication Examples 1 and 2.
Figure 34:
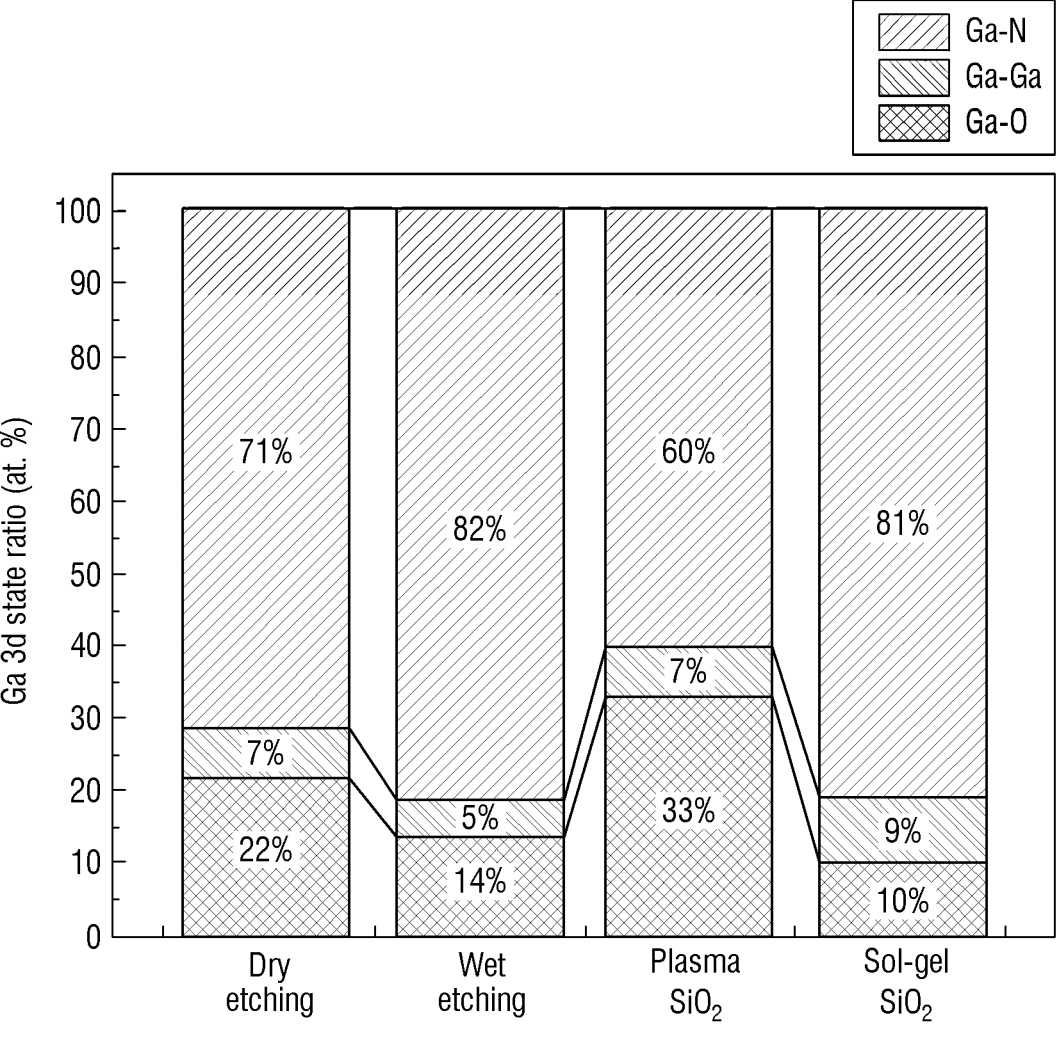
FIG. 34 is a graph showing a ratio of gallium 3d orbitals obtained from XPS core level spectra measured on surfaces of LED elements of Fabrication Examples 1 and 2.

FIGS. 33 (a) and (b) illustrate graphs showing XPS core level spectra measured on surfaces of LED elements of Fabrication Examples 1 and 2. FIG. 34 is a graph showing a ratio of gallium 3d orbitals obtained from XPS core level spectra measured on surfaces of LED elements of Fabrication Examples 1 and 2.

The XPS data of FIGS. 33 and 34 were obtained using a monochromatic Al-Kα X-ray (1486.7 eV) source and an ESCALAB 250Xi electronic spectrometer (Thermo Fisher Scientific, East Grinstead, UK) with a spot size of 400 µm. In order to obtain GA 3d and N is core level spectra of sidewalls of the LED elements of the Fabrication Examples 1 and 2, the insulating layer of the LED element was set to a thickness of about 2 nm. In order to obtain the XPS data, the fabricated LED elements were separated from the wafer substrate and dispersed on a silicon (Si) substrate.

A concentration of atoms was measured in an irradiation spectrum (0 to 1350 eV, 100 eV detector pass energy, 1 eV step size, 50 ms Residence Time, 2 Scan), and a smart background option was used using Thermo Fisher Scientific Advantage software to obtain a high resolution spectrum (20 eV detector pass energy, 0.1 eV step size, 50 ms residence time, and 10 scan) and peak fitting. The spectrometer was calibrated using C1s peak as a reference point (284.8 eV), and it is noted that the calibrated spectrometer is very well matched with an average value provided by the National Institute of Standards and Technology (NIST).

Referring to FIGS. 33 and 34, the XPS core level spectrum of the 3d orbital of gallium (Ga) in the GaN semiconductor layer of the LED element may be divided into a gallium-nitrogen (Ga—N) bond, a gallium-oxygen (Ga—O) bond and a gallium-gallium (Ga—Ga) bond. In the fabricating process of the LED element, it is noted from the result of the XPS spectrum after each step is performed that a gallium-oxygen (Ga—O) bond, which may be formed by a surface defect, occupies the largest ratio (for example, about 33%) in case that the insulating layer is formed by the plasma ALD process as in the Fabrication Example 2. On the other hand, it is noted that the gallium-oxygen (Ga—O) bond occupies the smallest ratio (for example, about 10%) in case that the insulating layer is formed by the sol-gel process as in the Fabrication Example 1. It is noted that the gallium-oxygen (Ga—O) bond occupied a ratio of about 22% in case that the semiconductor material layer stacked on the sapphire substrate is dry-etched, and that the gallium-oxygen (Ga—O) bond occupied a ratio of about 14% in case that a wet etching process is performed.

Figure 35:
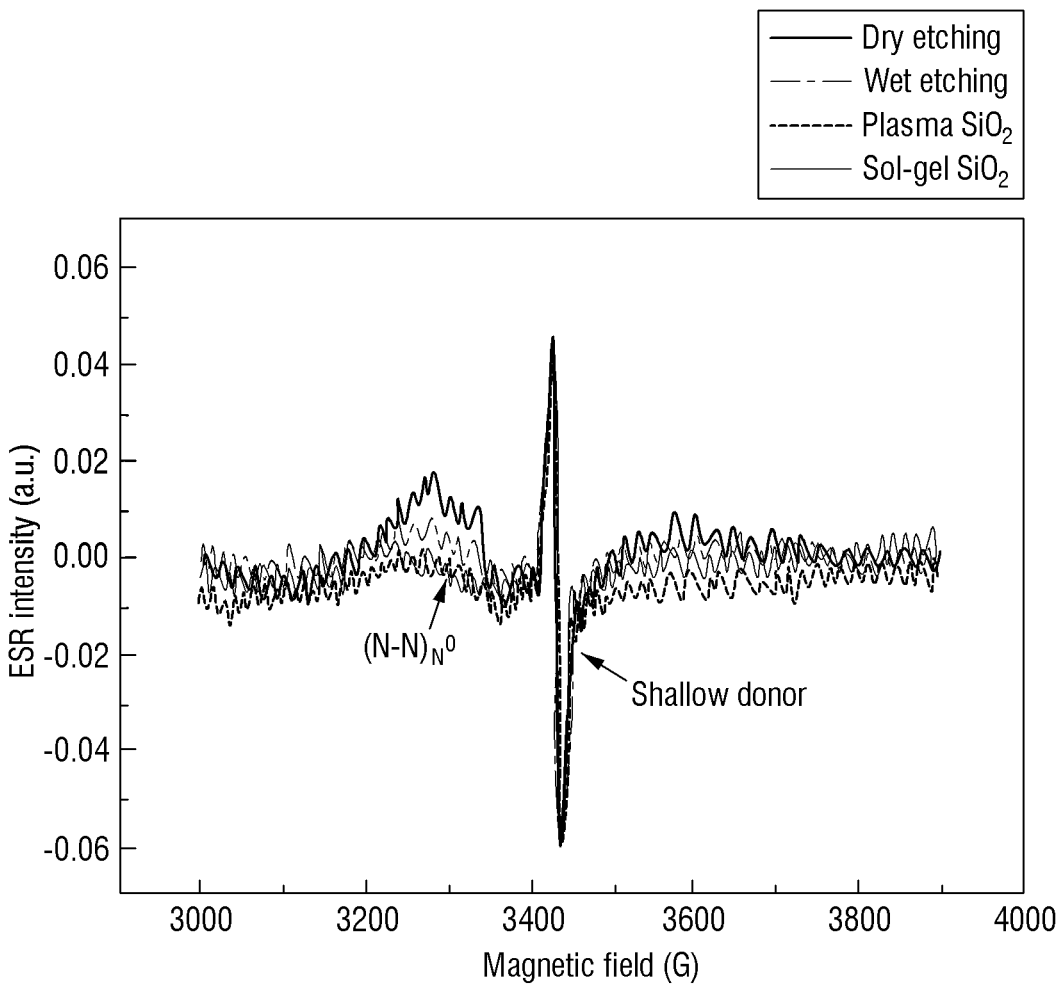
FIG. 35 is an electron spin resonance (ESR) spectrum measured on surfaces of LED elements of Fabrication Examples 1 and 2.
Figure 36:
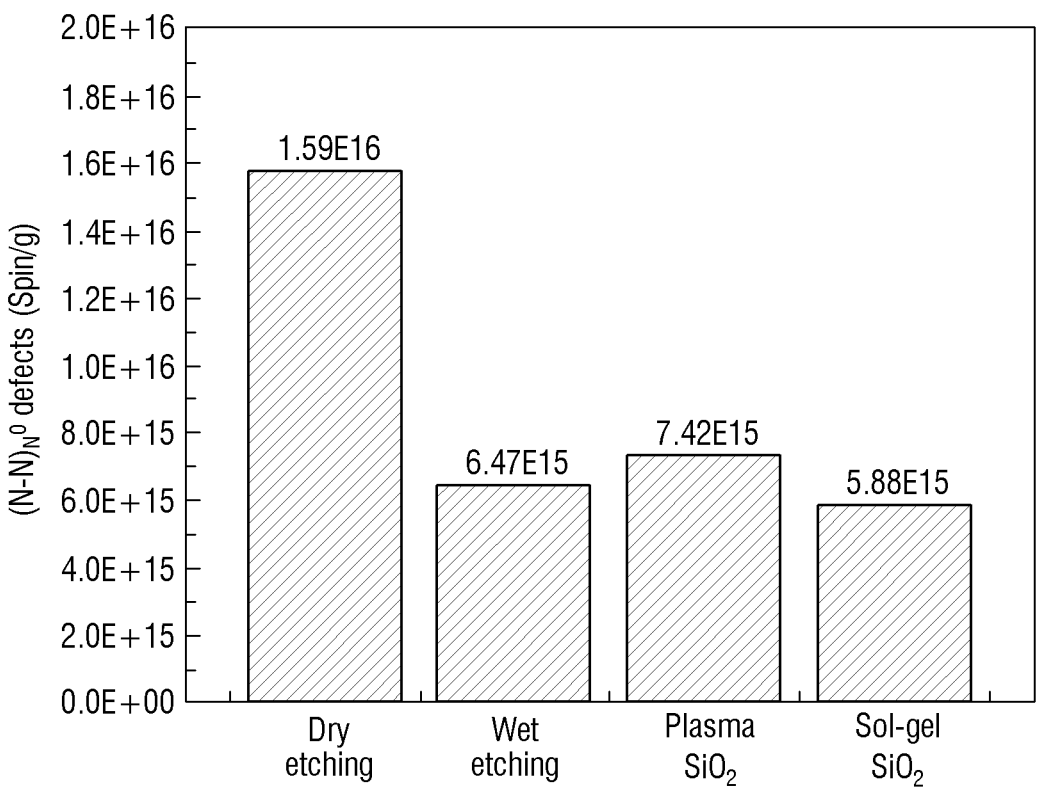
FIG. 36 is a graph showing a ratio of nitrogen division gap $(N—N)N_0$ defects obtained through the ESR spectrum of FIG. 35.

FIG. 35 is an electron spin resonance (ESR) spectrum measured on the surfaces of the LED elements of the Fabrication Examples 1 and 2. FIG. 36 is a graph showing a ratio of nitrogen division gap (N—N)$N_o$ defects obtained through the ESR spectrum of FIG. 35. FIGS. 35 and 36 illustrate results of the electronic spin resonance (ESR) spectrum evaluation performed to analyze a ratio or concentration of nitrogen division gap (N—N)$N_0$ defects known as bipolar defects in the fabricating process of the LED elements of the Fabrication Examples 1 and 2.

The ESR spectra of FIGS. 35 and 36 were measured using an X-band Bruker ELEXSYS E500 II spectrometer. A helium flow (gas-flow) low temperature retention device was used for the ESR spectra at an operating temperature of 6K. LED element samples of the Fabrication Examples 1 and 2 were placed in a quartz sample tube having a diameter of 4 mm and held in a microwave cavity. ESR conditions are as follows:

i) Microwave power: 0.002 mW;
  ii) sweep width: 1000 G;
  iii) Modulation frequency: 100 kHz; Modulation Amplitude: 5 G;
  iv) sweep time: 200 seconds; and
  v) Point number: 2048; Scan number: 8.

A spin density was calculated using SpinCount & Spinfit software.

Referring to FIGS. 35 and 36, it is noted that (N—N)$N_0$ defects in p-GaN are reduced after a wet etching process during the fabricating process of the LED element and are increased after the $SiO_2$ insulating layer is formed through the plasma ALD process. On the other hand, it is noted that the (N—N)$N_0$ defects are reduced after the $SiO_2$ insulating layer is formed through the sol-gel process. This means that dangling bond on the surface of the LED element may be reduced without excessive defects in case that the $SiO_2$ insulating layer is formed through the sol-gel process. Considering that the concentration of the (N—N)$N_0$ defects is calculated by dividing spin by a total weight of the LED element and most of the defects are concentrated on the surface of the LED element, the defect concentration of the LED element after each fabrication step is expected to actually represent a greater difference.

Figure 37:
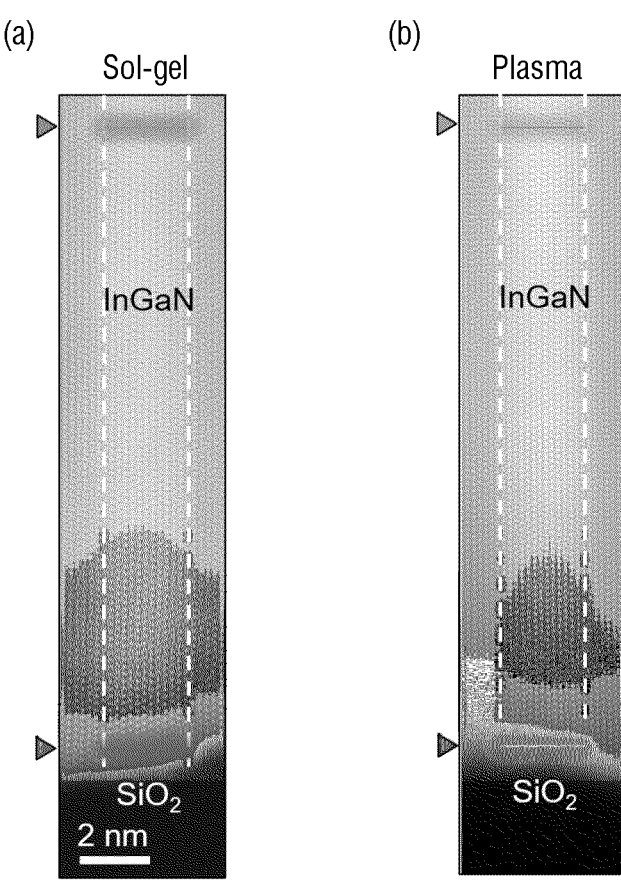
FIG. 37 illustrates high resolution scanning transmission electron microscopy (HR-STEM) photographs in an area where an electron energy loss spectrum (EEL spectrum) of MQW layer and $SiO_2$ insulating layer of LED elements of Fabrication Examples 1 and 2 is obtained.
Figure 38:
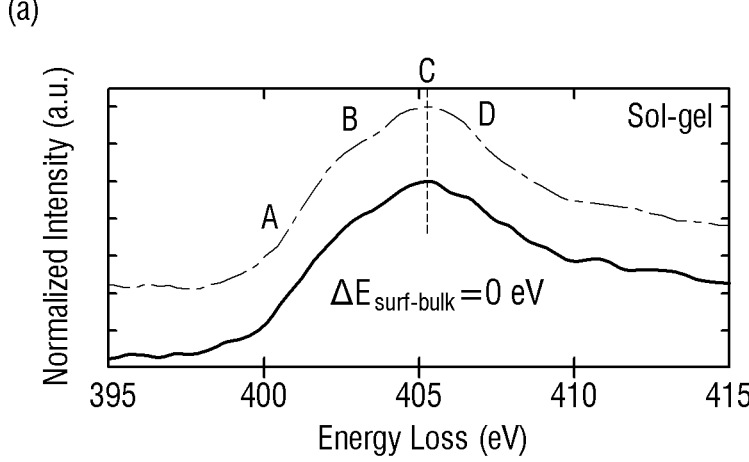
FIG. 38 illustrates graphs showing N-K energy-loss near-edge spectra (N-K ELNES) obtained in a given area in Fabrication Examples 1 and 2 of FIG. 37.
Figure 38:
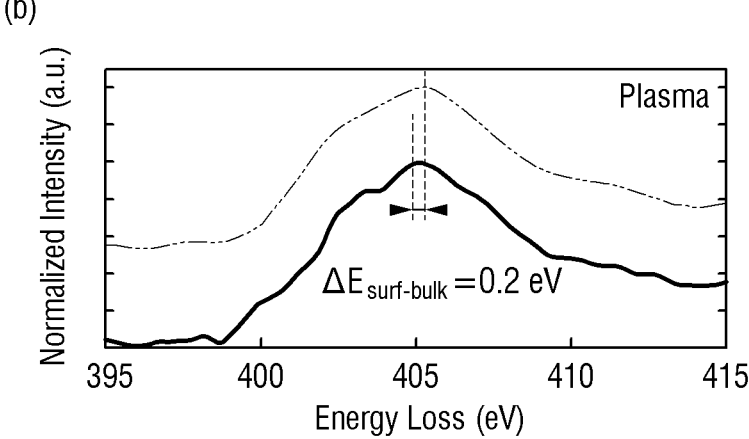

FIG. 37 illustrates high resolution scanning transmission electron microscopy (HR-STEM) photographs in an area where an electron energy loss spectrum (EEL) spectrum of MQW layer and $SiO_2$ insulating layer of LED elements of Fabrication Examples 1 and 2 is obtained. FIG. 38 illustrates graphs showing N-K energy-loss near-edge spectrum (N-K ELNES) obtained in a given area in Fabrication Examples 1 and 2 of FIG. 37. (a) of FIG. 37 is an HR-STEM image of the LED element of the Fabrication Example 1, and (b) of FIG. 37 is an HR-STEM image of the LED element of the Fabrication Example 2. (a) of FIG. 38 is a graph showing N-K ELNES obtained at positions indicated in (a) of FIG. 37, and (b) of FIG. 38 is a graph showing N-K ELNES obtained at positions indicated in (b) of FIG. 37.

The electron energy loss spectrum (EELS) of FIG. 37 was performed based on a density function theory implemented in VASP1. A projector enhancement wave method was used to mimic an ion function, whereas Perdew-Burke-Ernzerhof approximation was used for an electronic exchange-correlation function. A plane wave was included up to an energy cutoff of 400 eV, and a supercell of 9.0×11×11 Å was used to consider a defect complex. A Brillouin area for supercell calculation was sampled using a 2×2×2 k-point grid, and ion and electron relaxation was performed by applying a convergence criterion of 5×10-2 eV/Å per ion and 10-5 eV per electronic step. A supercell core hole method was used to obtain the EEL spectrum of the LED element. Core electrons of oxygen atoms were removed from a core and added to a valence/conduction band similar to a final state (referred to as a final state approximation) of an excitation process, and a constant Lorentzian extension of 0.5 eV was used to replicate experimental extension.

Referring to FIGS. 37 and 38, the N-K ELNES obtained in a bulk area of the InGaN MQW layer in the LED elements of the Fabrication Examples 1 and 2 may be divided into four positions 'A', 'B', 'C' and 'D' indicated in (a) of FIG. 38. Referring to (a) of FIG. 38, it is noted from the LED element of the Fabrication Example 1 that the bulk area of the InGaN MQW layer and the N-K ELNES obtained from a surface area are almost similar to each other. On the other hand, referring to (b) of FIG. 38, it is noted from the LED element of the Fabrication Example 2 that there is a difference between the bulk area of the InGaN MQW layer and the N-K ELNES obtained in the surface area. For example, the LED element of the Fabrication Example 2 has a clear energy change at the peak 'C', and this change may mean a red shift.

Evaluation 5. Evaluation of Characteristics According to Thickness of $SiO_2$

The change in PL intensity according to the thickness of the $SiO_2$ insulating layer of the LED element fabricated in the Fabrication Example 1 was measured, and the effect resulting therefrom was evaluated. The sol-gel process according to the above-described process of the Fabrication Example 1 was repeatedly performed to fabricate the LED elements having different thicknesses of the $SiO_2$ insulating layer and evaluate the PL intensity of each LED element.

Figure 39:
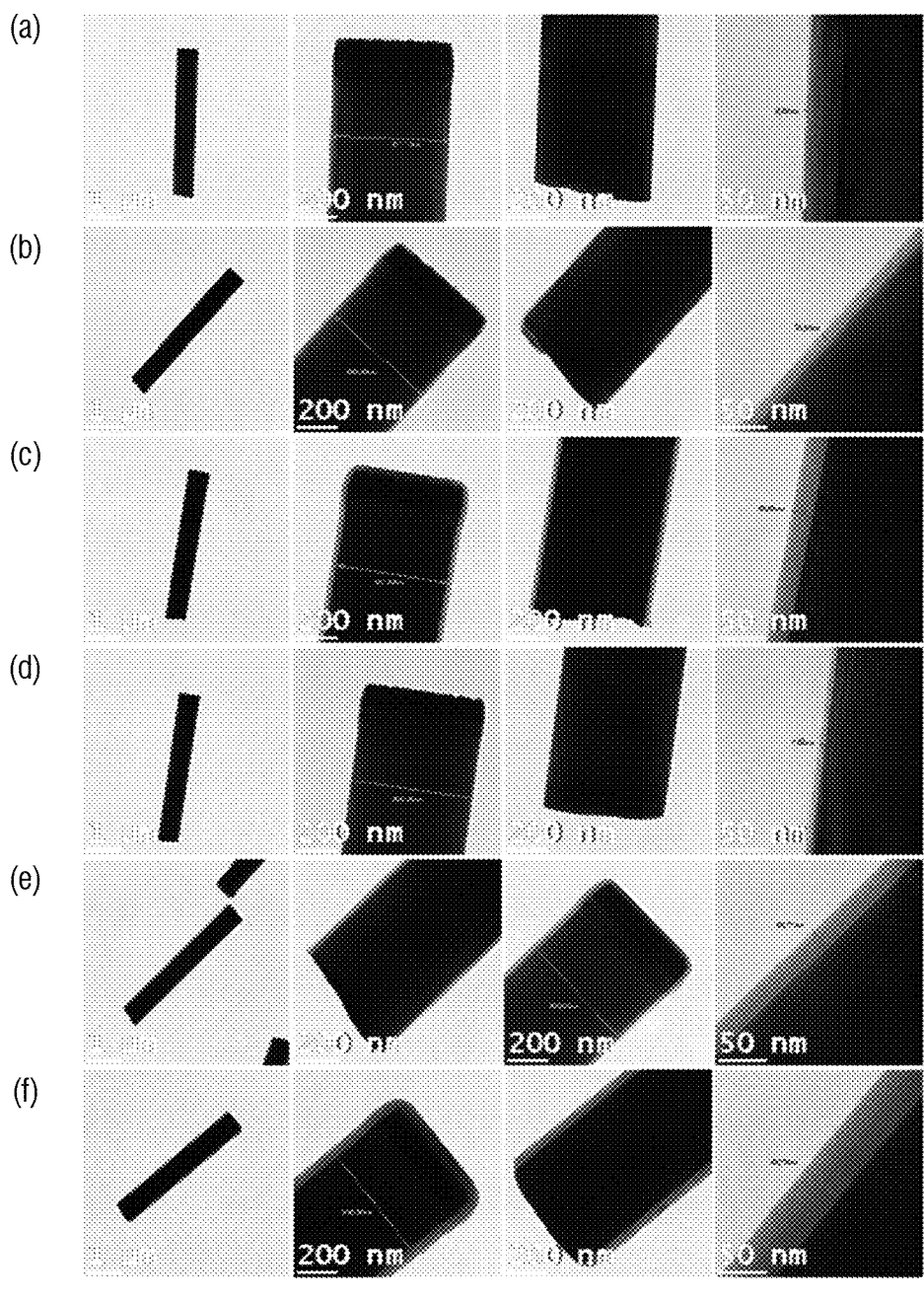
FIG. 39 illustrates transmission electron microscopy (TEM) images showing a thickness change of $SiO_2$ insulating layer, which is changed depending on a condition of a sol-gel process in an LED element of a Fabrication Example 1.
Figure 40:
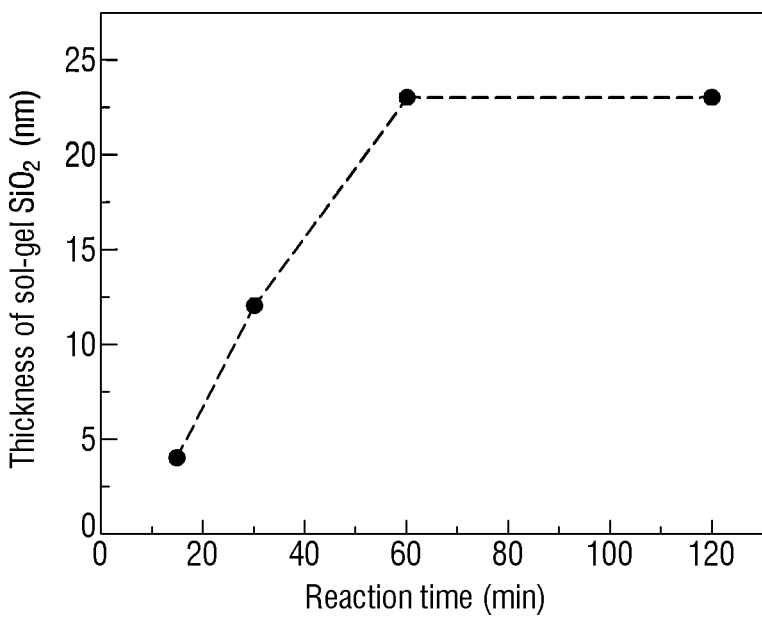
FIG. 40 is a graph showing a thickness change of $SiO_2$ insulating layer according to a sol-gel process reaction time of an LED element of a Fabrication Example 1.

FIG. 39 illustrates transmission electron microscopy (TEM) images showing a thickness change of $SiO_2$ insulating layer, which is changed depending on a condition of a sol-gel process in an LED element of a Fabrication Example 1. FIG. 40 is a graph showing a thickness change of $SiO_2$ insulating layer according to a sol-gel process reaction time of an LED element of a Fabrication Example 1.

(a), (b) and (c) of FIG. 39 are images showing a thickness change of $SiO_2$ of the LED element in case that the sol-gel process was performed for 15 minutes, 30 minutes and 60 minutes under the same process conditions as the fabricating process of the Fabrication Example 1, and (d), (e) and (f) of FIG. 39 are images showing a thickness change of $SiO_2$ in case that the same process conditions as those of (a), (b) and (c) were twice repeated. The thickness change of $SiO_2$ according to the process time of the sol-gel process of (a), (b) and (c) of FIG. 39 is shown in FIG. 40.

Referring to FIGS. 39 and 40, it is noted that the thickness of the $SiO_2$ insulating layer is increased as the condition time of the sol-gel process is increased (shown in FIGS. 39 and 40). However, it is noted that the thickness of the $SiO_2$ insulating layer is saturated without being increased in case that the sol-gel process lasts for a given time. In case that the sol-gel process time of 60 minutes passes in the graph of FIG. 40, the thickness of the $SiO_2$ insulating layer is saturated at about 23 nm. This means that the thickness of the $SiO_2$ insulating layer in the sol-gel process varies depending on the content of the precursor that forms $SiO_2$, as described above, and also means that the thickness of the $SiO_2$ insulating layer is not increased infinitely even though only the process time of the sol-gel process is increased.

On the other hand, as shown in (d), (e) and (f) of FIG. 39, it is noted that the thickness of the $SiO_2$ insulating layer was increased again in case that the sol-gel process was repeated twice. In case of (f) of FIG. 39, in case that the sol-gel process of 60 minutes was repeated twice, the thickness of the $SiO_2$ insulating layer became about 46 nm. As a result, it is noted that the $SiO_2$ insulating layer of the LED element may vary depending on the content of the precursor forming $SiO_2$ in the sol-gel process, the process time of the sol-gel process and process times of the sol-gel process.

Figure 41:
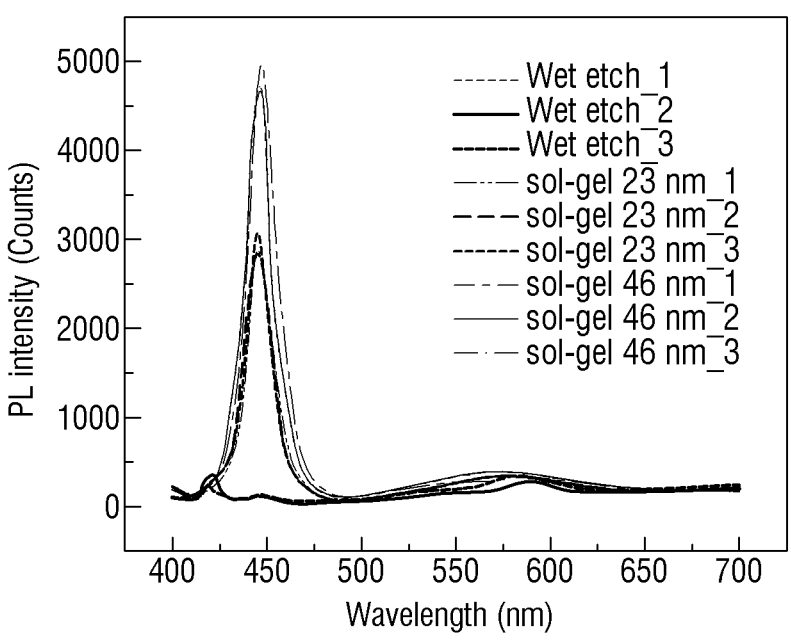
FIG. 41 is a graph showing a result of PL intensity evaluation of an LED element fabricated in FIG. 39.

FIG. 41 is a graph showing a result of PL intensity evaluation of an LED element fabricated in FIG. 39.

The result of the PL intensity evaluation in FIG. 41 was performed in a state that the LED element was fabricated on the wafer substrate Wafer. Three random positions were determined in the wafer substrate Wafer, and the PL intensity evaluation of the LED element was performed for each of the positions (_1, _2 and _3 of FIG. 41) after a wet etching process was performed, after the sol-gel process was performed once (Sol-gel 23 nm) and after the sol-gel process was performed twice (Sol-gel 46 nm).

Referring to FIG. 41, it is noted that a deviation of PL intensity according to the position on the wafer substrate Wafer was small and the PL intensity was increased depending on the thickness of the $SiO_2$ insulating layer. The increase in PL intensity is caused by reduction of dangling bond by the $SiO_2$ insulating layer and effective passivation of the surface of the LED element.

Evaluation 6. Evaluation of Heat-Treatment Characteristics

The $SiO_2$ insulating layers of the LED elements fabricated in the Fabrication Examples 1 and 2 were heat-treated and the effect resulting therefrom was evaluated. In this evaluation, the LED elements fabricated in the Fabrication Examples 1 and 2 and the LED element obtained by treating the LED element of the Fabrication Example 1 with heat were compared with respect to gas emission of $SiO_2$ insulating layer, and carrier lifetime and electrical characteristics were evaluated by the heat-treatment process.

Figure 42:
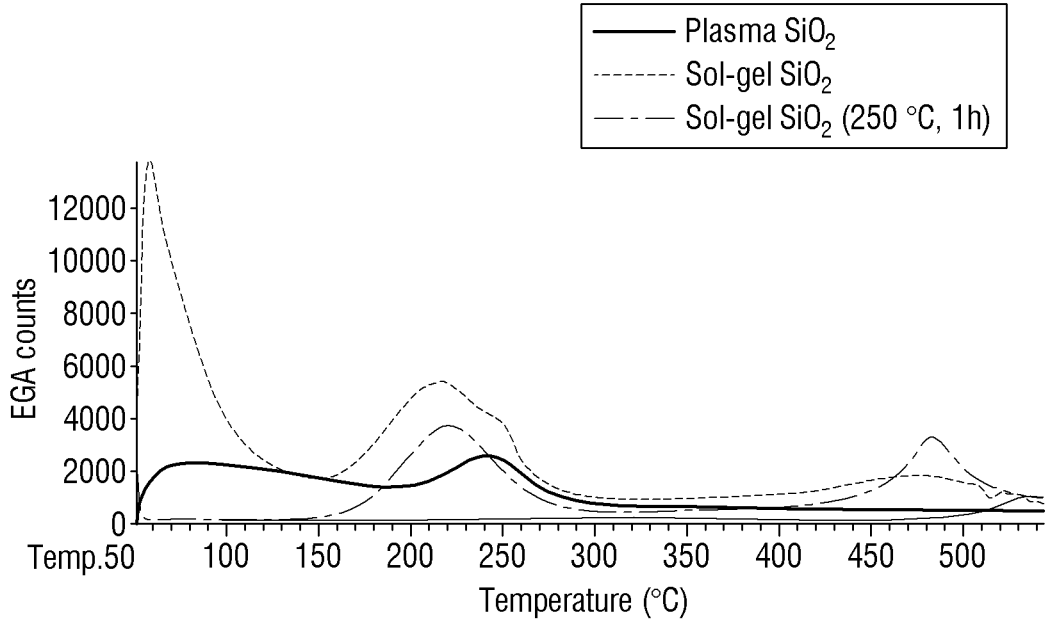
FIG. 42 is a graph showing evaluation results of EGA-MS and Py-CG/MS of LED elements of Fabrication Examples 1 and 2 and a heat-treated LED element.

FIG. 42 is a graph showing evaluation results of EGA-MS and Py-CG/MS of LED elements of Fabrication Examples 1 and 2 and a heat-treated LED element. In FIG. 42, the LED elements fabricated in the Fabrication Examples 1 and 2 and the LED element obtained by treating the LED element of the Fabrication Example 1 with heat at 250° C. for one hour were compared with respect to gas emission of the $SiO_2$ insulating layer by using EGA-MS and Py-CG/MS.

Referring to FIG. 42, it is noted that the number of gases (EGA counts) emitted from the LED element of the Fabrication Example 1 and the LED element heat-treated from the LED element of the Fabrication Example 1 are smaller than that of the LED element of the Fabrication Example 2, and the heat-treated LED element emits less gas than the other LED elements. This means that the $SiO_2$ insulating layer may be heat-treated to form a more stable layer.

Figure 43:
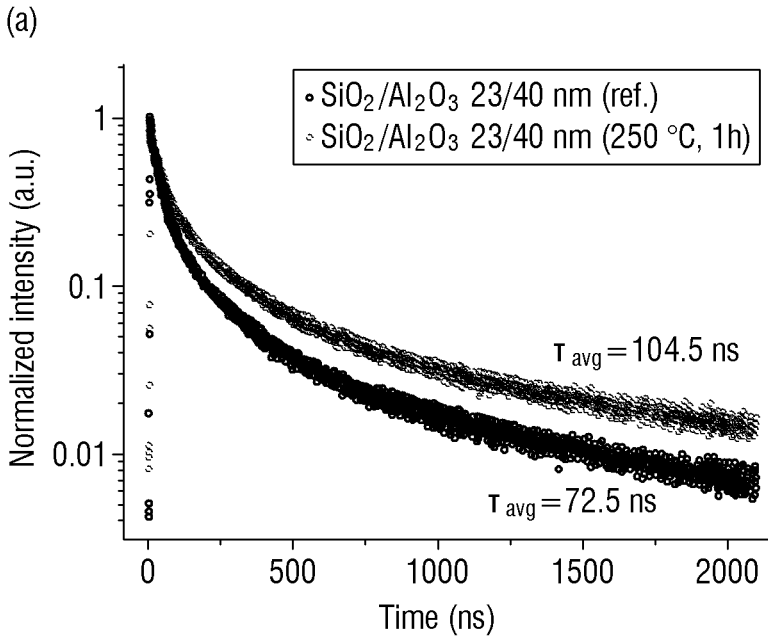
FIG. 43 illustrates graphs showing results of carrier lifetime evaluation and electrical characteristics evaluation according to a heat-treatment process of an LED element of a Fabrication Example 1.
Figure 43:
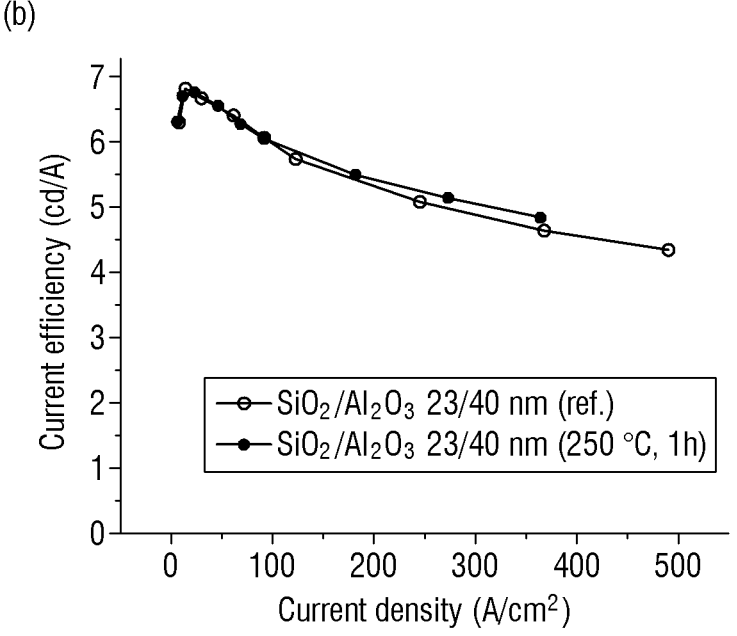

FIG. 43 illustrates graphs showing results of carrier lifetime evaluation and electrical characteristics evaluation according to a heat-treatment process of an LED element of a Fabrication Example 1. In FIG. 43, an LED element including $SiO_2$ insulating layer of about 23 nm and $Al_2O_3$ insulating layer, which was fabricated in the Fabrication Example 1, and an LED element heat-treated from the above LED element were evaluated for carrier lifetime and electrical characteristics. (a) of FIG. 43 shows a result of carrier lifetime evaluation, and (b) of FIG. 43 shows evaluation of EL current efficiency compared to a current density of the LED element.

Referring to FIG. 43, it is noted that carrier lifetime was increased and EL efficiency compared to a current density was almost the same before and after the heat-treatment process in case that the heat-treatment process was performed after the $SiO_2$ insulating layer and/or $SiO_2/Al_2O_3$ insulating layers were formed in the LED element. This means that the carrier lifetime of the LED element is further increased in case that the heat-treatment process is performed after the sol-gel process is performed in the fabricating process of the LED element.

Evaluation 7. Evaluation of External Quantum Efficiency (EQE) and Electrical Characteristics Electrical characteristics and external quantum efficiency of the LED elements fabricated in the Fabrication Examples 1 and 2 were evaluated. In this evaluation, it was identified how characteristics such as electroluminescence (EL), external quantum efficiency (EQE) and current density of the LED element including the insulating layer formed by the sol-gel process were changed compared to the LED element including the insulating layer formed by the plasma ALD process. In this evaluation, a pixel array including the LED elements of the Fabrication Examples 1 and 2 was fabricated to evaluate electrical and optical characteristics of the LED elements from each pixel. The pixel array may include 60 pixels having a structure similar to that of the pixel of the above-described display device, wherein each of the pixels may include a transparent conductive metal and six to nine LED elements connected in parallel with one another.

Figure 44:
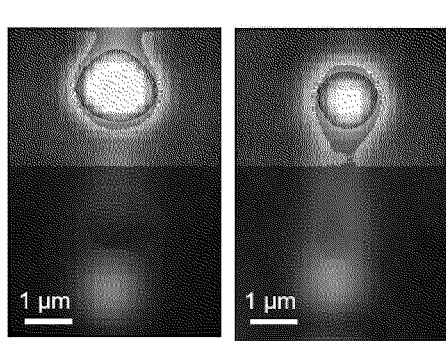
FIG. 44 illustrates photographs and graphs showing electroluminescence (EL) intensity and a result of external quantum efficiency (EQE) evaluation using LED elements of Fabrication Examples 1 and 2.
Figure 44:
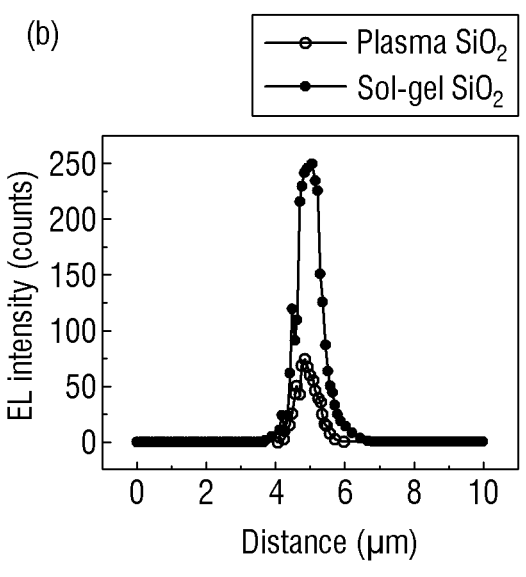
Figure 44:
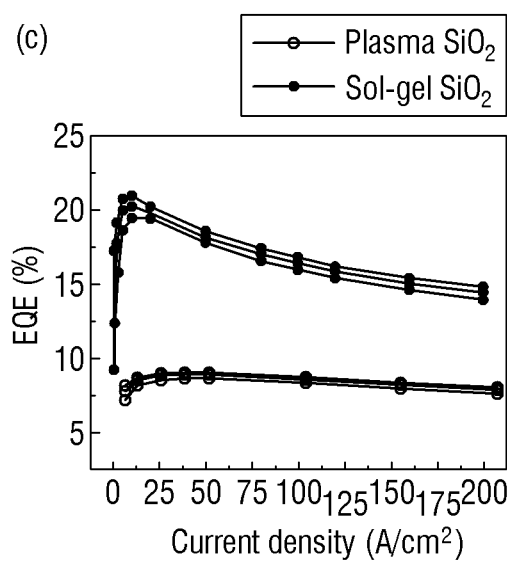

FIG. 44 illustrates photographs and graphs showing electroluminescence (EL) intensity and a result of external quantum efficiency (EQE) evaluation using LED elements of Fabrication Examples 1 and 2. (a) of FIG. 44 is an image obtained by synthesizing EL and PL light emission of the Fabrication Examples 1 and 2. (b) of FIG. 44 is a graph showing EL intensity evaluation measured using a confocal microscope in the MQW layer of the LED element in a horizontal direction, and (c) of FIG. 44 is a graph showing external quantum efficiency (EQE) according to the current density obtained from the LED elements of the Fabrication Examples 1 and 2.

(a) of FIG. 44 shows an image obtained by synthesizing EL and PL light emission measured in one LED element inside the subpixel SPXn of the display device (display device of FIGS. 1 to 7) including the LED elements of the Fabrication Examples 1 and 2. A left image in (a) of FIG. 44 is an image showing the LED element of the Fabrication Example 1, and a right image is an image showing the LED element of the Fabrication Example 2. (c) of FIG. 44 is an external quantum efficiency (EQE) graph obtained from a total of 60 subpixels including six to nine LED elements of the Fabrication Example 1 or the Fabrication Example 2.

Referring to (a) and (b) of FIGS. 44, light may be emitted from upper and lower ends of the LED element. Light extraction efficiency by the light emission of the LED elements in each pixel structure may be calculated using a finite differential time domain (Analysis lumerical FDTD) method. The light extraction efficiency (LEE) of the LED element was calculated to be about 25%, and the emitted light was comprised of radial emission of about 71.0%, p-GaN emission of about 16.8%, n-GaN emission of about 9.9%, and light loss in a transparent conductive metal. As shown in (b) of FIG. 43, it is noted that an EL intensity profile in the LED element of the Fabrication Example 1 is higher than that in the LED element of the Fabrication Example 2.

Referring to (c) of FIG. 44, an average value of external quantum efficiency (EQE) calculated in the pixel array including the LED element of the Fabrication Example 1 was 20.2±0.6% and an average value of external quantum efficiency calculated in the pixel array including the LED element of the Fabrication Example 2 was 8.9±0.1%. Internal quantum efficiency (IQE) calculated by dividing external quantum efficiency (EQE) by the calculated light extraction efficiency (LEE) was about 81% in case of the Fabrication Example 1 and about 36% in case of the Fabrication Example 2. It is noted that the LED element including the insulating layer formed by the sol-gel process as in the Fabrication Example 1 may have high external quantum efficiency and such high external quantum efficiency is caused by the SiO₂ insulating layer formed by the sol-gel process, which reduces damage to GaN surface of the LED element, thereby resulting in an increase in carrier lifetime.

Figure 45:
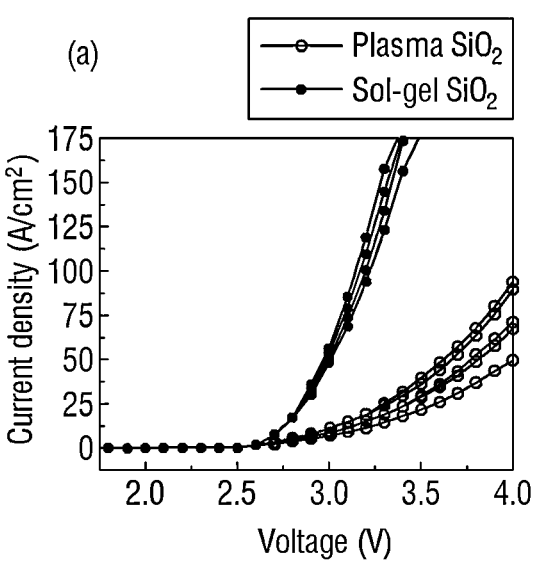
FIG. 45 illustrates graphs showing a current density (J-V) according to voltages of LED elements of Fabrication Examples 1 and 2.
Figure 45:
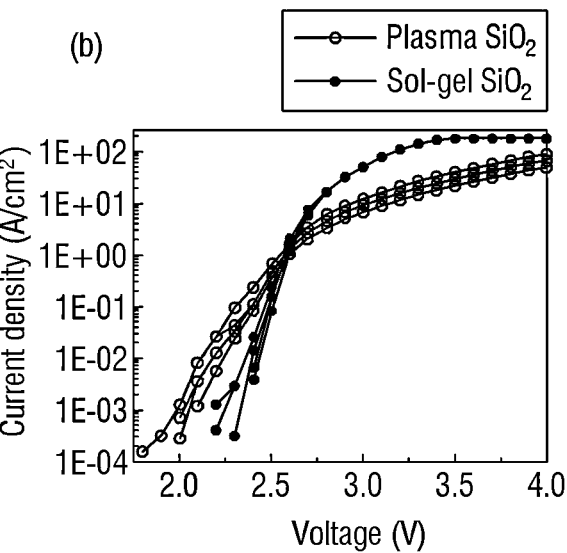
Figure 45:
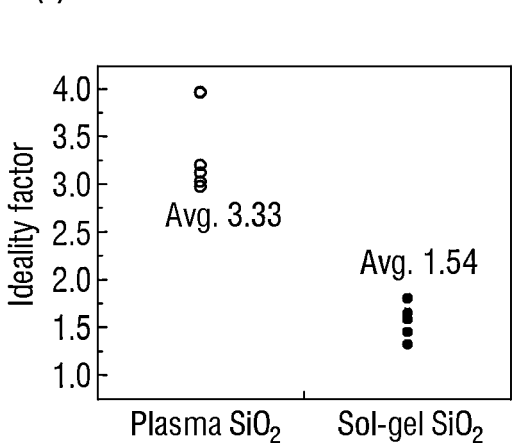

FIG. 45 illustrates graphs showing a current density (J-V) according to voltages of LED elements of Fabrication Examples 1 and 2. (a) of FIG. 45 and (b) of FIG. 45 are J-V graphs of the LED elements and (c) of FIG. 45 is a graph showing an average ideality factor of the Fabrication Examples 1 and 2. (a), (b) and (c) of FIG. 45 are graphs showing a J-V graph obtained at a voltage of 2.5V or an average ideality factor.

Referring to FIG. 45, it is noted that the LED element of the Fabrication Example 1 has a lower leakage current at a voltage less than a threshold value compared to the LED element of the Fabrication Example 2, due to a parallel resistance component due to sidewall damage. As shown in (c) of FIG. 45, the LED element of the Fabrication Example 1 is more matched with the reduced result of the average ideality factor than the LED element of the Fabrication Example 2.

Hereinafter, other embodiments of the display device 10 will be described with reference to other drawings.

Figure 46:
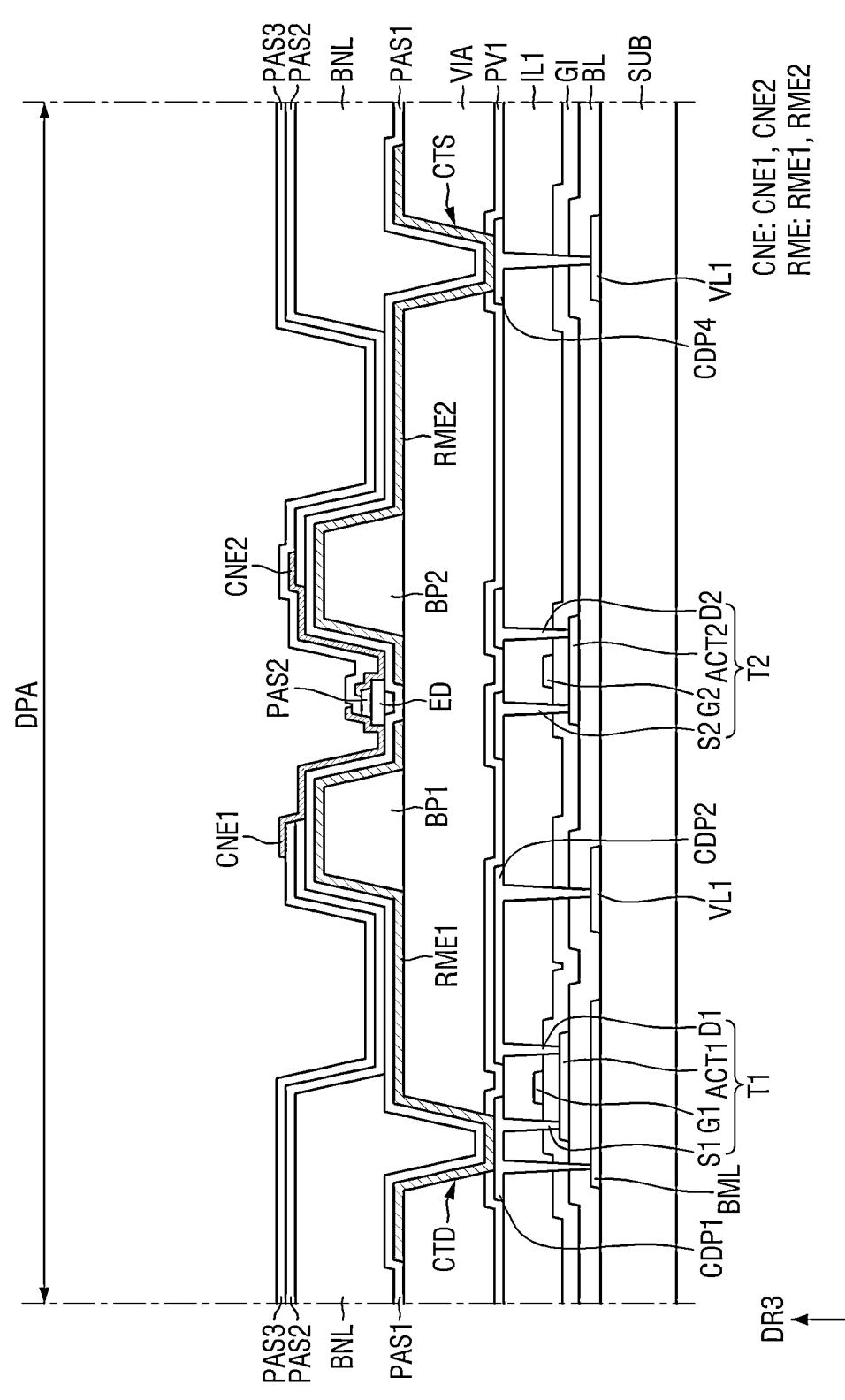
FIG. 46 is a schematic cross-sectional view illustrating a display device according to an embodiment.

FIG. 46 is a schematic cross-sectional view illustrating a display device according to an embodiment.

Referring to FIG. 46, in the display device 10 according to an embodiment, a first voltage line VL1 and a second voltage line VL2 are formed of first conductive layers, and a third conductive layer may further include a second conductive pattern CDP2 and a fourth conductive pattern CDP4. This embodiment is different from the embodiment of FIG. 6 in that the first voltage line VL1 and the second voltage line VL2 are formed of the first conductive layers not the third conductive layer and the third conductive layer further may include the conductive pattern CDP2 and the fourth conductive pattern CDP4 electrically connecting the first voltage line VL1 and the second voltage line VL2 to a first transistor T1 or a second electrode RME2.

The third conductive layer may include the second conductive pattern CDP2 connected to the first voltage line VL1. The second conductive pattern CDP2 may be directly connected to the first voltage line VL1 while serving as a first drain electrode D1 of the first transistor T1. The first voltage line VL1 may be electrically connected to the first transistor T1 through the second conductive pattern CDP2. The third conductive layer may also include the fourth conductive pattern CDP4 connected to the second voltage line VL2. The fourth conductive pattern CDP4 may be connected to the second electrode RME2 and the second voltage line VL2, respectively, and the second electrode RME2 may be electrically connected to the second voltage line VL2 through the fourth conductive pattern CDP4.

Figure 47:
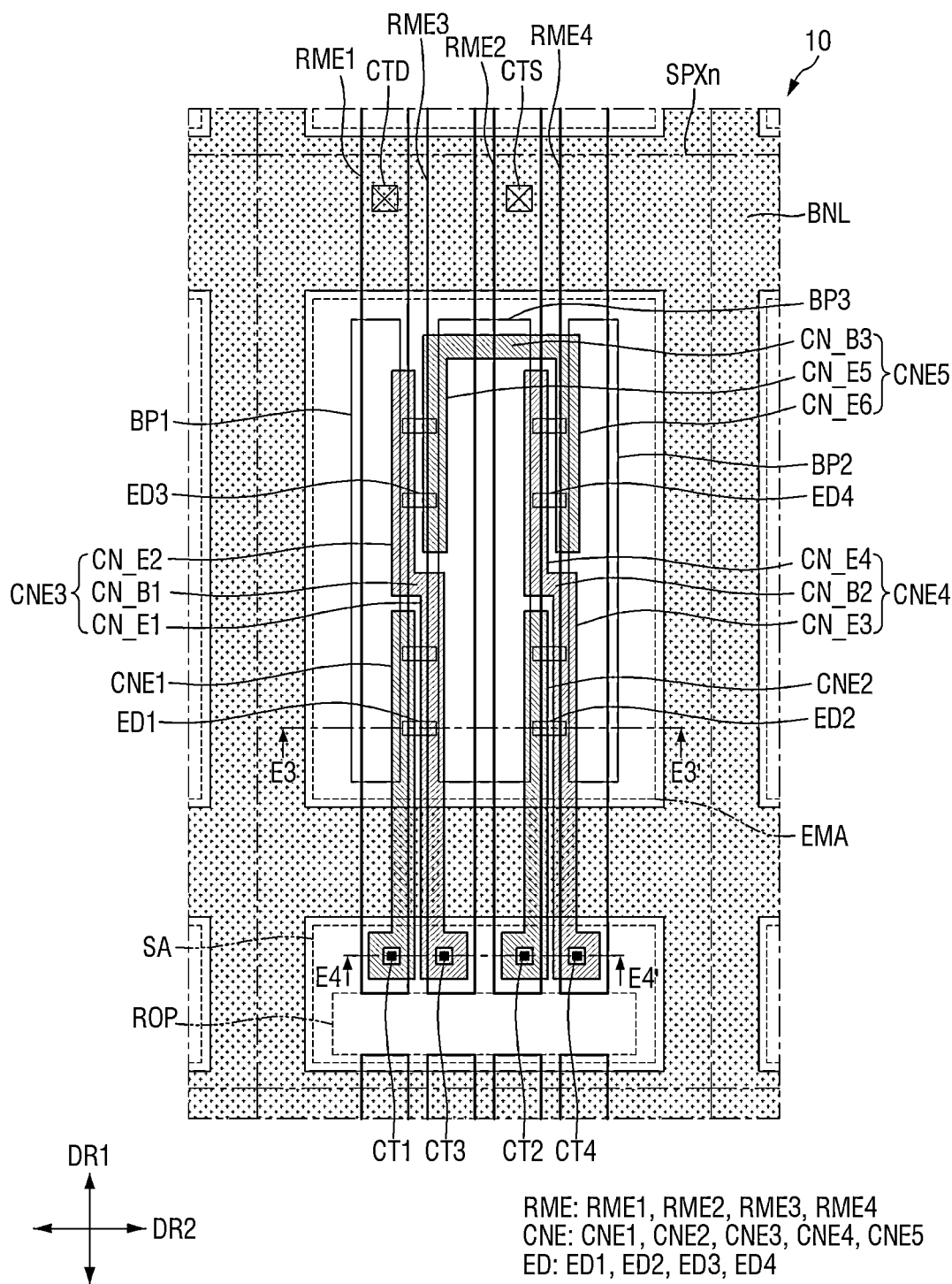
FIG. 47 is a schematic plan view illustrating one subpixel of a display device according to an embodiment.
Figure 48:
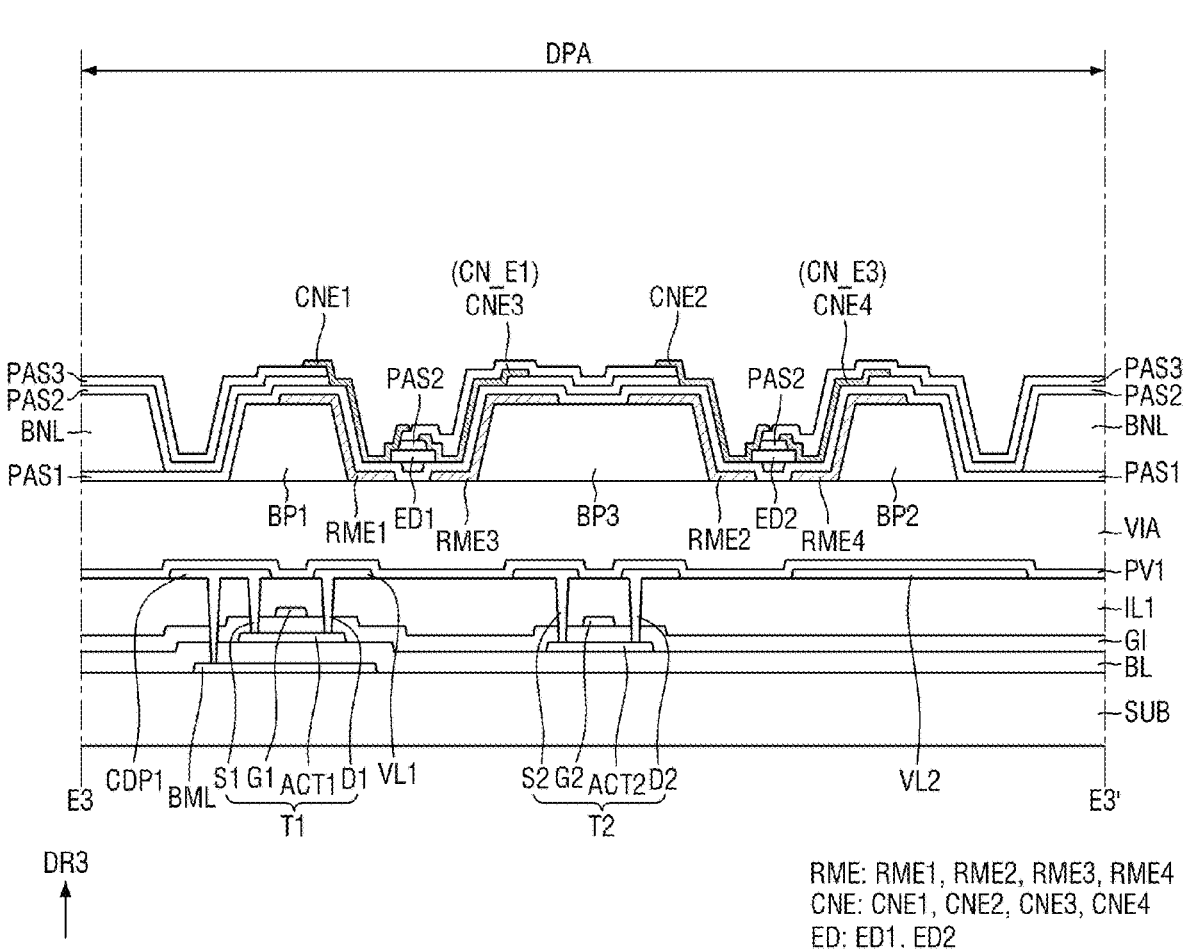
FIG. 48 is a schematic cross-sectional view taken along line E3-E3' of FIG. 47.
Figure 49:
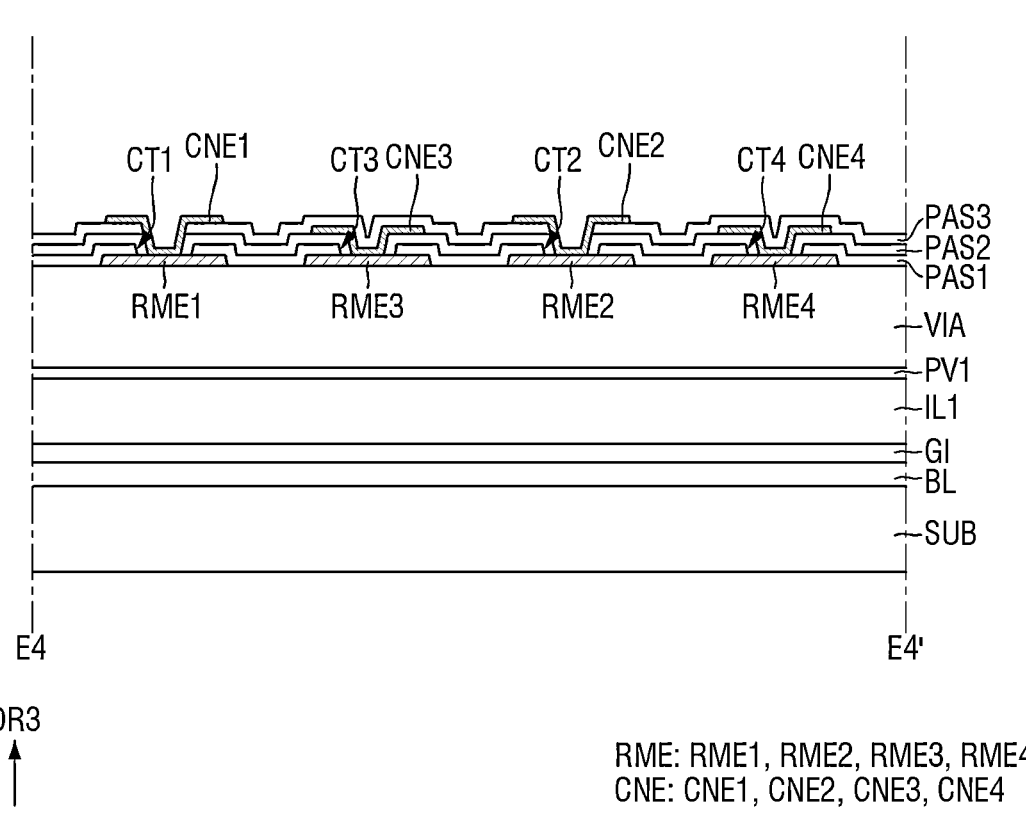
FIG. 49 is a schematic cross-sectional view taken along line E4-E4' of FIG. 47.

FIG. 47 is a schematic plan view illustrating one subpixel of a display device according to an embodiment. FIG. 48 is a schematic cross-sectional view taken along line E3-E3' of FIG. 47. FIG. 49 is a schematic cross-sectional view taken along line E4-E4' of FIG. 47.

FIG. 47 shows a planar arrangement of electrodes RME; RME1, RME2, RME3 and RME4, walls BP1, BP2 and BP3, a bank layer BNL, light emitting elements ED and connection electrodes CNE; CNE1, CNE2, CNE3, CNE4 and CNE5, which are disposed in one pixel PX of the display device 10. FIG. 48 shows a cross-section across both ends of light emitting elements ED; ED1, ED2, ED3 and ED4 disposed on different electrodes RME, and FIG. 49 shows a cross-section across contact portions CT1, CT2, CT3 and CT4.

Referring to FIGS. 47 to 49, the display device 10 according to an embodiment may include a larger number of electrodes RME; RME1, RME2, RME3 and RME4, walls BP1, BP2 and BP3, light emitting elements ED; ED1, ED2, ED3 and ED4 and connection electrodes CNE; CNE1, CNE2, CNE2, CNE3, CNE4 and CNE5. The display device 10 according to an embodiment may be different from an embodiment of FIG. 4 in that it may include a larger number of electrodes and light emitting elements for each subpixel SPXn. Hereinafter, redundant descriptions will be omitted, and the following description will be based on the differences.

The walls BP1, BP2 and BP3 may further include a third wall BP3 disposed between a first wall BP1 and a second wall BP2. The first wall BP1 may be disposed on a left side at the center of a light emission area EMA, the second wall BP2 may be disposed on a right side at the center of the light emission area EMA, and the third wall BP3 may be disposed at the center of the light emission area EMA. A width of the third wall BP3, which is measured in the second direction DR2, may be greater than that of each of the first wall BP1 and the second wall BP2, which is measured in the second direction DR2. An interval among the walls BP1, BP2 and BP3 spaced apart from one another in the second direction DR2 may be greater than that between the respective electrodes RME. The first wall BP1 may be disposed to partially overlap the first electrode RME1, and the second wall BP2 may be disposed to partially overlap the fourth electrode RME4. The third wall BP3 may be disposed to partially overlap the second electrode RME2 and the third electrode RME3. At least a portion of each of the electrodes may not overlap the walls BP1, BP2 and BP3.

The electrodes RME disposed for each subpixel SPXn may further include a third electrode RME3 and a fourth electrode RME4 in addition to the first electrode RME1 and the second electrode RME2.

The third electrode RME3 may be disposed between the first electrode RME1 and the second electrode RME2, and the fourth electrode RME4 may be disposed to be spaced apart from the third electrode RME3 in the second direction DR2 with the second electrode RME2 interposed therebetween. The electrodes RME may be disposed such that the first electrode RME1, the third electrode RME3, the second electrode RME2 and the fourth electrode RME4 may be sequentially disposed from a left side to a right side of the subpixel SPXn. The respective electrodes RME may face each other by being spaced apart from each other in the second direction DR2. The electrodes RME may be spaced apart from electrodes RME of another subpixel adjacent thereto in the first direction DR1 in a partition portion ROP of a sub-area SA.

Among the electrodes RME, the first electrode RME1 and the second electrode RME2 are respectively in contact with the first conductive pattern CDP1 and the second voltage line VL2 therebelow through electrode contact holes CTD and CTS disposed below the bank layer BNL, whereas the third electrode RME3 and the fourth electrode RME4 may not be so.

The first insulating layer PAS1 may be disposed in a structure similar to the above-described embodiments. The first insulating layer PAS1 may be entirely disposed in the display area DPA, and may cover the electrodes RME and the walls BP1, BP2 and BP3.

The light emitting elements ED may be disposed among the walls BP1, BP2 and BP3 or on different electrodes RME. A portion of the light emitting elements ED may be disposed between the first wall BP1 and the third wall BP3, and the other portion thereof may be disposed between the third wall BP3 and the second wall BP2. According to one embodiment, the light emitting element ED may include first and third light emitting elements ED1 and ED3 disposed between the first wall BP1 and the third wall BP3, and second and fourth light emitting elements ED2 and ED4 disposed between the third wall BP3 and the second wall BP2. The first light emitting element ED1 and the third light emitting element ED3 may be disposed on the first electrode RME1 and the third electrode RME3, respectively, and the second light emitting element ED2 and the fourth light emitting element ED4 may be disposed on the second electrode RME2 and the fourth electrode RME4, respectively. The first light emitting element ED1 and the second light emitting element ED2 are disposed to be adjacent to a lower side in the light emission area EMA of the corresponding subpixel SPXn or the sub-area SA, and the third light emitting element ED3 and the fourth light emitting element ED4 may be disposed to be adjacent to an upper side in the light emission area EMA of the corresponding subpixel SPXn.

However, the respective light emitting elements ED may not be distinguished depending on the position disposed in the light emission area EMA but be distinguished depending on a connection relation with the connection electrode CNE that will be described later. The respective light emitting elements ED may have both ends that are in contact with different connection electrodes CNE depending on an arrangement structure of the connection electrodes CNE, and may be distinguished from each other depending on a type of the connection electrodes CNE that are in contact therewith.

The connection electrodes CNE may further include a third connection electrode CNE3, a fourth connection electrode CNE4 and a fifth connection electrode CNE5, which are disposed over the electrodes RME, in addition to the first connection electrode CNE1 disposed on the first electrode RME1 and the second connection electrode CNE2 disposed on the second electrode RME2.

Unlike the embodiment of FIGS. 5 to 7, a length of each of the first and second connection electrodes CNE1 and CNE2 extended in the first direction DR1 may be relatively short. The first connection electrode CNE1 and the second connection electrode CNE2 may be disposed at a lower side based on the center of the light emission area EMA. The first connection electrode CNE1 and the second connection electrode CNE2 may be disposed over the light emission area EMA and the sub-area SA of the corresponding subpixel SPXn, and may be directly in contact with the electrode RME through the contact portions CT1 and CT2 formed in the sub-area SA, respectively. The first connection electrode CNE1 may be directly in contact with the first electrode RME1 through the first contact portion CT1 passing through a first insulating layer PAS1, a second insulating layer PAS2 and a third insulating layer PAS3 in the sub-area SA, and the second connection electrode CNE2 may be in contact with the second electrode RME2 through the second contact portion CT2 passing through the first insulating layer PAS1, the second insulating layer PAS2 and the third insulating layer PAS3 in the sub-area SA.

The third connection electrode CNE3 may include a first extension portion CN_E1 disposed on the third electrode RME3, a second extension portion CN_E2 disposed on the first electrode RME1, and a first connection portion CN_B1 connecting the first extension portion CN_E1 with the second extension portion CN_E2. The first extension portion CN_E1 may be spaced apart from the first connection electrode CNE1 in the second direction DR2 to face the first connection electrode CNE1, and the second extension portion CN_E2 may be spaced apart from the first connection electrode CNE1 in the first direction DR1. The first extension portion CN_E1 may be disposed at the lower side of the light emission area EMA of the corresponding subpixel SPXn, and the second extension portion CN_E2 may be disposed at the upper side of the light emission area EMA. The first extension portion CN_E1 and the second extension portion CN_E2 may be disposed in the light emission area EMA. The first connection portion CN_B1 may be disposed over the first electrode RME1 and the third electrode RME3 at the center of the light emission area EMA. The third connection electrode CNE3 may have a shape generally extended in the first direction DR1, and may have a shape bent in the second direction DR2 and extended again in the first direction DR1.

The fourth connection electrode CNE4 may include a third extension portion CN_E3 disposed on the fourth electrode RME4, a fourth extension portion CN_E4 disposed on the second electrode RME2, and a second connection portion CN_B2 connecting the third extension portion CN_E3 with the fourth extension portion CN_E4. The third extension portion CN_E3 may be spaced apart from the second connection electrode CNE2 in the second direction DR2 to face the second connection electrode CNE2, and the fourth extension portion CN_E4 may be spaced apart from the second connection electrode CNE2 in the first direction DR1. The third extension portion CN_E3 may be disposed at the lower side of the light emission area EMA of the corresponding subpixel SPXn, and the fourth extension portion CN_E4 may be disposed at the upper side of the light emission area EMA. The third extension portion CN_E3 and the fourth extension portion CN_E4 may be disposed in the light emission area EMA. The second connection portion CN_B2 may be disposed over the second electrode RME2 and the fourth electrode RME4 to be adjacent to the center of the light emission area EMA. The fourth connection electrode CNE4 may have a shape generally extended in the first direction DR1, and may have a shape bent in the second direction DR2 and extended again in the first direction DR1.

The fifth connection electrode CNE5 may include a fifth extension portion CN_E5 disposed on the third electrode RME3, a sixth extension portion CN_E6 disposed on the fourth electrode RME4, and a third connection portion CN_B3 connecting the fifth extension portion CN_E5 with the sixth extension portion CN_E6. The fifth extension portion CN_E5 may be spaced apart from the second extension portion CN_E2 of the third connection electrode CNE3 in the second direction DR2 to face the second extension portion CN_E2, and the sixth extension portion CN_E6 may be spaced apart from the fourth extension portion CN_E4 of the fourth connection electrode CNE4 in the second direction DR2 to face the fourth extension portion CN_E4. Each of the fifth extension portion CN_E5 and the sixth extension portion CN_E6 may be disposed at the upper side of the light emission area EMA, and the third connection portion CN_B3 may be disposed over the third electrode RME3, the second electrode RME2 and the fourth electrode RME4. The fifth connection electrode CNE5 may be disposed in a shape surrounding the fourth extension portion CN_E4 of the fourth connection electrode CNE4 on a plan view.

The third connection electrode CNE3 may be directly in contact with the third electrode RME3 through a third contact portion CT3 passing through the first insulating layer PAS1 and the second insulating layer PAS2 in the sub-area SA, and the fourth connection electrode CNE4 may be in contact with the fourth electrode RME4 through a fourth contact portion CT4 passing through the first insulating layer PAS1 and the second insulating layer PAS2 in the sub-area SA, but the disclosure is not limited thereto.

In an embodiment, in the display device 10, a portion of the connection electrodes CNE may be directly connected to the third conductive layer. For example, the first connection electrode CNE1 and the second connection electrode CNE2, which are first type connection electrodes, may be directly connected to the third conductive layer, and may not be electrically connected to the electrode RME. A second type connection electrode and a third type connection electrode are not electrically connected to the electrode RME, and may be connected with only the light emitting elements ED.

The first connection electrode CNE1 and the second connection electrode CNE2 may be the first type connection electrodes connected to the electrodes RME1 and RME2 directly connected to the third conductive layer, the third connection electrode CNE3 and the fourth connection electrode CNE4 may be the second type connection electrodes connected to the electrodes RME3 and RME4 that are not connected to the third conductive layer, and the fifth connection electrode CNE5 may be the third type connection electrode that is not connected to the electrode RME. The fifth connection electrode CNE5 may be in contact with the light emitting elements ED without being connected to the electrode RME, and may constitute an electrical connection circuit of the light emitting elements ED together with other connection electrodes CNE.

The third connection electrode CNE3 and the fourth connection electrode CNE4, which are the second type connection electrodes, may be connection electrodes in which electrode extension portions extended in the first direction DR1 are not parallel to each other in the second direction DR2, and the fifth connection electrode CNE5, which is the third type connection electrode, may be the connection electrode in which the electrode extension portions extended in the first direction DR1 are parallel with each other in the second direction DR2. The third connection electrode CNE3 and the fourth connection electrode CNE4 may have a shape extended to be bent in the first direction DR1, and the fifth connection electrode CNE5 may have a shape surrounding a portion of the other connection electrode.

The light emitting elements ED may be distinguished from each other depending on the connection electrode CNE, which are in contact with both ends of the light emitting elements ED, in response to the arrangement structure of the connection electrodes CNE. A first end of each of the first light emitting element ED1 and the second light emitting element ED2 may be in contact with the first type connection electrode, and a second end thereof may be in contact with the second type connection electrode. The first light emitting element ED1 may be in contact with the first connection electrode CNE1 and the third connection electrode CNE3, and the second light emitting element ED2 may be in contact with the second connection electrode CNE2 and the fourth connection electrode CNE4. A first end of each of the third light emitting element ED3 and the fourth light emitting element ED4 may be in contact with the second type connection electrode, and a second end thereof may be in contact with the third type connection electrode. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The light emitting elements ED may be connected to each other in series through the connection electrodes CNE. The display device 10 according to an embodiment may include a larger number of light emitting elements ED for each subpixel SPXn to constitute series connection of the light emitting elements, thereby further increasing the amount of light emitted per unit area.

Figure 50:
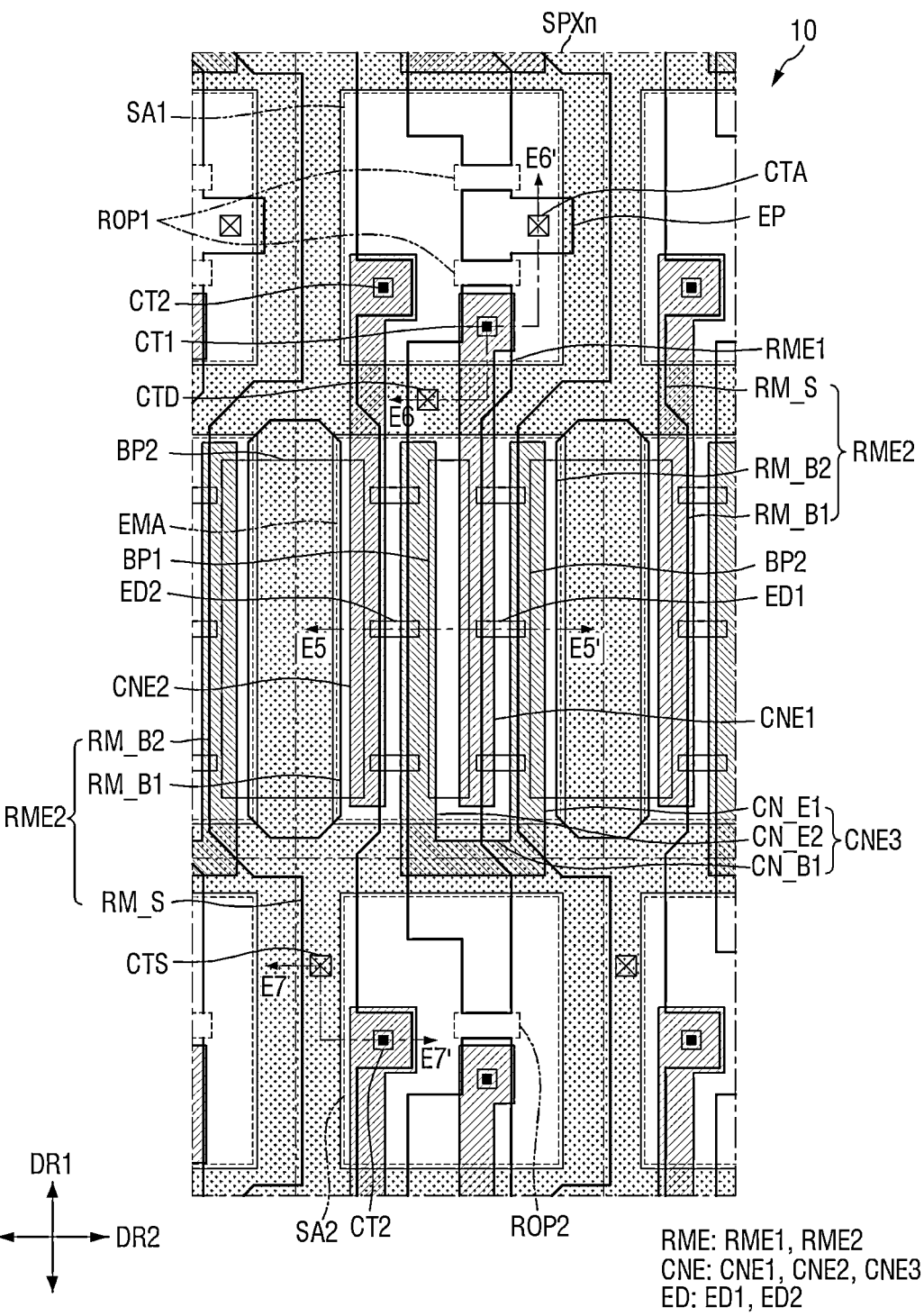
FIG. 50 is a schematic plan view illustrating one subpixel of a display device according to an embodiment.
Figure 51:
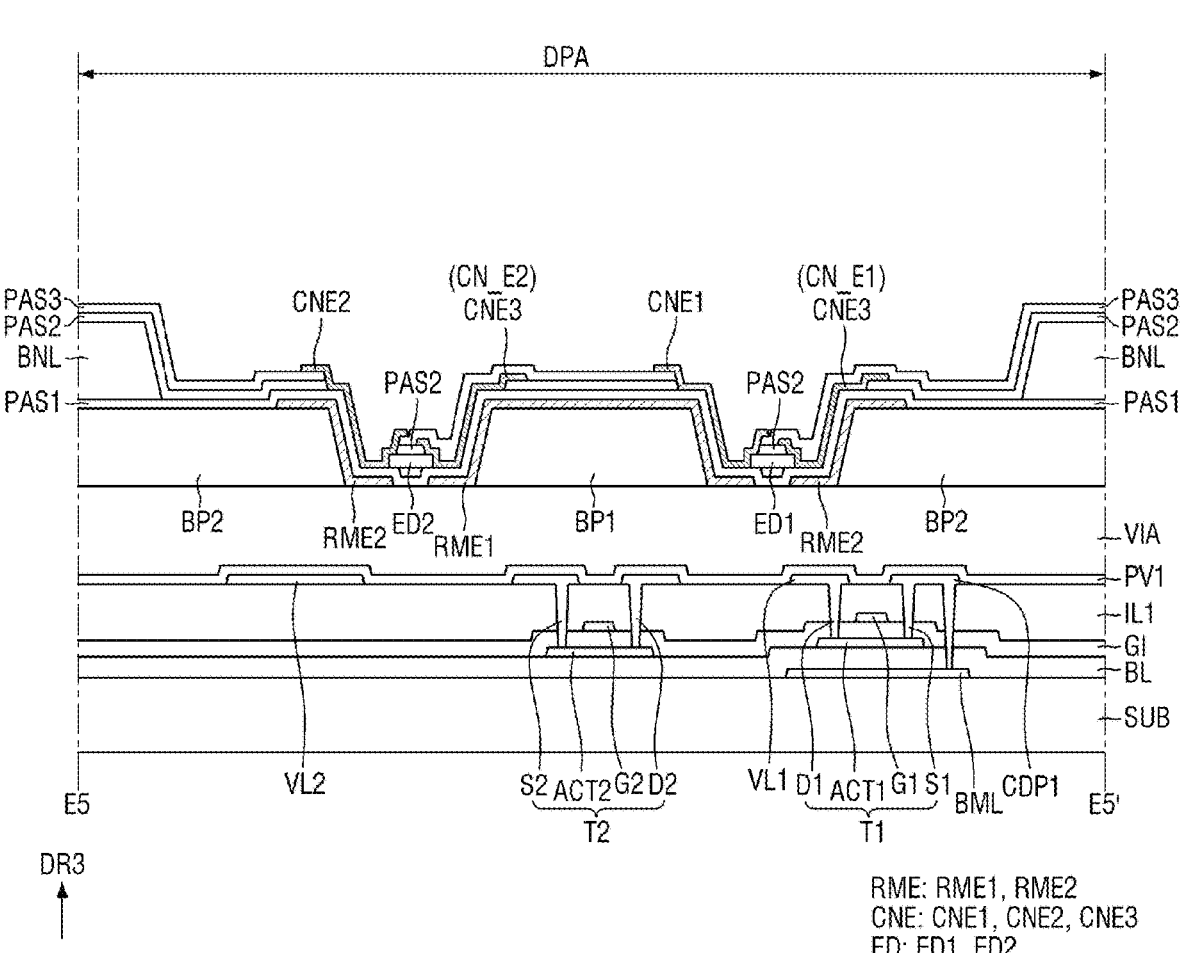
FIG. 51 is a schematic cross-sectional view taken along line E5-E5' of FIG. 50.
Figure 52:
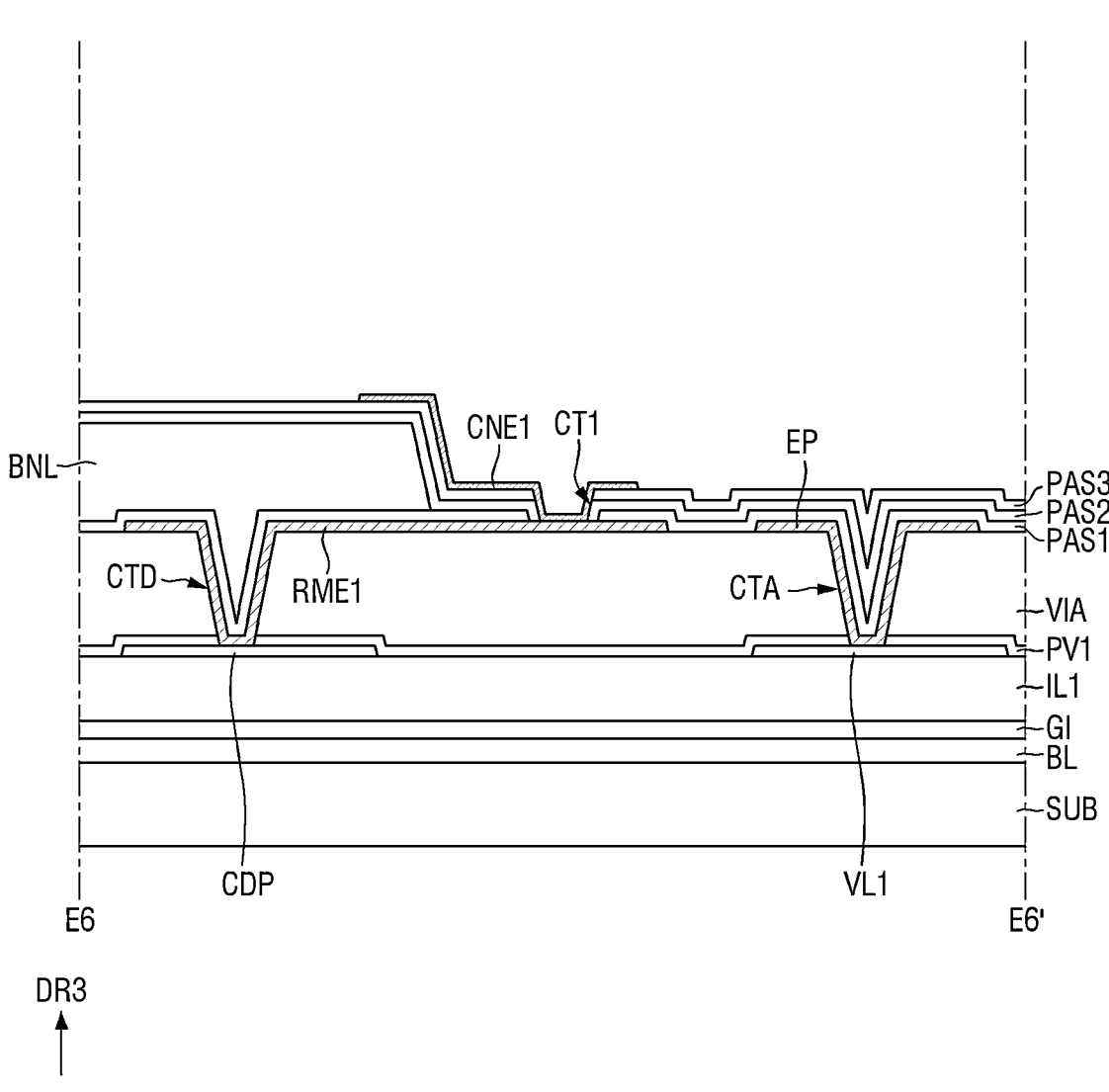
FIG. 52 is a schematic cross-sectional view taken along line E6-E6' of FIG. 50.
Figure 53:
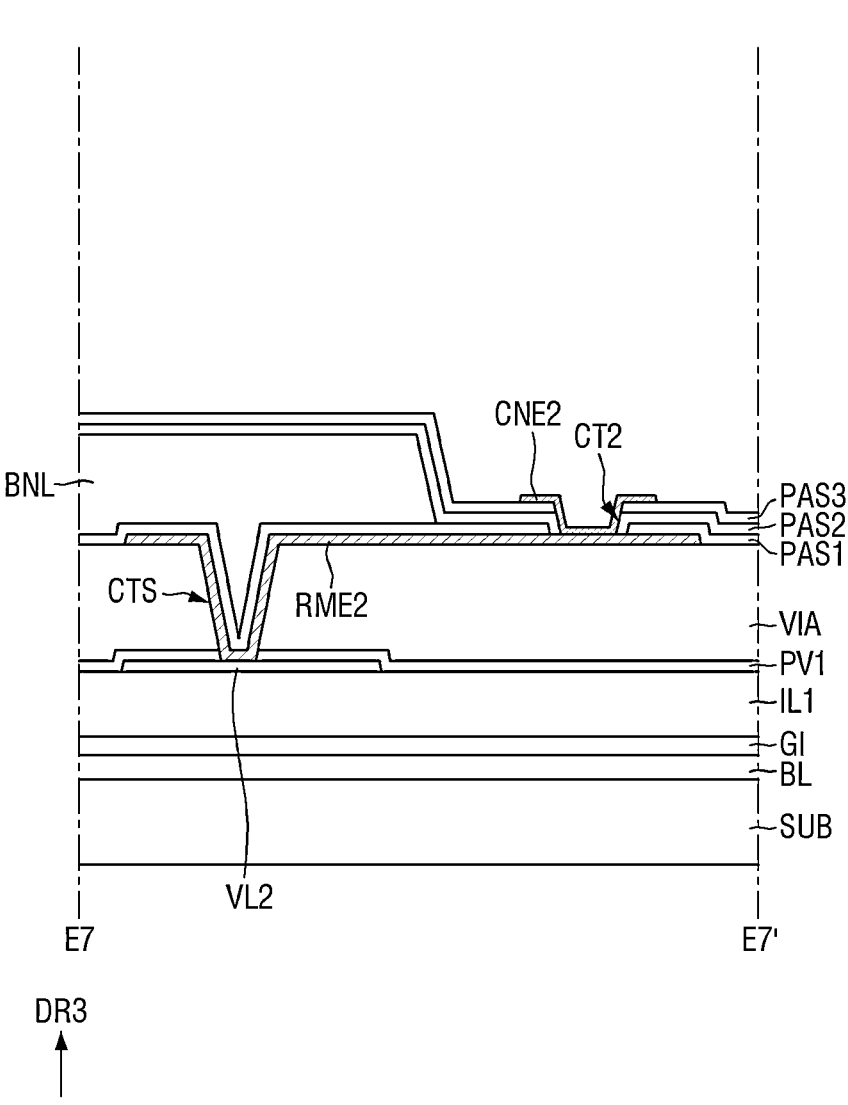
FIG. 53 is a schematic cross-sectional view taken along line E7-E7' of FIG. 50.

FIG. 50 is a schematic plan view illustrating one subpixel of a display device according to another embodiment. FIG. 51 is a schematic cross-sectional view taken along line E5-E5' of FIG. 50. FIG. 52 is a schematic cross-sectional view taken along line E6-E6' of FIG. 50. FIG. 53 is a schematic cross-sectional view taken along line E7-E7' of FIG. 50.

FIG. 50 shows a planar arrangement of electrodes RME; RME1 and RME2, walls BP1 and BP2, a bank layer BNL, light emitting elements ED and connection electrode CNE; CNE1, CNE2 and CNE3, which are disposed in one pixel PX of the display device 10. A cross-section across both ends of the light emitting element ED; ED1 and ED2 disposed on the different electrodes RME is shown in FIG. 51. A cross-section across electrode contact holes CTD, CTS and CTA and contact portions CT1 and CT2 are shown in FIGS. 52 and 53.

Referring to FIGS. 50 to 53, the display device 10 according to an embodiment may be different from the above-described embodiments in the structures of the electrode RME, the connection electrode CNE and the walls BP1 and BP2. Hereinafter, redundant descriptions will be omitted, and the following description will be based on the differences.

The walls BP1 and BP2 have a shape extended in the first direction DR1, and their widths measured in the second direction DR2 may be different from each other. Any one of the walls BP1 and BP2 may be disposed over subpixels SPXn adjacent to each other in the second direction DR2. For example, the walls BP1 and BP2 may include a first wall BP1 disposed in the light emission area EMA of each subpixel SPXn and a second wall BP2 disposed over the light emission area EMA of different subpixels SPXn.

The first wall BP1 is disposed at the center portion of the light emission area EMA, and the second walls BP2 are spaced apart from each other with the first wall BP1 interposed therebetween. The first wall BP1 and the second wall BP2 may be alternately disposed along the second direction DR2. The light emitting elements ED may be disposed between the first wall BP1 and the second wall BP2.

The first wall BP1 and the second wall BP2 have a same length in the first direction DR1 but their widths measured in the second direction DR2 may be different from each other. A portion of the bank layer BNL extended in the first direction DR1 may overlap the second wall BP2 in a thickness direction. The first wall BP1 may be disposed to overlap the first electrode RME1, and the second wall BP2 may be disposed to overlap electrode branch portions RM_B1 and RM_B2 of the second electrode RME2 and the bank layer BNL.

The first wall BP1 and the second wall BP2 have a same length in the first direction DR1 but their widths measured in the second direction DR2 may be different from each other. A portion of the bank layer BNL extended in the first direction DR1 may overlap the second wall BP2 in the thickness direction. The walls BP1 and BP2 may be disposed in an island pattern on the front surface of the display area DPA.

The electrodes RME include a first electrode RME1 disposed at the center of each subpixel SPXn, and a second electrode RME2 disposed over different subpixels SPXn. The first electrode RME1 and the second electrode RME2 may have a shape generally extended in the first direction DR1 but their shapes in a portion disposed in the light emission area EMA may be different from each other.

The first electrode RME1 may be disposed at the center of the subpixel SPXn, and its portion disposed in the light emission area EMA may be disposed on the first wall BPL. The first electrode RME1 may be extended from the sub-area SA in the first direction DR1 to a sub-area SA of another subpixel SPXn. The first electrode RME1 may have a shape in which a width measured in the second direction DR2 varies depending on the position, and its portion overlapped with the first wall BP1 in at least the light emission area EMA may have a width greater than that of the first wall BP1.

The second electrode RME2 may include a portion extended in the first direction DR1 and portions branched in the vicinity of the light emission area EMA. In one embodiment, the second electrode RME2 may include an electrode stem portion RM_S extended in the first direction DR1, and electrode branch portions RM_B1 and RM_B2 branched from the electrode stem portion RM_S and bent in the second direction DR2 and extended in the first direction DR1. The electrode stem portion RM_S may be disposed to overlap a portion of the bank layer BNL extended in the first direction DR1, and may be disposed at one side or a side of the sub-area SA in the second direction DR2. The electrode branch portions RM_B1 and RM_B2 may be branched from the electrode stem portion RM_S disposed in the portion of the bank layer BNL extended in the first direction DR1 and the portion of the bank layer BNL extended in the second direction DR2, and may be bent toward both sides in the second direction DR2. The electrode branch portions RM_B1 and RM_B2 may be disposed to cross or intersect the light emission area EMA in the first direction DR1, and may be bent again and integral with the electrode stem portion RM_S. For example, the electrode branch portions RM_B1 and RM_B2 of the second electrode RME2 may be branched from the upper side of the light emission area EMA and connected to each other at the lower side of the light emission area EMA based on the light emission area EMA of any one subpixel SPXn.

The second electrode RME2 may include a first electrode branch portion RM_B1 disposed at a left side of the first electrode RME1 and a second electrode branch portion RM_B2 disposed at a right side of the first electrode RME1. Each of the electrode branch portions RM_B1 and RM_B2 included in one second electrode RME2 may be disposed in the light emission areas EMA of subpixels SPXn adjacent to each other in the second direction DR2, and the electrode branch portions RM_B1 and RM_B2 of the second electrodes RME2 that are different from each other may be disposed in one subpixel SPXn. The first electrode branch portion RM_B1 of the second electrode RME2 may be disposed at the left side of the first electrode RME1, and the second electrode branch portion RM_B2 of another second electrode RME2 may be disposed at the right side of the first electrode RME1.

Each of the electrode branch portions RM_B1 and RM_B2 of the second electrode RME2 may overlap one side or a side of the second wall BP2. The first electrode branch portion RM_B1 may partially overlap the second wall BP2 disposed at the left side of the first wall BP1, and the second electrode branch portion RM_B2 may partially overlap the second wall BP2 disposed at the right side of the first wall BPL. Both sides of the first electrode RME1 may be spaced apart from the different electrode branch portions RM_B1 and RM_B2 of the second electrode RME2 having different both sides, and an interval between the first electrode RME1 and each of the electrode branch portions RM_B1 and RM_B2 may be smaller than that between the different walls BP1 and BP2.

A width of the first electrode RME1, which is measured in the second direction DR2, may be greater than that of each of the electrode stem portion RM_S and the electrode branch portions RM_B1 and RM_B2 of the second electrode RME2. The first electrode RME1 overlaps both sides of the first wall BP1 at a width greater than that of the first wall BP1, whereas a width of the second electrode RME2 is relatively small so that the electrode branch portions RM_B1 and RM_B2 may overlap only one side or a side of the second wall BP2.

The first electrode RME1 may be in contact with a first conductive pattern CDP1 of a third conductive layer through a first electrode contact hole CTD in a portion overlapped with the portion of the bank layer BNL extended in the second direction DR2. The second electrode RME2 may be in contact with a second voltage line VL2 of the third conductive layer through a second electrode contact hole CTS in the electrode stem portion RM_S. The first electrode RME1 may be disposed such that a portion disposed in the sub-area SA overlaps the first contact portion CT1, and the second electrode RME2 may include a portion protruded in the second direction DR2 from the electrode stem portion RM_S and disposed in the sub-area SA, and may overlap the second contact portion CT2 in the protruded portion.

The first electrode RME1 of the first electrode RME1 and the second electrode RME2 may be disposed up to partition portions ROP1 and ROP2 of the sub-area SA, whereas the second electrode RME2 may not be separated from the sub-area SA. One second electrode RME2 may include electrode stem portions RM_S and electrode branch portions RM_B1 and RM_B2, may be extended in the first direction DR1 and may have a shape branched from the periphery of the light emission area EMA of each subpixel SPXn. The first electrode RME1 may be disposed between partition portions ROP1 and ROP2 disposed in different sub-areas SA1 and SA2 of each subpixel SPXn, and may be disposed across the light emission area EMA.

According to one embodiment, the display device 10 may include a line connection electrode EP disposed in the first sub-area SA1 of the sub-areas SA1 and SA2 of each subpixel SPXn and thus disposed between the first electrodes RME1 of the different subpixels SPXn. The line connection electrode EP is not disposed in the second sub-area SA of the subpixel SPXn, and the first electrode RME1 of other subpixels SPXn adjacent to each other in the first direction DR1 may be spaced apart from each other therein. In the subpixel SPXn shown in FIG. 27 among the subpixels SPXn, the first sub-area SA1 in which the line connection electrode EP is disposed may be disposed at the upper side of the light emission area EMA and the second sub-area SA2 may be disposed at the lower side of the light emission area EMA. On the other hand, in the subpixel SPXn adjacent to the subpixel SPXn of FIG. 27 in the first direction DR1, the first sub-area SA1 in which the line connection electrode EP is disposed may be disposed at the lower side of the light emission area EMA and the second sub-area SA2 may be disposed at the upper side of the light emission area EMA.

The first electrode RME1 may be spaced apart from the line connection electrode EP with the first partition portion ROP1 interposed therebetween in the first sub-area SA1. Two first partition portions ROP1 may be disposed in one first sub-area SA1, and the line connection electrode EP may be spaced apart from the first electrode RME1 disposed in the corresponding subpixel SPXn with the first partition portion ROP1 of a lower side interposed therebetween, and may be spaced apart from the first electrode RME1 disposed in another subpixel SPXn with the first partition portion ROP1 of an upper side interposed therebetween. In the second sub-area SA2, one second partition portion ROP2 may be disposed and different first electrodes RME1 may be spaced apart from each other in the first direction DR1.

In one embodiment, the line connection electrode EP may be connected to the first voltage line VL1 of the third conductive layer through a third electrode contact hole CTA passing through the via layer VIA. The first electrode RME1 may be formed in a state that it is connected to the line connection electrode EP, and an electrical signal applied to dispose the light emitting elements ED may be applied from the first voltage line VL1 to the first electrode RME1 through the line connection electrode EP. In the process of disposing the light emitting element ED, signals may be applied to the first voltage line VL1 and the second voltage line VL2, and may be transferred to the first electrode RME1 and the second electrode RME2, respectively.

The second electrode contact hole CTS may have a relative arrangement different from the third electrode contact hole CTA that will be described later. The second electrode contact hole CTS may be disposed in a portion of the bank layer BNL, which surrounds the second sub-area SA2, and the third electrode contact hole CTA may be disposed in the first sub-area SA1. Since the second electrode contact hole CTS and the third electrode contact hole CTA expose upper surfaces of different voltage lines VL1 and VL2, their positions may be determined correspondingly.

The bank layer BNL may surround the light emission area EMA and the sub-areas SA1 and SA2 similarly to the above-described embodiment. However, in an embodiment in which the display device 10 may include the sub-areas SA1 and SA2 distinguished from each other, areas surrounded by the bank layer BNL may be distinguished from each other. The bank layer BNL is the same as that of the above-described embodiment except that it surrounds the different sub-areas SA1 and SA2.

The light emitting elements ED may be disposed on the different electrodes RME between the different walls BP1 and BP2. The light emitting elements ED may include a first light emitting element ED1 having both ends disposed on the first electrode RME1 and the second electrode branch portion RM_B2 of the second electrode RME2, and a second light emitting element ED2 having both ends disposed on the first electrode RME1 and the first electrode branch portion RM_B1 of another second electrode RME2. The first light emitting elements ED1 may be disposed at a right side based on the first electrode RME1, and the second light emitting elements ED2 may be disposed at a left side based on the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE; CNE1, CNE2 and CNE3 may include a first connection electrode CNE1, a second connection electrode CNE2 and a third connection electrode CNE3.

The first connection electrode CNE1 may be disposed on the first electrode RME1 in a shape extended in the first direction DR1. A portion of the first connection electrode CNE1, which is disposed on the first wall BP1, overlaps the first electrode RME1 and may be extended from the first electrode RME1 in the first direction DR1 and disposed up to the first sub-area SA1 positioned at the upper side of the light emission area EMA beyond the bank layer BNL. The first connection electrode CNE1 may be in contact with the first electrode RME1 through the first contact portion CT1 in the first sub-area SA1.

The second connection electrode CNE2 may be disposed on the second electrode RME2 in a shape extended in the first direction DR1. A portion of the second connection electrode CNE2, which is disposed on the second wall BP2, overlaps the second electrode RME2, and may be extended from the second electrode RME2 in the first direction DR1 and disposed up to the first sub-area SA1 positioned at the upper side of the light emission area EMA beyond the bank layer BNL. The second connection electrode CNE2 may be in contact with the second electrode RME2 through the second contact portion CT2 in the first sub-area SA1.

In the subpixel SPXn adjacent to the subpixel of FIG. 50 in the first direction DR1, the first connection electrode CNE1 and the second connection electrode CNE2 may be in contact with the first electrode RME1 and the second electrode RME2 through the contact portions CT1 and CT2 disposed in the second sub-area SA2, respectively.

The third connection electrode CNE3 may include extension portions CN_E1 and CN_E2 extended in the first direction DR1, and a first connection portion CN_B1 connecting the extension portions CN_E1 and CN_E2 with each other. The first extension portion CN_E1 is disposed on the second electrode branch portion RM_B2 of the second electrode RME2 while facing the first connection electrode CNE1 in the light emission area EMA, and the second extension portion CN_E2 is disposed on the first electrode RME1 while facing the second connection electrode CNE2 in the light emission area EMA. The first connection portion CN_B1 may be extended in the second direction DR2 on the bank layer BNL disposed at the lower side of the light emission area EMA to connect the first extension portion CN_E1 with the second extension portion CN_E2. The third connection electrode CNE3 may be disposed on the light emission area EMA and the bank layer BNL, and may not be directly connected to the electrode RME. The second electrode branch portion RM_B2 disposed below the first extension portion CN_E1 may be electrically connected to the second voltage line VL2, and a second power voltage applied to the second electrode branch portion RM_B2 may not be transferred to the third connection electrode CNE3.

Figure 54:
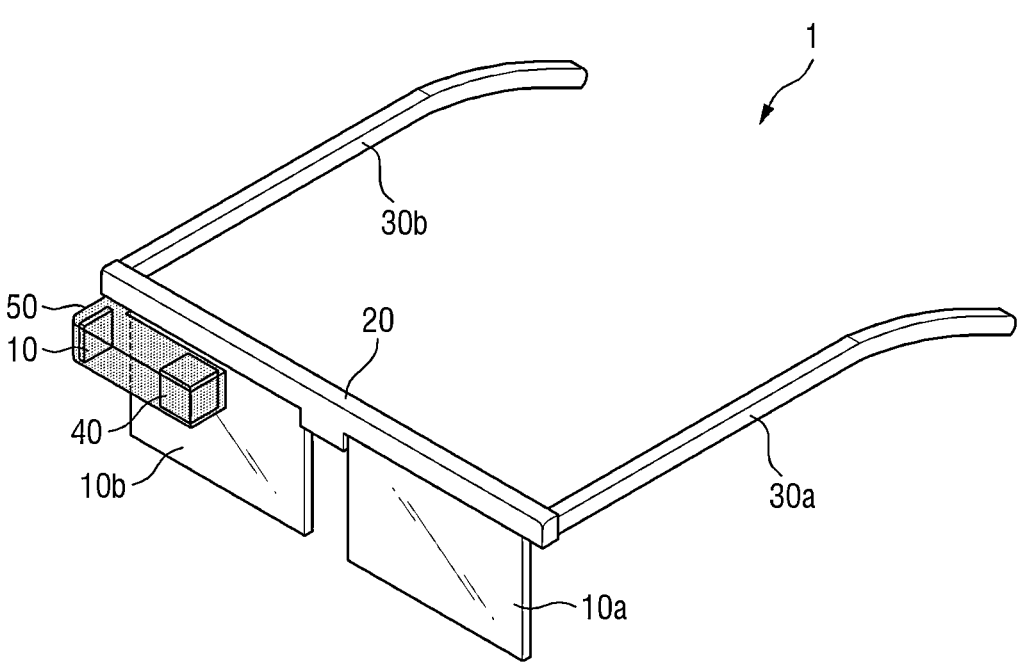
FIGS. 54 to 56 are schematic views illustrating a device including a display device according to one embodiment.
Figure 55:
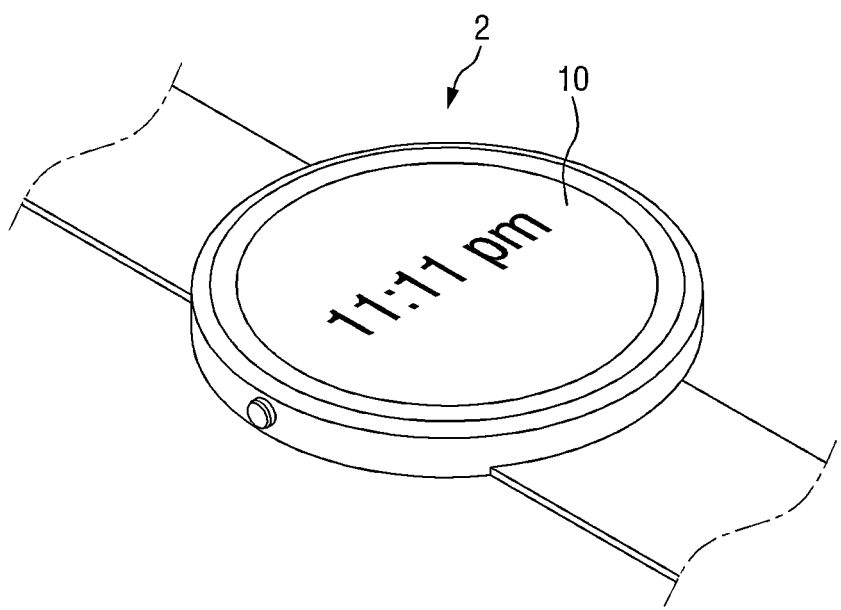
Figure 56:
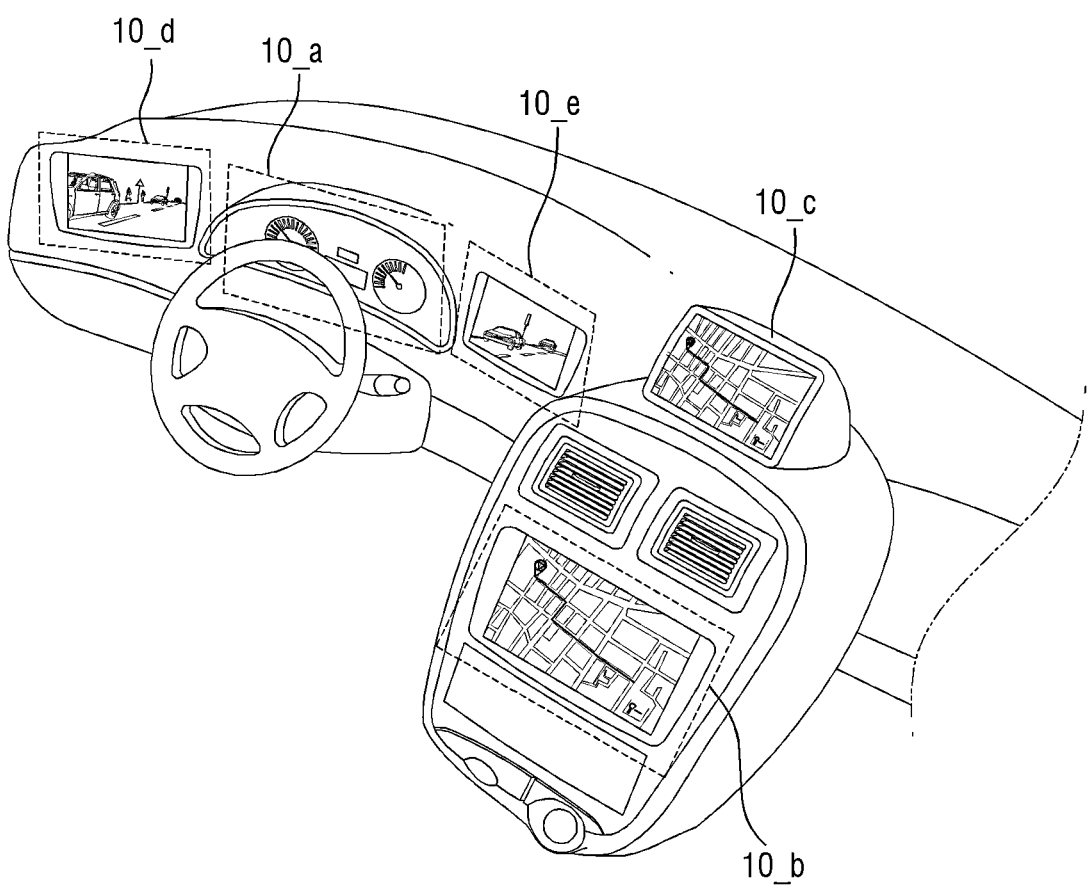

FIGS. 54 to 56 are schematic views illustrating a device including a display device according to one embodiment.

FIG. 54 illustrates a virtual reality device 1 to which a display device 10 according to one embodiment is applied, FIG. 55 illustrates a smart watch 2 to which a display device 10 according to one embodiment is applied. FIG. 56 illustrates that display devices 10_a, 10_b, 10_c, 10_d and 10_e according to one embodiment are applied a display of a vehicle.

Referring to FIG. 54, the virtual reality device 1 according to one embodiment may be a glasses-type device. The virtual reality device 1 according to one embodiment may include a display device 10, a left-eye lens 10a, a right-eye lens 10b, a support frame 20, glasses frame legs 30a and 30b, a reflection member 40, and a display device accommodating portion 50.

Although the virtual reality device 1 that may include glasses frame legs 30a and 30b is illustrated, the virtual reality device 1 according to one embodiment may be applied to a head mounted display including a head mounting band, which may be mounted on a head, instead of the glasses frame legs 30a and 30b. For example, the virtual reality device 1 according to one embodiment is not limited to a structure shown in the drawing, and is applicable to various electronic devices in various forms.

The display device accommodating portion 50 may include a display device 10 and a reflection member 40. An image displayed on the display device 10 may be reflected by the reflection member 40 and provided to a user's right eye through the right-eye lens 10b. For this reason, the user may view a virtual reality image displayed on the display device 10 through the right eye.

The display device accommodating portion 50 may be disposed at a right end of the support frame 20, but is not limited thereto. For example, the display device accommodating portion 50 may be disposed at a left end of the support frame 20, and the image displayed on the display device 10 may be reflected by the reflection member 40 and provided to the user's left eye through the left-eye lens 10a. For this reason, the user may view the virtual reality image displayed on the display device 10 through the left eye. By way of example, the display device accommodating portion 50 may be disposed at both the left end and the right end of the support frame 20, and the user may view the virtual reality image displayed on the display device 10 through both the left eye and the right eye.

Referring to FIG. 55, the display device 10 according to one embodiment may be applied to a smart watch 2 that is one of the smart device.

Referring to FIG. 56, the display devices 10_a, 10_b and 10_c according to one embodiment may be applied to a dashboard of the vehicle, applied to a center fascia of the vehicle or applied to a center information display (CID) disposed on the dashboard of the vehicle. Display devices 10_d and 10_e according to one embodiment may be applied to a room mirror display that replaces a side mirror of the vehicle.

Figure 57:
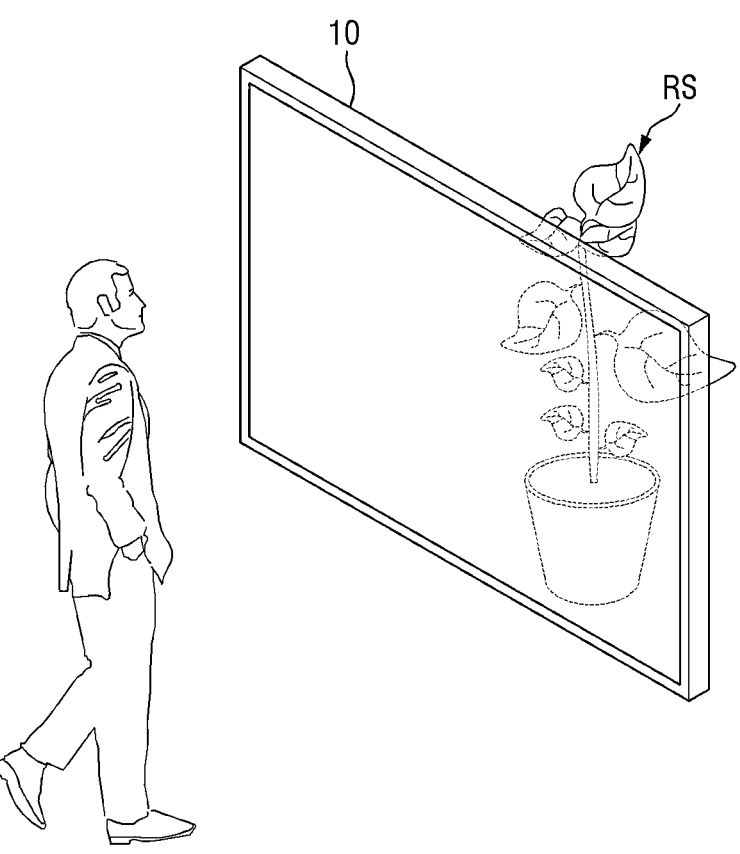
FIGS. 57 and 58 are views illustrating a transparent display device including a display device according to one embodiment.
Figure 58:
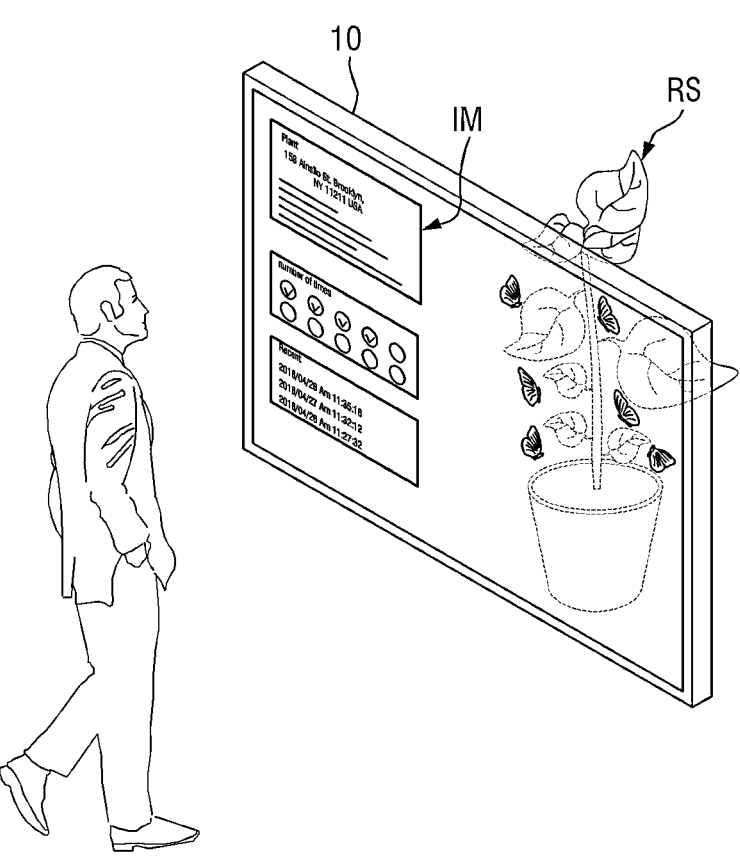

FIGS. 57 and 58 are views illustrating a transparent display device including a display device according to one embodiment.

Referring to FIGS. 57 and 58, the display device 10 according to one embodiment may be applied to the transparent display device. The transparent display device may display an image IM and at the same time transmit light. A user located on a front surface of the transparent display device may not only view the image IM displayed on the display device 10 but also view an object RS or background located on a rear surface of the transparent display device.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A method for fabricating a light emitting element, the method comprising:
preparing a substrate, and forming a first semiconductor material layer, a light emitting material layer, a second semiconductor material layer and an electrode material layer on the substrate;
forming semiconductor rods spaced apart from each other by etching the first semiconductor material layer, the light emitting material layer, the second semiconductor material layer and the electrode material layer in a direction perpendicular to an upper surface of the substrate;
forming an insulating layer surrounding sides of the semiconductor rods through a sol-gel process by immersing the substrate, including the semiconductor rods, in a solution containing a precursor material; and
forming light emitting elements by separating the semiconductor rods, including the insulating layer, from the substrate,
wherein the light emitting elements have an external quantum efficiency of 20.2±0.6%.

2. The method of claim 1, wherein the sol-gel process is performed at a temperature of about 25° C. for about 15 minutes to about 60 minutes.

3. The method of claim 2, wherein the insulating layer has a thickness in a range of about 23 nm to about 80 nm.

4. The method of claim 1, wherein
the sol-gel process is performed one or more times, and
the insulating layer includes a first layer surrounding the semiconductor rods and a second layer surrounding the first layer of the insulating layer.

5. The method of claim 4, wherein
a process time of the sol-gel process of forming the first layer is substantially equal to a process time of the sol-gel process of forming the second layer, and
the first layer and the second layer have a same thickness.

6. The method of claim 4, wherein
a precursor material of the sol-gel process of forming the first layer is different from a precursor material of the sol-gel process of forming the second layer, and
the first layer and the second layer include different materials.

7. The method of claim 6, wherein
the first layer includes silicon oxide ($SiO_2$), and
the second layer includes aluminum oxide ($Al_2O_3$).

8. The method of claim 1, further comprising:
heat-treating the semiconductor rods including the insulating layer before the separating of the semiconductor rods.

9. The method of claim 8, wherein the heat-treating of the semiconductor rods is performed at a temperature of about 250° C. for about 60 minutes.

10. The method of claim 1, wherein the forming of the semiconductor rods includes:
a first etching step of dry-etching the first semiconductor material layer, the light emitting material layer, the second semiconductor material layer and the electrode material layer; and
a second etching step of wet etching after the first etching step.

11. A light emitting element comprising:
a first semiconductor layer doped with an n-type dopant;
a second semiconductor layer doped with a p-type dopant and disposed on the first semiconductor layer;

a light emitting layer disposed between the first semiconductor layer and the second semiconductor layer;

an electrode layer disposed on the second semiconductor layer; and an insulating layer surrounding at least an outer surface of the light emitting layer, wherein an external quantum efficiency is 20.2±0.6%.

12. The light emitting element of claim 11, wherein the insulating layer includes at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

13. The light emitting element of claim 12, wherein the insulating layer has a thickness in a range of about 23 nm to about 80 nm.

14. The light emitting element of claim 11, wherein
the insulating layer includes a first layer, and
a second layer surrounding the first layer.

15. The light emitting element of claim 14, wherein the first layer and the second layer include a same material, and have a substantially same thickness.

16. The light emitting element of claim 14, wherein
the first layer and the second layer include different materials, and
the first layer has a thickness greater than a thickness of the second layer.

17. The light emitting element of claim 14, wherein
the first layer includes silicon oxide ($SiO_2$), and
the second layer includes aluminum oxide ($Al_2O_3$).

18. A display device comprising:
first electrodes and second electrodes spaced apart from each other on a substrate;
a first insulating layer disposed on the first electrodes and the second electrodes;
a light emitting element disposed on the first insulating layer, having a first end disposed on the first electrodes and a second end disposed on the second electrodes;

a second insulating layer disposed on the light emitting element;

a first connection electrode disposed on the first electrodes on the second insulating layer and electrically contacting the first end of the light emitting element;

a second connection electrode disposed on the second electrodes on the second insulating layer and electrically contacting the second end of the light emitting element; and a third insulating layer disposed on the second insulating layer and the second connection electrode and disposed below the first connection electrode, wherein the light emitting element includes:

a first semiconductor layer doped with an n-type dopant;

a second semiconductor layer doped with a p-type dopant and disposed on the first semiconductor layer;

a light emitting layer disposed between the first semiconductor layer and the second semiconductor layer;

an electrode layer disposed on the second semiconductor layer; and an insulating layer surrounding at least an outer surface of the light emitting layer, and an external quantum efficiency is 20.2±0.6%.

19. The display device of claim 18, wherein the insulating layer includes at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$), and has a thickness in a range of about 23 nm to about 80 nm.

20. The display device of claim 18, wherein the insulating layer includes a first layer, and a second layer surrounding the first layer.

* * * * *